(12) United States Patent
Siddiqui et al.

(10) Patent No.: US 9,766,663 B2
(45) Date of Patent: Sep. 19, 2017

(54) HINGE FOR COMPONENT ATTACHMENT

(71) Applicant: Microsoft Technology Licensing, LLC, Redmond, WA (US)

(72) Inventors: Kabir Siddiqui, Sammamish, WA (US); Ralf Groene, Kirkland, WA (US); Karsten Aagaard, Monroe, WA (US); Anthony Christian Reed, Sammamish, WA (US); Stephan Alexander Cummings, Wilsonville, OR (US); Darryl I. Jensen, Duvall, WA (US); Joseph B. Gault, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/847,838

(22) Filed: Sep. 8, 2015

(65) Prior Publication Data
US 2015/0378392 A1 Dec. 31, 2015

Related U.S. Application Data

(63) Continuation of application No. 13/471,030, filed on May 14, 2012, now Pat. No. 9,134,808.
(Continued)

(51) Int. Cl.
*G06F 1/16* (2006.01)
*H01H 13/79* (2006.01)
(Continued)

(52) U.S. Cl.
CPC .......... *G06F 1/166* (2013.01); *E05D 11/1064* (2013.01); *E05F 5/08* (2013.01);
(Continued)

(58) Field of Classification Search
CPC ...... G06F 1/1681; G06F 1/166; G06F 1/1637; G06F 1/1616; G06F 1/1662; G06F 3/023;
(Continued)

(56) References Cited

U.S. PATENT DOCUMENTS

| 578,325 A | 3/1897 | Fleming |
| 3,600,528 A | 8/1971 | Leposavic |

(Continued)

FOREIGN PATENT DOCUMENTS

| CA | 990023 | 6/1976 |
| CN | 2363007 | 2/2000 |

(Continued)

OTHER PUBLICATIONS

"Advisory Action", U.S. Appl. No. 13/471,376, Sep. 23, 2015, 7 pages.
(Continued)

*Primary Examiner* — James Wu

(57) ABSTRACT

A hinge for component attachment is described. In at least some implementations, a kickstand is rotatably attached to a mobile computing device. The kickstand can be rotated to various positions to provide support for different orientations of the computing device. In at least some implementations, hinges are employed to attach a kickstand to a mobile computing device. One example hinge utilizes preset hinge stops that enable the kickstand to be placed at different preset positions. Another example hinge exerts pressure on an edge of the kickstand, providing stability and vibration dampening to the kickstand.

20 Claims, 13 Drawing Sheets

Related U.S. Application Data

(60) Provisional application No. 61/606,336, filed on Mar. 2, 2012, provisional application No. 61/606,321, filed on Mar. 2, 2012, provisional application No. 61/606,301, filed on Mar. 2, 2012, provisional application No. 61/606,313, filed on Mar. 2, 2012, provisional application No. 61/606,333, filed on Mar. 2, 2012, provisional application No. 61/607,451, filed on Mar. 6, 2012, provisional application No. 61/613,745, filed on Mar. 21, 2012.

(51) Int. Cl.

| | | |
|---|---|---|
| *H01H 13/78* | (2006.01) | |
| *H01H 13/785* | (2006.01) | |
| *G06F 3/02* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *G06F 3/041* | (2006.01) | |
| *H01H 13/704* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 3/023* | (2006.01) | |
| *G06F 3/0488* | (2013.01) | |
| *G06F 3/0487* | (2013.01) | |
| *E05D 11/10* | (2006.01) | |
| *E05F 5/08* | (2006.01) | |
| *F16M 11/38* | (2006.01) | |
| *G06F 13/10* | (2006.01) | |
| *H01H 11/00* | (2006.01) | |
| *H01H 13/807* | (2006.01) | |
| *H01H 13/82* | (2006.01) | |
| *H01H 9/26* | (2006.01) | |

(52) U.S. Cl.
CPC ............ *F16M 11/38* (2013.01); *G05B 11/01* (2013.01); *G06F 1/1616* (2013.01); *G06F 1/1618* (2013.01); *G06F 1/1637* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 1/1686* (2013.01); *G06F 3/002* (2013.01); *G06F 3/01* (2013.01); *G06F 3/0202* (2013.01); *G06F 3/023* (2013.01); *G06F 3/0414* (2013.01); *G06F 3/0416* (2013.01); *G06F 3/0487* (2013.01); *G06F 3/0488* (2013.01); *G06F 9/541* (2013.01); *G06F 11/3089* (2013.01); *G06F 13/102* (2013.01); *H01H 11/00* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/807* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2203/02* (2013.01); *H01H 2205/006* (2013.01); *H01H 2211/004* (2013.01); *H01H 2211/006* (2013.01); *H01H 2213/016* (2013.01); *H01H 2217/004* (2013.01); *H01H 2217/01* (2013.01); *H04M 1/0245* (2013.01); *Y02B 60/1228* (2013.01); *Y10T 16/5401* (2015.01); *Y10T 16/551* (2015.01); *Y10T 29/49826* (2015.01)

(58) Field of Classification Search
CPC .... G06F 1/1656; G06F 1/1618; G06F 1/1669; G06F 1/1654; G06F 3/0202; E05D 1/04; E05D 11/1064; E05D 11/10; E05D 11/105; E05D 7/00; E05D 11/082; E05D 11/084; E05D 1/06; H05K 5/0226; H05K 5/0234; Y10T 16/542; Y10T 16/551; Y10T 16/53838; Y10T 16/54048; Y10T 16/5401; Y10T 29/49826; F16M 11/00; F16M 2200/024; F16M 11/38; Y10S 248/918; Y10S 248/917; Y10S 248/919; E05F 5/08; H04M 1/0254; H04M 1/0216; H04M 1/72527; H04M 1/0245; H01H 2203/02; H01H 2205/006; H01H 2201/036; H01H 2211/006
USPC ............ 361/679.02, 679.26, 679.27, 679.55, 361/679.58, 679.59; 16/277, 303, 308, 16/337, 341
See application file for complete search history.

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,239,338 A | 12/1980 | Borrelli et al. |
| 4,243,861 A | 1/1981 | Strandwitz |
| 4,251,791 A | 2/1981 | Yanagisawa et al. |
| 4,261,042 A | 4/1981 | Ishiwatari et al. |
| 4,279,021 A | 7/1981 | See et al. |
| 4,302,648 A | 11/1981 | Sado et al. |
| 4,317,011 A | 2/1982 | Mazurk |
| 4,317,013 A | 2/1982 | Larson |
| 4,323,740 A | 4/1982 | Balash |
| 4,326,193 A | 4/1982 | Markley et al. |
| 4,365,130 A | 12/1982 | Christensen |
| 4,375,018 A | 2/1983 | Petersen |
| 4,451,113 A | 5/1984 | Zuniga |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,576,436 A | 3/1986 | Daniel |
| 4,577,822 A | 3/1986 | Wilkerson |
| 4,588,187 A | 5/1986 | Dell |
| 4,607,147 A | 8/1986 | Ono et al. |
| 4,615,579 A | 10/1986 | Whitehead |
| 4,651,133 A | 3/1987 | Ganesan et al. |
| 4,652,704 A | 3/1987 | Franklin |
| 4,724,605 A | 2/1988 | Fiorella |
| 4,735,394 A | 4/1988 | Facco |
| 4,735,495 A | 4/1988 | Henkes |
| 4,795,977 A | 1/1989 | Frost et al. |
| 4,801,771 A | 1/1989 | Mizuguchi et al. |
| 4,824,268 A | 4/1989 | Diernisse |
| 4,864,084 A | 9/1989 | Cardinale |
| 4,983,787 A | 1/1991 | Kunikane |
| 4,990,900 A | 2/1991 | Kikuchi |
| 4,996,511 A | 2/1991 | Ohkawa et al. |
| 5,008,497 A | 4/1991 | Asher |
| 5,021,638 A | 6/1991 | Nopper et al. |

(56) References Cited

U.S. PATENT DOCUMENTS

| | | |
|---|---|---|
| 5,053,585 A | 10/1991 | Yaniger |
| 5,107,401 A | 4/1992 | Youn |
| 5,128,829 A | 7/1992 | Loew |
| 5,138,119 A | 8/1992 | Demeo |
| 5,218,177 A | 6/1993 | Coleman et al. |
| 5,220,318 A | 6/1993 | Staley |
| 5,220,521 A | 6/1993 | Kikinis |
| 5,235,495 A | 8/1993 | Blair et al. |
| 5,243,162 A | 9/1993 | Kobayashi |
| 5,249,978 A | 10/1993 | Gazda et al. |
| 5,253,362 A | 10/1993 | Nolan et al. |
| 5,283,559 A | 2/1994 | Kalendra et al. |
| 5,319,455 A | 6/1994 | Hoarty et al. |
| 5,331,443 A | 7/1994 | Stanisci |
| 5,339,382 A | 8/1994 | Whitehead |
| 5,340,528 A | 8/1994 | Machida et al. |
| 5,363,075 A | 11/1994 | Fanucchi |
| 5,375,076 A | 12/1994 | Goodrich et al. |
| 5,404,133 A | 4/1995 | Moriike et al. |
| 5,406,415 A | 4/1995 | Kelly |
| 5,480,118 A | 1/1996 | Cross |
| 5,491,313 A | 2/1996 | Bartley et al. |
| 5,510,783 A | 4/1996 | Findlater et al. |
| 5,546,271 A | 8/1996 | Gut et al. |
| 5,548,477 A | 8/1996 | Kumar et al. |
| 5,558,577 A | 9/1996 | Kato |
| 5,576,981 A | 11/1996 | Parker et al. |
| 5,581,682 A | 12/1996 | Anderson et al. |
| 5,584,713 A | 12/1996 | Kato et al. |
| 5,596,700 A | 1/1997 | Darnell et al. |
| 5,617,343 A | 4/1997 | Danielson et al. |
| 5,618,232 A | 4/1997 | Martin |
| 5,621,494 A | 4/1997 | Kazumi et al. |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,803,748 A | 9/1998 | Maddrell et al. |
| 5,806,955 A | 9/1998 | Parkyn, Jr. et al. |
| 5,807,175 A | 9/1998 | Davis et al. |
| 5,808,713 A | 9/1998 | Broer et al. |
| 5,818,361 A | 10/1998 | Acevedo |
| 5,828,770 A | 10/1998 | Leis et al. |
| 5,838,403 A | 11/1998 | Jannson et al. |
| 5,842,027 A | 11/1998 | Oprescu et al. |
| 5,850,135 A | 12/1998 | Kuki et al. |
| 5,861,990 A | 1/1999 | Tedesco |
| 5,874,697 A | 2/1999 | Selker et al. |
| 5,905,485 A | 5/1999 | Podoloff |
| 5,920,317 A | 7/1999 | McDonald |
| 5,924,555 A | 7/1999 | Sadamori et al. |
| 5,926,170 A | 7/1999 | Oba |
| 5,929,946 A | 7/1999 | Sharp et al. |
| 5,948,990 A | 9/1999 | Hashida |
| 5,957,191 A | 9/1999 | Okada et al. |
| 5,971,635 A | 10/1999 | Wise |
| 5,995,026 A | 11/1999 | Sellers |
| 5,995,081 A | 11/1999 | Kato |
| 5,999,147 A | 12/1999 | Teitel |
| 6,002,389 A | 12/1999 | Kasser |
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A | 3/2000 | Seffernick et al. |
| 6,042,075 A | 3/2000 | Burch, Jr. |
| 6,044,717 A | 4/2000 | Biegelsen et al. |
| 6,046,857 A | 4/2000 | Morishima et al. |
| 6,055,705 A | 5/2000 | Komatsu et al. |
| 6,061,644 A | 5/2000 | Leis |
| 6,072,551 A | 6/2000 | Jannson et al. |
| 6,108,200 A | 8/2000 | Fullerton |
| 6,112,797 A | 9/2000 | Colson et al. |
| 6,124,906 A | 9/2000 | Kawada et al. |
| 6,128,007 A | 10/2000 | Seybold |
| 6,129,444 A | 10/2000 | Tognoni |
| 6,141,388 A | 10/2000 | Servais et al. |
| 6,147,859 A | 11/2000 | Abboud |
| 6,151,486 A | 11/2000 | Holshouser et al. |
| 6,178,085 B1 | 1/2001 | Leung |
| 6,178,443 B1 | 1/2001 | Lin |
| 6,188,391 B1 | 2/2001 | Seely et al. |
| 6,228,926 B1 | 5/2001 | Golumbic |
| 6,232,934 B1 | 5/2001 | Heacock et al. |
| 6,234,820 B1 | 5/2001 | Perino et al. |
| 6,238,078 B1 | 5/2001 | Hed |
| 6,254,105 B1 | 7/2001 | Rinde et al. |
| 6,256,447 B1 | 7/2001 | Laine |
| 6,279,060 B1 | 8/2001 | Luke et al. |
| 6,300,986 B1 | 10/2001 | Travis |
| 6,305,073 B1 | 10/2001 | Badders |
| 6,329,617 B1 | 12/2001 | Burgess |
| 6,344,791 B1 | 2/2002 | Armstrong |
| 6,353,503 B1 | 3/2002 | Spitzer et al. |
| 6,362,861 B1 | 3/2002 | Hertz et al. |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,468,672 B1 | 10/2002 | Donovan, III et al. |
| 6,469,755 B1 | 10/2002 | Adachi et al. |
| 6,506,983 B1 | 1/2003 | Babb et al. |
| 6,511,378 B1 | 1/2003 | Bhatt et al. |
| 6,529,179 B1 | 3/2003 | Hashimoto et al. |
| 6,532,147 B1 | 3/2003 | Christ, Jr. |
| 6,543,949 B1 | 4/2003 | Ritchey et al. |
| 6,555,024 B2 | 4/2003 | Ueda et al. |
| 6,565,439 B2 | 5/2003 | Shinohara et al. |
| 6,574,030 B1 | 6/2003 | Mosier |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,648,485 B1 | 11/2003 | Colgan et al. |
| 6,651,943 B2 | 11/2003 | Cho et al. |
| 6,675,865 B1 | 1/2004 | Yoshida |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,704,005 B2 | 3/2004 | Kato et al. |
| 6,704,864 B1 | 3/2004 | Philyaw |
| 6,721,019 B2 | 4/2004 | Kono et al. |
| 6,725,318 B1 | 4/2004 | Sherman et al. |
| 6,738,049 B2 | 5/2004 | Kiser et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,790,054 B1 | 9/2004 | Boonsue |
| 6,795,146 B2 | 9/2004 | Dozov et al. |
| 6,798,887 B1 | 9/2004 | Andre |
| 6,813,143 B2 | 11/2004 | Makela |
| 6,819,082 B2 | 11/2004 | Yang |
| 6,819,316 B2 | 11/2004 | Schulz et al. |
| 6,819,547 B2 | 11/2004 | Minaguchi et al. |
| 6,847,488 B2 | 1/2005 | Travis |
| 6,856,506 B2 | 2/2005 | Doherty et al. |
| 6,856,789 B2 | 2/2005 | Pattabiraman et al. |
| 6,861,961 B2 | 3/2005 | Sandbach et al. |
| 6,864,573 B2 | 3/2005 | Robertson et al. |
| 6,870,671 B2 | 3/2005 | Travis |
| 6,895,164 B2 | 5/2005 | Saccomanno |
| 6,898,315 B2 | 5/2005 | Guha |
| 6,902,214 B2 | 6/2005 | Smith |
| 6,909,354 B2 | 6/2005 | Baker et al. |
| 6,914,197 B2 | 7/2005 | Doherty et al. |

(56) References Cited

U.S. PATENT DOCUMENTS

| | | |
|---|---|---|
| 6,950,950 B2 | 9/2005 | Sawyers et al. |
| 6,962,454 B1 | 11/2005 | Costello |
| 6,970,957 B1 | 11/2005 | Oshins et al. |
| 6,976,799 B2 | 12/2005 | Kim et al. |
| 6,980,177 B2 | 12/2005 | Struyk |
| 6,981,887 B1 | 1/2006 | Mese et al. |
| 7,006,080 B2 | 2/2006 | Gettemy |
| 7,007,238 B2 | 2/2006 | Glaser |
| 7,018,678 B2 | 3/2006 | Gronbeck et al. |
| 7,019,491 B2 | 3/2006 | Bozzone et al. |
| 7,025,908 B1 | 4/2006 | Hayashi et al. |
| 7,051,149 B2 | 5/2006 | Wang et al. |
| 7,066,634 B2 | 6/2006 | Kitamura et al. |
| 7,068,496 B2 | 6/2006 | Wong et al. |
| 7,083,295 B1 | 8/2006 | Hanna |
| 7,091,436 B2 | 8/2006 | Serban |
| 7,095,404 B2 | 8/2006 | Vincent et al. |
| 7,099,149 B2 | 8/2006 | Krieger et al. |
| 7,101,048 B2 | 9/2006 | Travis |
| 7,104,679 B2 | 9/2006 | Shin et al. |
| 7,106,222 B2 | 9/2006 | Ward et al. |
| 7,116,309 B1 | 10/2006 | Kimura et al. |
| 7,123,292 B1 | 10/2006 | Seeger et al. |
| 7,129,979 B1 | 10/2006 | Lee |
| 7,136,282 B1 | 11/2006 | Rebeske |
| 7,152,985 B2 | 12/2006 | Benitez et al. |
| 7,153,017 B2 | 12/2006 | Yamashita et al. |
| D535,292 S | 1/2007 | Shi et al. |
| 7,159,132 B2 | 1/2007 | Takahashi et al. |
| 7,169,460 B1 | 1/2007 | Chen et al. |
| 7,194,662 B2 | 3/2007 | Do et al. |
| 7,199,554 B2 | 4/2007 | Kim et al. |
| 7,199,931 B2 | 4/2007 | Boettiger et al. |
| 7,201,508 B2 | 4/2007 | Misaras |
| 7,202,837 B2 | 4/2007 | Ihara |
| 7,213,323 B2 | 5/2007 | Baker et al. |
| 7,213,991 B2 | 5/2007 | Chapman et al. |
| 7,218,830 B2 | 5/2007 | Iimura |
| 7,224,830 B2 | 5/2007 | Nefian et al. |
| 7,239,505 B2 | 7/2007 | Keely et al. |
| 7,252,512 B2 | 8/2007 | Tai et al. |
| 7,260,221 B1 | 8/2007 | Atsmon |
| 7,260,823 B2 | 8/2007 | Schlack et al. |
| 7,277,087 B2 | 10/2007 | Hill et al. |
| 7,280,348 B2 | 10/2007 | Ghosh |
| 7,301,759 B2 | 11/2007 | Hsiung |
| 7,311,526 B2 | 12/2007 | Rohrbach et al. |
| 7,331,793 B2 | 2/2008 | Hernandez et al. |
| 7,348,513 B2 | 3/2008 | Lin |
| 7,365,967 B2 | 4/2008 | Zheng |
| 7,370,342 B2 | 5/2008 | Ismail et al. |
| 7,374,312 B2 | 5/2008 | Feng et al. |
| 7,375,885 B2 | 5/2008 | Ijzerman et al. |
| 7,400,377 B2 | 7/2008 | Evans et al. |
| 7,400,805 B2 | 7/2008 | Abu-Ageel |
| 7,401,992 B1 | 7/2008 | Lin |
| 7,415,676 B2 | 8/2008 | Fujita |
| 7,423,557 B2 | 9/2008 | Kang |
| 7,431,489 B2 | 10/2008 | Yeo et al. |
| 7,447,922 B1 | 11/2008 | Asbury et al. |
| 7,447,934 B2 | 11/2008 | Dasari et al. |
| 7,454,712 B2 | 11/2008 | Schultz |
| 7,457,108 B2 | 11/2008 | Ghosh |
| 7,467,948 B2 | 12/2008 | Lindberg et al. |
| 7,469,386 B2 | 12/2008 | Bear et al. |
| 7,481,566 B2 | 1/2009 | Han |
| 7,486,165 B2 | 2/2009 | Ligtenberg et al. |
| 7,499,037 B2 | 3/2009 | Lube |
| 7,499,216 B2 | 3/2009 | Niv et al. |
| 7,502,803 B2 | 3/2009 | Culter et al. |
| 7,503,684 B2 | 3/2009 | Ueno et al. |
| 7,515,143 B2 | 4/2009 | Keam et al. |
| 7,528,337 B2 | 5/2009 | Tanabe et al. |
| 7,528,374 B2 | 5/2009 | Smitt et al. |
| 7,539,882 B2 | 5/2009 | Jessup et al. |
| 7,541,907 B2 | 6/2009 | Wang et al. |
| 7,542,052 B2 | 6/2009 | Solomon et al. |
| 7,558,594 B2 | 7/2009 | Wilson |
| 7,559,834 B1 | 7/2009 | York |
| 7,561,131 B2 | 7/2009 | Ijzerman et al. |
| 7,572,045 B2 | 8/2009 | Hoelen et al. |
| RE40,891 E | 9/2009 | Yasutake |
| 7,594,638 B2 | 9/2009 | Chan et al. |
| 7,620,244 B1 | 11/2009 | Collier |
| 7,622,907 B2 | 11/2009 | Vranish |
| 7,629,966 B2 | 12/2009 | Anson |
| 7,631,327 B2 | 12/2009 | Dempski et al. |
| 7,636,921 B2 | 12/2009 | Louie |
| 7,639,329 B2 | 12/2009 | Takeda et al. |
| 7,639,876 B2 | 12/2009 | Clary et al. |
| 7,643,213 B2 | 1/2010 | Boettiger et al. |
| 7,656,392 B2 | 2/2010 | Bolender |
| 7,675,598 B2 | 3/2010 | Hong |
| 7,686,066 B2 | 3/2010 | Hirao |
| 7,686,694 B2 | 3/2010 | Cole |
| 7,693,654 B1 | 4/2010 | Dietsch et al. |
| 7,705,558 B2 | 4/2010 | Silverman |
| 7,715,187 B2 | 5/2010 | Hotelling et al. |
| 7,722,358 B2 | 5/2010 | Chatterjee et al. |
| 7,722,792 B2 | 5/2010 | Uezaki et al. |
| 7,728,923 B2 | 6/2010 | Kim et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,773,076 B2 | 8/2010 | Pittel et al. |
| 7,773,121 B1 | 8/2010 | Huntsberger et al. |
| 7,774,155 B2 | 8/2010 | Sato et al. |
| 7,777,972 B1 | 8/2010 | Chen et al. |
| 7,782,341 B2 | 8/2010 | Kothandaraman |
| 7,782,342 B2 | 8/2010 | Koh |
| 7,800,708 B2 | 9/2010 | Brott et al. |
| 7,813,715 B2 | 10/2010 | McKillop et al. |
| 7,815,358 B2 | 10/2010 | Inditsky |
| 7,817,428 B2 | 10/2010 | Greer, Jr. et al. |
| 7,822,338 B2 | 10/2010 | Wernersson |
| 7,844,985 B2 | 11/2010 | Hendricks et al. |
| 7,855,716 B2 | 12/2010 | McCreary et al. |
| 7,865,639 B2 | 1/2011 | McCoy et al. |
| 7,884,807 B2 | 2/2011 | Hovden et al. |
| 7,893,921 B2 | 2/2011 | Sato |
| 7,898,797 B2 | 3/2011 | Fan et al. |
| 7,907,394 B2 | 3/2011 | Richardson et al. |
| D636,397 S | 4/2011 | Green |
| 7,918,559 B2 | 4/2011 | Tesar |
| 7,927,654 B2 | 4/2011 | Hagood et al. |
| 7,928,964 B2 | 4/2011 | Kolmykov-Zotov et al. |
| 7,932,890 B2 | 4/2011 | Onikiri et al. |
| 7,936,501 B2 | 5/2011 | Smith et al. |
| 7,944,520 B2 | 5/2011 | Ichioka et al. |
| 7,945,717 B2 | 5/2011 | Rivalsi |
| 7,957,082 B2 | 6/2011 | Mi et al. |
| 7,965,268 B2 | 6/2011 | Gass et al. |
| 7,967,462 B2 | 6/2011 | Ogiro et al. |
| 7,970,246 B2 | 6/2011 | Travis et al. |
| 7,973,771 B2 | 7/2011 | Geaghan |
| 7,976,393 B2 | 7/2011 | Haga et al. |
| 7,978,281 B2 | 7/2011 | Vergith et al. |
| 8,016,255 B2 | 9/2011 | Lin |
| 8,018,386 B2 | 9/2011 | Qi et al. |
| 8,018,579 B1 | 9/2011 | Krah |
| 8,026,904 B2 | 9/2011 | Westerman |
| 8,035,614 B2 | 10/2011 | Bell et al. |
| 8,035,624 B2 | 10/2011 | Bell et al. |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| RE42,992 E | 12/2011 | David |
| 8,077,160 B2 | 12/2011 | Land et al. |
| 8,090,885 B2 | 1/2012 | Callaghan et al. |
| 8,098,233 B2 | 1/2012 | Hotelling et al. |
| 8,102,362 B2 | 1/2012 | Ricks et al. |
| 8,115,499 B2 | 2/2012 | Osoinach et al. |

(56) References Cited

U.S. PATENT DOCUMENTS

| | | |
|---|---|---|
| 8,115,718 B2 | 2/2012 | Chen et al. |
| 8,117,362 B2 | 2/2012 | Rodriguez et al. |
| 8,118,274 B2 | 2/2012 | McClure et al. |
| 8,118,681 B2 | 2/2012 | Mattice et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,185 B2 | 5/2012 | Partovi et al. |
| 8,169,421 B2 | 5/2012 | Wright et al. |
| 8,179,236 B2 | 5/2012 | Weller et al. |
| 8,184,190 B2 | 5/2012 | Dosluoglu |
| 8,189,973 B2 | 5/2012 | Travis et al. |
| 8,216,074 B2 | 7/2012 | Sakuma |
| 8,229,509 B2 | 7/2012 | Paek et al. |
| 8,229,522 B2 | 7/2012 | Kim et al. |
| 8,231,099 B2 | 7/2012 | Chen |
| 8,240,007 B2 | 8/2012 | Duan et al. |
| 8,243,432 B2 | 8/2012 | Duan et al. |
| 8,245,354 B2 | 8/2012 | Duan et al. |
| 8,248,791 B2 | 8/2012 | Wang et al. |
| 8,255,708 B1 | 8/2012 | Zhang |
| 8,263,730 B2 | 9/2012 | Shimizu |
| 8,264,310 B2 | 9/2012 | Lauder et al. |
| 8,267,368 B2 | 9/2012 | Torii et al. |
| 8,269,093 B2 | 9/2012 | Naik et al. |
| 8,269,731 B2 | 9/2012 | Molne |
| 8,274,784 B2 | 9/2012 | Franz et al. |
| 8,279,589 B2 | 10/2012 | Kim |
| 8,289,115 B2 | 10/2012 | Cretella, Jr. et al. |
| 8,310,508 B2 | 11/2012 | Hekstra et al. |
| 8,310,768 B2 | 11/2012 | Lin et al. |
| 8,322,290 B1 | 12/2012 | Mignano |
| 8,325,416 B2 | 12/2012 | Lesage et al. |
| 8,342,857 B2 | 1/2013 | Palli et al. |
| 8,345,920 B2 | 1/2013 | Ferren et al. |
| 8,346,206 B1 | 1/2013 | Andrus et al. |
| 8,354,806 B2 | 1/2013 | Travis et al. |
| 8,362,975 B2 | 1/2013 | Uehara |
| 8,371,174 B2 | 2/2013 | Chen et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,389,078 B2 | 3/2013 | Lin et al. |
| 8,403,576 B2 | 3/2013 | Merz |
| 8,416,206 B2 | 4/2013 | Carpendale et al. |
| 8,416,559 B2 | 4/2013 | Agata et al. |
| 8,421,757 B2 | 4/2013 | Suzuki et al. |
| 8,424,160 B2 | 4/2013 | Chen |
| 8,446,359 B2 | 5/2013 | Doczy et al. |
| 8,464,079 B2 | 6/2013 | Chueh et al. |
| 8,466,902 B2 | 6/2013 | Boer et al. |
| 8,477,100 B2 | 7/2013 | Wang et al. |
| 8,497,657 B2 | 7/2013 | Franks et al. |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |
| 8,564,944 B2 | 10/2013 | Whitt, III et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,582,280 B2 | 11/2013 | Ryu |
| 8,587,701 B2 | 11/2013 | Tatsuzawa |
| 8,599,542 B1 | 12/2013 | Healey et al. |
| 8,600,526 B2 | 12/2013 | Nielsen et al. |
| 8,610,015 B2 | 12/2013 | Whitt et al. |
| 8,614,666 B2 | 12/2013 | Whitman et al. |
| 8,633,898 B2 | 1/2014 | Westerman et al. |
| 8,646,999 B2 | 2/2014 | Shaw et al. |
| 8,654,030 B1 | 2/2014 | Mercer |
| 8,674,941 B2 | 3/2014 | Casparian et al. |
| 8,699,215 B2 | 4/2014 | Whitt, III et al. |
| 8,719,603 B2 | 5/2014 | Belesiu |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,754,854 B1 | 6/2014 | Hamburgen et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,791,382 B2 | 7/2014 | Whitt, III et al. |
| 8,797,765 B2 | 8/2014 | Lin et al. |
| 8,823,652 B2 | 9/2014 | Linegar et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |
| 8,918,546 B2 | 12/2014 | Cheah et al. |
| 8,922,996 B2 | 12/2014 | Yeh et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,964,376 B2 | 2/2015 | Chen |
| 8,997,983 B2 | 4/2015 | Sajid |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,111,703 B2 | 8/2015 | Whitt, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 9,189,428 B2 | 11/2015 | Pollmann et al. |
| 9,268,373 B2 | 2/2016 | Whitt et al. |
| 9,275,809 B2 | 3/2016 | Panay et al. |
| 9,298,236 B2 | 3/2016 | Oler et al. |
| 9,304,549 B2 | 4/2016 | Siddiqui |
| 9,304,948 B2 | 4/2016 | Whitman et al. |
| 9,304,949 B2 | 4/2016 | Whitman et al. |
| 9,317,072 B2 * | 4/2016 | Park ................. G06F 1/1681 |
| 9,348,605 B2 | 5/2016 | Drasnin |
| 9,354,748 B2 | 5/2016 | Lutian et al. |
| 9,360,893 B2 | 6/2016 | Bathiche et al. |
| 9,411,751 B2 | 8/2016 | Whitt et al. |
| 9,426,905 B2 | 8/2016 | Bathiche et al. |
| 9,447,620 B2 * | 9/2016 | Park ................. E05D 11/10 |
| 9,460,029 B2 | 10/2016 | Shaw et al. |
| 9,465,412 B2 | 10/2016 | Belesiu et al. |
| 9,618,977 B2 | 4/2017 | Whitt et al. |
| 9,619,071 B2 | 4/2017 | Perek et al. |
| 9,678,542 B2 | 6/2017 | Whitt et al. |
| 9,710,093 B2 | 7/2017 | Shaw et al. |
| 2001/0023818 A1 | 9/2001 | Masaru et al. |
| 2001/0035859 A1 | 11/2001 | Kiser et al. |
| 2002/0000977 A1 | 1/2002 | Vranish |
| 2002/0005108 A1 | 1/2002 | Ludwig |
| 2002/0044216 A1 | 4/2002 | Cha |
| 2002/0070883 A1 | 6/2002 | Dosch |
| 2002/0126445 A1 | 9/2002 | Minaguchi et al. |
| 2002/0126446 A1 | 9/2002 | Miyako et al. |
| 2002/0134828 A1 | 9/2002 | Sandbach et al. |
| 2002/0135457 A1 | 9/2002 | Sandbach et al. |
| 2002/0154099 A1 | 10/2002 | Oh |
| 2002/0163510 A1 | 11/2002 | Williams et al. |
| 2002/0195177 A1 | 12/2002 | Hinkley et al. |

(56) References Cited

U.S. PATENT DOCUMENTS

| | | |
|---|---|---|
| 2003/0000821 A1 | 1/2003 | Takahashi et al. |
| 2003/0007648 A1 | 1/2003 | Currell |
| 2003/0011576 A1 | 1/2003 | Sandbach et al. |
| 2003/0016282 A1 | 1/2003 | Koizumi |
| 2003/0036365 A1 | 2/2003 | Kuroda |
| 2003/0044215 A1 | 3/2003 | Monney et al. |
| 2003/0044216 A1 | 3/2003 | Fang |
| 2003/0051983 A1 | 3/2003 | Lahr |
| 2003/0067450 A1 | 4/2003 | Thursfield et al. |
| 2003/0108720 A1 | 6/2003 | Kashino |
| 2003/0132916 A1 | 7/2003 | Kramer |
| 2003/0148740 A1 | 8/2003 | Yau et al. |
| 2003/0160712 A1 | 8/2003 | Levy |
| 2003/0163611 A1 | 8/2003 | Nagao |
| 2003/0165017 A1 | 9/2003 | Amitai |
| 2003/0173195 A1 | 9/2003 | Federspiel |
| 2003/0197687 A1 | 10/2003 | Shetter |
| 2003/0198008 A1 | 10/2003 | Leapman et al. |
| 2003/0231243 A1 | 12/2003 | Shibutani |
| 2004/0005184 A1 | 1/2004 | Kim et al. |
| 2004/0039862 A1 | 2/2004 | Hunt et al. |
| 2004/0046796 A1 | 3/2004 | Fujita |
| 2004/0048941 A1 | 3/2004 | Raffel et al. |
| 2004/0056843 A1 | 3/2004 | Lin et al. |
| 2004/0085716 A1 | 5/2004 | Uke |
| 2004/0095333 A1 | 5/2004 | Morag et al. |
| 2004/0100457 A1 | 5/2004 | Mandle |
| 2004/0113956 A1 | 6/2004 | Bellwood et al. |
| 2004/0115994 A1 | 6/2004 | Wulff et al. |
| 2004/0156168 A1 | 8/2004 | LeVasseur et al. |
| 2004/0160734 A1 | 8/2004 | Yim |
| 2004/0169641 A1 | 9/2004 | Bean et al. |
| 2004/0174709 A1 | 9/2004 | Buelow, II et al. |
| 2004/0212598 A1 | 10/2004 | Kraus et al. |
| 2004/0212601 A1 | 10/2004 | Cake et al. |
| 2004/0231969 A1 | 11/2004 | Kitano et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0057521 A1 | 3/2005 | Aull et al. |
| 2005/0059489 A1 | 3/2005 | Kim |
| 2005/0062715 A1 | 3/2005 | Tsuji et al. |
| 2005/0064765 A1 | 3/2005 | Simpson et al. |
| 2005/0068460 A1 | 3/2005 | Lin |
| 2005/0073756 A1 | 4/2005 | Poulsen |
| 2005/0084212 A1 | 4/2005 | Fein |
| 2005/0099400 A1 | 5/2005 | Lee |
| 2005/0100690 A1 | 5/2005 | Mayer et al. |
| 2005/0134717 A1 | 6/2005 | Misawa |
| 2005/0146512 A1 | 7/2005 | Hill et al. |
| 2005/0153753 A1 | 7/2005 | Cheng |
| 2005/0231156 A1 | 10/2005 | Yan |
| 2005/0236848 A1 | 10/2005 | Kim et al. |
| 2005/0240949 A1 | 10/2005 | Liu et al. |
| 2005/0264653 A1 | 12/2005 | Starkweather et al. |
| 2005/0264988 A1 | 12/2005 | Nicolosi |
| 2005/0265035 A1 | 12/2005 | Brass et al. |
| 2005/0283731 A1 | 12/2005 | Saint-Hilaire et al. |
| 2005/0285703 A1 | 12/2005 | Wheeler et al. |
| 2006/0002101 A1 | 1/2006 | Wheatley et al. |
| 2006/0010400 A1 | 1/2006 | Dehlin et al. |
| 2006/0028400 A1 | 2/2006 | Lapstun et al. |
| 2006/0028838 A1 | 2/2006 | Imade |
| 2006/0049920 A1 | 3/2006 | Sadler et al. |
| 2006/0049993 A1 | 3/2006 | Lin et al. |
| 2006/0061555 A1 | 3/2006 | Mullen |
| 2006/0070384 A1 | 4/2006 | Ertel |
| 2006/0082973 A1 | 4/2006 | Egbert et al. |
| 2006/0083004 A1 | 4/2006 | Cok |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102020 A1 | 5/2006 | Takada et al. |
| 2006/0102914 A1 | 5/2006 | Smits et al. |
| 2006/0103633 A1 | 5/2006 | Gioeli |
| 2006/0110537 A1 | 5/2006 | Huang et al. |
| 2006/0125799 A1 | 6/2006 | Hillis et al. |
| 2006/0132423 A1 | 6/2006 | Travis |
| 2006/0132456 A1 | 6/2006 | Anson |
| 2006/0146573 A1 | 7/2006 | Iwauchi et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0181521 A1 | 8/2006 | Perreault et al. |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0197755 A1 | 9/2006 | Bawany |
| 2006/0215244 A1 | 9/2006 | Yosha et al. |
| 2006/0220465 A1 | 10/2006 | Kingsmore et al. |
| 2006/0227393 A1 | 10/2006 | Herloski |
| 2006/0238510 A1 | 10/2006 | Panotopoulos et al. |
| 2006/0238550 A1 | 10/2006 | Page |
| 2006/0239006 A1 | 10/2006 | Chaves et al. |
| 2006/0254042 A1 | 11/2006 | Chou et al. |
| 2006/0261778 A1 | 11/2006 | Elizalde Rodarte |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2006/0279501 A1 | 12/2006 | Lu et al. |
| 2007/0002587 A1 | 1/2007 | Miyashita |
| 2007/0003267 A1 | 1/2007 | Shibutani |
| 2007/0019181 A1 | 1/2007 | Sinclair et al. |
| 2007/0046625 A1 | 3/2007 | Yee |
| 2007/0047221 A1 | 3/2007 | Park |
| 2007/0047260 A1 | 3/2007 | Lee et al. |
| 2007/0051792 A1 | 3/2007 | Wheeler et al. |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0076434 A1 | 4/2007 | Uehara et al. |
| 2007/0081091 A1 | 4/2007 | Pan et al. |
| 2007/0114967 A1 | 5/2007 | Peng |
| 2007/0116929 A1 | 5/2007 | Fujimori et al. |
| 2007/0117600 A1 | 5/2007 | Robertson et al. |
| 2007/0121956 A1 | 5/2007 | Bai et al. |
| 2007/0126393 A1 | 6/2007 | Bersenev |
| 2007/0126994 A1 | 6/2007 | Hwang |
| 2007/0127205 A1 | 6/2007 | Kuo |
| 2007/0145945 A1 | 6/2007 | McGinley et al. |
| 2007/0153545 A1 | 7/2007 | Lee |
| 2007/0161262 A1 | 7/2007 | Lloyd |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0188478 A1 | 8/2007 | Silverstein et al. |
| 2007/0189667 A1 | 8/2007 | Wakita et al. |
| 2007/0194752 A1 | 8/2007 | McBurney |
| 2007/0200830 A1 | 8/2007 | Yamamoto |
| 2007/0201246 A1 | 8/2007 | Yeo et al. |
| 2007/0201859 A1 | 8/2007 | Sarrat |
| 2007/0220708 A1 | 9/2007 | Lewis |
| 2007/0222766 A1 | 9/2007 | Bolender |
| 2007/0223248 A1 | 9/2007 | Han |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247338 A1 | 10/2007 | Marchetto |
| 2007/0247432 A1 | 10/2007 | Oakley |
| 2007/0247800 A1 | 10/2007 | Smith et al. |
| 2007/0252674 A1 | 11/2007 | Nelson et al. |

(56) References Cited

U.S. PATENT DOCUMENTS

| | | |
|---|---|---|
| 2007/0257821 A1 | 11/2007 | Son et al. |
| 2007/0260892 A1 | 11/2007 | Paul et al. |
| 2007/0268200 A1 | 11/2007 | Fuller et al. |
| 2007/0268273 A1 | 11/2007 | Westerman et al. |
| 2007/0274094 A1 | 11/2007 | Schultz et al. |
| 2007/0274095 A1 | 11/2007 | Destain |
| 2007/0274099 A1 | 11/2007 | Tai et al. |
| 2007/0283179 A1 | 12/2007 | Burnett et al. |
| 2007/0296709 A1 | 12/2007 | Guanghai |
| 2007/0297125 A1 | 12/2007 | Maatta |
| 2007/0297625 A1 | 12/2007 | Hjort et al. |
| 2008/0001924 A1 | 1/2008 | de los Reyes et al. |
| 2008/0002350 A1 | 1/2008 | Farrugia |
| 2008/0005423 A1 | 1/2008 | Jacobs et al. |
| 2008/0013809 A1 | 1/2008 | Zhu et al. |
| 2008/0018611 A1 | 1/2008 | Serban et al. |
| 2008/0019150 A1 | 1/2008 | Park et al. |
| 2008/0019684 A1 | 1/2008 | Shyu et al. |
| 2008/0030937 A1 | 2/2008 | Russo et al. |
| 2008/0037284 A1 | 2/2008 | Rudisill |
| 2008/0042978 A1 | 2/2008 | Perez-Noguera |
| 2008/0053222 A1 | 3/2008 | Ehrensvard et al. |
| 2008/0059888 A1 | 3/2008 | Dunko |
| 2008/0068451 A1 | 3/2008 | Hyatt |
| 2008/0074398 A1 | 3/2008 | Wright |
| 2008/0080166 A1 | 4/2008 | Duong et al. |
| 2008/0088593 A1 | 4/2008 | Smoot |
| 2008/0090626 A1 | 4/2008 | Griffin et al. |
| 2008/0104437 A1 | 5/2008 | Lee |
| 2008/0106592 A1 | 5/2008 | Mikami |
| 2008/0111518 A1 | 5/2008 | Toya |
| 2008/0122803 A1 | 5/2008 | Izadi et al. |
| 2008/0129520 A1 | 6/2008 | Lee |
| 2008/0150913 A1 | 6/2008 | Bell et al. |
| 2008/0151478 A1 | 6/2008 | Chern |
| 2008/0158185 A1 | 7/2008 | Westerman |
| 2008/0167832 A1 | 7/2008 | Soss |
| 2008/0174570 A1 | 7/2008 | Jobs et al. |
| 2008/0179507 A2 | 7/2008 | Han |
| 2008/0180411 A1 | 7/2008 | Solomon et al. |
| 2008/0182622 A1 | 7/2008 | Makarowski et al. |
| 2008/0186660 A1 | 8/2008 | Yang |
| 2008/0186683 A1 | 8/2008 | Ligtenberg et al. |
| 2008/0211787 A1 | 9/2008 | Nakao et al. |
| 2008/0219025 A1 | 9/2008 | Spitzer et al. |
| 2008/0225205 A1 | 9/2008 | Travis |
| 2008/0228969 A1 | 9/2008 | Cheah et al. |
| 2008/0232061 A1 | 9/2008 | Wang et al. |
| 2008/0233326 A1 | 9/2008 | Hegemier et al. |
| 2008/0238884 A1 | 10/2008 | Harish |
| 2008/0253822 A1 | 10/2008 | Matias |
| 2008/0258679 A1 | 10/2008 | Manico et al. |
| 2008/0273297 A1 | 11/2008 | Kumar |
| 2008/0297878 A1 | 12/2008 | Brown et al. |
| 2008/0303479 A1 | 12/2008 | Park et al. |
| 2008/0307242 A1 | 12/2008 | Qu |
| 2008/0309636 A1 | 12/2008 | Feng et al. |
| 2008/0316002 A1 | 12/2008 | Brunet et al. |
| 2008/0316183 A1 | 12/2008 | Westerman et al. |
| 2008/0316768 A1 | 12/2008 | Travis |
| 2008/0318008 A1 | 12/2008 | Wielstra et al. |
| 2008/0320190 A1 | 12/2008 | Lydon et al. |
| 2009/0002218 A1 | 1/2009 | Rigazio et al. |
| 2009/0007001 A1 | 1/2009 | Morin et al. |
| 2009/0009476 A1 | 1/2009 | Daley, III |
| 2009/0033623 A1 | 2/2009 | Lin |
| 2009/0049979 A1 | 2/2009 | Naik et al. |
| 2009/0065267 A1 | 3/2009 | Sato |
| 2009/0067156 A1 | 3/2009 | Bonnett et al. |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0083562 A1 | 3/2009 | Park et al. |
| 2009/0085515 A1 | 4/2009 | Bourilkov et al. |
| 2009/0089600 A1 | 4/2009 | Nousiainen |
| 2009/0096738 A1 | 4/2009 | Chen et al. |
| 2009/0096756 A1 | 4/2009 | Lube |
| 2009/0102419 A1 | 4/2009 | Gwon et al. |
| 2009/0102805 A1 | 4/2009 | Meijer et al. |
| 2009/0127005 A1 | 5/2009 | Zachut et al. |
| 2009/0131134 A1 | 5/2009 | Baerlocher et al. |
| 2009/0134838 A1 | 5/2009 | Raghuprasad |
| 2009/0135142 A1 | 5/2009 | Fu et al. |
| 2009/0140985 A1 | 6/2009 | Liu |
| 2009/0141439 A1 | 6/2009 | Moser |
| 2009/0142020 A1 | 6/2009 | Van Ostrand et al. |
| 2009/0146992 A1 | 6/2009 | Fukunaga et al. |
| 2009/0158221 A1 | 6/2009 | Nielsen et al. |
| 2009/0161385 A1 | 6/2009 | Parker et al. |
| 2009/0163147 A1 | 6/2009 | Steigerwald et al. |
| 2009/0167728 A1 | 7/2009 | Geaghan et al. |
| 2009/0167930 A1 | 7/2009 | Safaee-Rad et al. |
| 2009/0174687 A1 | 7/2009 | Ciesla et al. |
| 2009/0174759 A1 | 7/2009 | Yeh et al. |
| 2009/0177906 A1 | 7/2009 | Paniagua, Jr. et al. |
| 2009/0182901 A1 | 7/2009 | Callaghan et al. |
| 2009/0189873 A1 | 7/2009 | Peterson et al. |
| 2009/0189974 A1 | 7/2009 | Deering |
| 2009/0195497 A1 | 8/2009 | Fitzgerald et al. |
| 2009/0195518 A1 | 8/2009 | Mattice et al. |
| 2009/0200384 A1 | 8/2009 | Masalkar |
| 2009/0201254 A1 | 8/2009 | Rais |
| 2009/0207144 A1 | 8/2009 | Bridger |
| 2009/0219250 A1 | 9/2009 | Ure |
| 2009/0231275 A1 | 9/2009 | Odgers |
| 2009/0239586 A1 | 9/2009 | Boeve et al. |
| 2009/0244009 A1 | 10/2009 | Staats et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0269943 A1 | 10/2009 | Palli et al. |
| 2009/0285491 A1 | 11/2009 | Ravenscroft et al. |
| 2009/0296331 A1 | 12/2009 | Choy |
| 2009/0302175 A1* | 12/2009 | Torii .................. F16M 11/10 248/122.1 |
| 2009/0303137 A1 | 12/2009 | Kusaka et al. |
| 2009/0303204 A1 | 12/2009 | Nasiri et al. |
| 2009/0315830 A1 | 12/2009 | Westerman |
| 2009/0316072 A1 | 12/2009 | Okumura et al. |
| 2009/0317595 A1 | 12/2009 | Brehm et al. |
| 2009/0320244 A1 | 12/2009 | Lin |
| 2009/0321490 A1 | 12/2009 | Groene et al. |
| 2009/0322278 A1 | 12/2009 | Franks et al. |
| 2010/0001963 A1 | 1/2010 | Doray et al. |
| 2010/0006412 A1 | 1/2010 | Wang et al. |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045540 A1 | 2/2010 | Lai et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0053771 A1 | 3/2010 | Travis et al. |
| 2010/0054435 A1 | 3/2010 | Louch et al. |
| 2010/0056130 A1 | 3/2010 | Louch et al. |
| 2010/0072334 A1 | 3/2010 | Le Gette et al. |
| 2010/0072351 A1 | 3/2010 | Mahowald |
| 2010/0073329 A1 | 3/2010 | Raman et al. |
| 2010/0075517 A1 | 3/2010 | Ni et al. |
| 2010/0077237 A1 | 3/2010 | Sawyers |
| 2010/0078328 A1 | 4/2010 | Mandler et al. |
| 2010/0079379 A1 | 4/2010 | Demuynck et al. |
| 2010/0081377 A1 | 4/2010 | Chatterjee et al. |
| 2010/0083108 A1 | 4/2010 | Rider et al. |
| 2010/0085321 A1 | 4/2010 | Pundsack |

(56) References Cited

U.S. PATENT DOCUMENTS

| | | |
|---|---|---|
| 2010/0100752 A1 | 4/2010 | Chueh et al. |
| 2010/0102182 A1 | 4/2010 | Lin |
| 2010/0102206 A1 | 4/2010 | Cazaux et al. |
| 2010/0103112 A1 | 4/2010 | Yoo et al. |
| 2010/0103131 A1 | 4/2010 | Segal et al. |
| 2010/0103332 A1 | 4/2010 | Li et al. |
| 2010/0103611 A1 | 4/2010 | Yang et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128427 A1 | 5/2010 | Iso |
| 2010/0133398 A1 | 6/2010 | Chiu et al. |
| 2010/0135036 A1 | 6/2010 | Matsuba et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149073 A1 | 6/2010 | Chaum et al. |
| 2010/0149104 A1 | 6/2010 | Sim et al. |
| 2010/0149111 A1 | 6/2010 | Olien |
| 2010/0149117 A1 | 6/2010 | Chien et al. |
| 2010/0149134 A1 | 6/2010 | Westerman et al. |
| 2010/0149377 A1 | 6/2010 | Shintani et al. |
| 2010/0154171 A1 | 6/2010 | Lombardi et al. |
| 2010/0156798 A1 | 6/2010 | Archer |
| 2010/0156913 A1 | 6/2010 | Ortega et al. |
| 2010/0161522 A1 | 6/2010 | Tirpak et al. |
| 2010/0162109 A1 | 6/2010 | Chatterjee et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0177388 A1 | 7/2010 | Cohen et al. |
| 2010/0180063 A1 | 7/2010 | Ananny et al. |
| 2010/0185877 A1 | 7/2010 | Chueh et al. |
| 2010/0185989 A1 | 7/2010 | Shiplacoff et al. |
| 2010/0188299 A1 | 7/2010 | Rinehart et al. |
| 2010/0188338 A1 | 7/2010 | Longe |
| 2010/0201308 A1 | 8/2010 | Lindholm |
| 2010/0205472 A1 | 8/2010 | Tupman et al. |
| 2010/0206614 A1 | 8/2010 | Park et al. |
| 2010/0206644 A1 | 8/2010 | Yeh |
| 2010/0207774 A1 | 8/2010 | Song |
| 2010/0214214 A1 | 8/2010 | Corson et al. |
| 2010/0214257 A1 | 8/2010 | Wussler et al. |
| 2010/0220205 A1 | 9/2010 | Lee et al. |
| 2010/0222110 A1 | 9/2010 | Kim et al. |
| 2010/0231498 A1 | 9/2010 | Large et al. |
| 2010/0231510 A1 | 9/2010 | Sampsell et al. |
| 2010/0231522 A1 | 9/2010 | Li |
| 2010/0231556 A1 | 9/2010 | Mines et al. |
| 2010/0235546 A1 | 9/2010 | Terlizzi et al. |
| 2010/0237970 A1 | 9/2010 | Liu |
| 2010/0238075 A1 | 9/2010 | Pourseyed |
| 2010/0238138 A1 | 9/2010 | Goertz et al. |
| 2010/0238620 A1 | 9/2010 | Fish |
| 2010/0245106 A1 | 9/2010 | Miller |
| 2010/0245221 A1 | 9/2010 | Khan |
| 2010/0245289 A1 | 9/2010 | Svajda |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0282953 A1 | 11/2010 | Tam |
| 2010/0289457 A1 | 11/2010 | Onnerud et al. |
| 2010/0291331 A1 | 11/2010 | Schaefer |
| 2010/0295812 A1 | 11/2010 | Burns et al. |
| 2010/0296163 A1 | 11/2010 | Saarikko |
| 2010/0299642 A1 | 11/2010 | Merrell et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1* | 12/2010 | Wang ............ F16M 11/10 361/679.01 |
| 2010/0313680 A1 | 12/2010 | Joung et al. |
| 2010/0315345 A1 | 12/2010 | Laitinen |
| 2010/0315348 A1 | 12/2010 | Jellicoe et al. |
| 2010/0315373 A1 | 12/2010 | Steinhauser et al. |
| 2010/0315774 A1 | 12/2010 | Walker et al. |
| 2010/0321301 A1 | 12/2010 | Casparian et al. |
| 2010/0321339 A1 | 12/2010 | Kimmel |
| 2010/0321877 A1 | 12/2010 | Moser |
| 2010/0324457 A1 | 12/2010 | Bean et al. |
| 2010/0325155 A1 | 12/2010 | Skinner et al. |
| 2010/0331059 A1 | 12/2010 | Apgar et al. |
| 2011/0002577 A1 | 1/2011 | Van Ostrand |
| 2011/0007047 A1 | 1/2011 | Fujioka et al. |
| 2011/0012873 A1 | 1/2011 | Prest et al. |
| 2011/0015894 A1 | 1/2011 | Chu |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0032215 A1 | 2/2011 | Sirotich et al. |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0044582 A1 | 2/2011 | Travis et al. |
| 2011/0045317 A1 | 2/2011 | Hao et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0057899 A1 | 3/2011 | Sleeman et al. |
| 2011/0060926 A1 | 3/2011 | Brooks et al. |
| 2011/0069148 A1 | 3/2011 | Jones et al. |
| 2011/0072391 A1 | 3/2011 | Hanggie et al. |
| 2011/0074688 A1 | 3/2011 | Hull et al. |
| 2011/0074702 A1 | 3/2011 | Pertuit et al. |
| 2011/0080367 A1 | 4/2011 | Marchand et al. |
| 2011/0081946 A1 | 4/2011 | Singh |
| 2011/0095994 A1 | 4/2011 | Birnbaum |
| 2011/0096035 A1 | 4/2011 | Shen |
| 2011/0096513 A1 | 4/2011 | Kim |
| 2011/0102326 A1 | 5/2011 | Casparian et al. |
| 2011/0102356 A1 | 5/2011 | Kemppinen et al. |
| 2011/0102752 A1 | 5/2011 | Chen et al. |
| 2011/0107958 A1 | 5/2011 | Pance et al. |
| 2011/0108401 A1 | 5/2011 | Yamada et al. |
| 2011/0113368 A1 | 5/2011 | Carvajal et al. |
| 2011/0115738 A1 | 5/2011 | Suzuki et al. |
| 2011/0115747 A1 | 5/2011 | Powell et al. |
| 2011/0117970 A1 | 5/2011 | Choi |
| 2011/0118025 A1 | 5/2011 | Lukas et al. |
| 2011/0122071 A1 | 5/2011 | Powell |
| 2011/0134032 A1 | 6/2011 | Chiu et al. |
| 2011/0134043 A1 | 6/2011 | Chen |
| 2011/0134112 A1 | 6/2011 | Koh et al. |
| 2011/0134161 A1 | 6/2011 | Son et al. |
| 2011/0149094 A1 | 6/2011 | Chen et al. |
| 2011/0157037 A1 | 6/2011 | Shamir et al. |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164357 A1 | 7/2011 | Yeom et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0169762 A1 | 7/2011 | Weiss |
| 2011/0169778 A1 | 7/2011 | Nungester et al. |
| 2011/0170289 A1 | 7/2011 | Allen et al. |
| 2011/0176035 A1 | 7/2011 | Poulsen |
| 2011/0179864 A1 | 7/2011 | Raasch et al. |
| 2011/0183120 A1 | 7/2011 | Sharygin et al. |
| 2011/0184646 A1 | 7/2011 | Wong et al. |

(56) References Cited

U.S. PATENT DOCUMENTS

| | | |
|---|---|---|
| 2011/0184824 A1 | 7/2011 | George et al. |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0193938 A1 | 8/2011 | Oderwald et al. |
| 2011/0197156 A1 | 8/2011 | Strait et al. |
| 2011/0199389 A1 | 8/2011 | Lu et al. |
| 2011/0202878 A1 | 8/2011 | Park et al. |
| 2011/0205372 A1 | 8/2011 | Miramontes |
| 2011/0216266 A1 | 9/2011 | Travis |
| 2011/0221659 A1 | 9/2011 | King et al. |
| 2011/0221678 A1 | 9/2011 | Davydov |
| 2011/0227913 A1 | 9/2011 | Hyndman |
| 2011/0228462 A1 | 9/2011 | Dang |
| 2011/0231682 A1 | 9/2011 | Kakish et al. |
| 2011/0234494 A1 | 9/2011 | Peterson et al. |
| 2011/0234502 A1 | 9/2011 | Yun et al. |
| 2011/0234535 A1 | 9/2011 | Hung et al. |
| 2011/0234881 A1 | 9/2011 | Wakabayashi et al. |
| 2011/0235179 A1 | 9/2011 | Simmonds |
| 2011/0241999 A1 | 10/2011 | Thier |
| 2011/0242138 A1 | 10/2011 | Tribble |
| 2011/0242298 A1 | 10/2011 | Bathiche et al. |
| 2011/0242440 A1 | 10/2011 | Noma et al. |
| 2011/0242670 A1 | 10/2011 | Simmonds |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0261083 A1 | 10/2011 | Wilson |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0267300 A1 | 11/2011 | Serban et al. |
| 2011/0273475 A1 | 11/2011 | Herz et al. |
| 2011/0285555 A1 | 11/2011 | Bocirnea |
| 2011/0290686 A1 | 12/2011 | Huang |
| 2011/0291958 A1 | 12/2011 | Wu et al. |
| 2011/0291993 A1 | 12/2011 | Miyazaki |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0304815 A1 | 12/2011 | Newell |
| 2011/0304962 A1 | 12/2011 | Su |
| 2011/0305875 A1 | 12/2011 | Sanford et al. |
| 2011/0306424 A1 | 12/2011 | Kazama et al. |
| 2011/0310038 A1 | 12/2011 | Park et al. |
| 2011/0310548 A1 | 12/2011 | Ahn et al. |
| 2011/0314425 A1 | 12/2011 | Chiang |
| 2011/0316807 A1 | 12/2011 | Corrion |
| 2011/0317399 A1 | 12/2011 | Hsu |
| 2011/0320204 A1 | 12/2011 | Locker et al. |
| 2012/0002820 A1 | 1/2012 | Leichter |
| 2012/0007821 A1 | 1/2012 | Zaliva |
| 2012/0011462 A1 | 1/2012 | Westerman et al. |
| 2012/0013490 A1 | 1/2012 | Pance |
| 2012/0013519 A1 | 1/2012 | Hakansson et al. |
| 2012/0019165 A1 | 1/2012 | Igaki et al. |
| 2012/0020019 A1 | 1/2012 | Chen et al. |
| 2012/0020112 A1 | 1/2012 | Fisher et al. |
| 2012/0020490 A1 | 1/2012 | Leichter |
| 2012/0021618 A1 | 1/2012 | Schultz |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0026096 A1 | 2/2012 | Ku |
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0033369 A1 | 2/2012 | Wu et al. |
| 2012/0038495 A1 | 2/2012 | Ishikawa |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062564 A1 | 3/2012 | Miyashita et al. |
| 2012/0062850 A1 | 3/2012 | Travis |
| 2012/0068919 A1 | 3/2012 | Lauder et al. |
| 2012/0069540 A1 | 3/2012 | Lauder et al. |
| 2012/0071008 A1 | 3/2012 | Sessford |
| 2012/0072167 A1 | 3/2012 | Cretella, Jr. et al. |
| 2012/0075249 A1 | 3/2012 | Hoch |
| 2012/0077384 A1 | 3/2012 | Bar-Niv et al. |
| 2012/0081316 A1 | 4/2012 | Sirpal et al. |
| 2012/0087078 A1 | 4/2012 | Medica et al. |
| 2012/0092279 A1 | 4/2012 | Martin |
| 2012/0094257 A1 | 4/2012 | Pillischer et al. |
| 2012/0099263 A1 | 4/2012 | Lin |
| 2012/0099749 A1 | 4/2012 | Rubin et al. |
| 2012/0102438 A1 | 4/2012 | Robinson et al. |
| 2012/0103778 A1 | 5/2012 | Obata et al. |
| 2012/0105481 A1 | 5/2012 | Baek et al. |
| 2012/0106082 A1 | 5/2012 | Wu et al. |
| 2012/0113137 A1 | 5/2012 | Nomoto |
| 2012/0113223 A1 | 5/2012 | Hilliges et al. |
| 2012/0113579 A1 | 5/2012 | Agata et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0133561 A1 | 5/2012 | Konanur et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0155015 A1 | 6/2012 | Govindasamy et al. |
| 2012/0156875 A1 | 6/2012 | Srinivas et al. |
| 2012/0161406 A1 | 6/2012 | Mersky |
| 2012/0162126 A1 | 6/2012 | Yuan et al. |
| 2012/0162693 A1 | 6/2012 | Ito |
| 2012/0162889 A1 | 6/2012 | Han |
| 2012/0170284 A1 | 7/2012 | Shedletsky |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0182743 A1 | 7/2012 | Chou |
| 2012/0194393 A1 | 8/2012 | Uttermann et al. |
| 2012/0194448 A1 | 8/2012 | Rothkopf |
| 2012/0195063 A1 | 8/2012 | Kim et al. |
| 2012/0200532 A1 | 8/2012 | Powell et al. |
| 2012/0200802 A1 | 8/2012 | Large |
| 2012/0206937 A1 | 8/2012 | Travis et al. |
| 2012/0212438 A1 | 8/2012 | Vaisanen |
| 2012/0218194 A1 | 8/2012 | Silverman |
| 2012/0221877 A1 | 8/2012 | Prabu |
| 2012/0223866 A1 | 9/2012 | Ayala Vazquez et al. |
| 2012/0224073 A1 | 9/2012 | Miyahara |
| 2012/0227259 A1 | 9/2012 | Badaye et al. |
| 2012/0229634 A1 | 9/2012 | Laett et al. |
| 2012/0235635 A1 | 9/2012 | Sato |
| 2012/0235921 A1 | 9/2012 | Laubach |
| 2012/0242584 A1 | 9/2012 | Tuli |
| 2012/0243165 A1 | 9/2012 | Chang et al. |
| 2012/0243204 A1 | 9/2012 | Robinson |
| 2012/0246377 A1 | 9/2012 | Bhesania et al. |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256848 A1 | 10/2012 | Madabusi Srinivasan |
| 2012/0256959 A1 | 10/2012 | Ye et al. |
| 2012/0260177 A1 | 10/2012 | Sehrer |
| 2012/0268912 A1 | 10/2012 | Minami et al. |
| 2012/0274578 A1 | 11/2012 | Snow et al. |
| 2012/0274811 A1 | 11/2012 | Bakin |
| 2012/0287562 A1 | 11/2012 | Wu et al. |
| 2012/0298491 A1 | 11/2012 | Ozias et al. |
| 2012/0299872 A1 | 11/2012 | Nishikawa et al. |
| 2012/0300275 A1 | 11/2012 | Vilardell et al. |
| 2012/0306747 A1 | 12/2012 | Davidson et al. |
| 2012/0312955 A1 | 12/2012 | Randolph |
| 2012/0326003 A1 | 12/2012 | Solow et al. |

(56) References Cited

U.S. PATENT DOCUMENTS

| | | |
|---|---|---|
| 2012/0328349 A1 | 12/2012 | Isaac et al. |
| 2013/0002562 A1 | 1/2013 | Leskela et al. |
| 2013/0007665 A1 | 1/2013 | Chaudhri et al. |
| 2013/0009413 A1 | 1/2013 | Chiu et al. |
| 2013/0015311 A1 | 1/2013 | Kim |
| 2013/0016468 A1 | 1/2013 | Oh |
| 2013/0017696 A1 | 1/2013 | Alvarez Rivera |
| 2013/0021289 A1 | 1/2013 | Chen et al. |
| 2013/0027354 A1 | 1/2013 | Yabuta et al. |
| 2013/0027867 A1 | 1/2013 | Lauder et al. |
| 2013/0031353 A1 | 1/2013 | Noro |
| 2013/0038541 A1 | 2/2013 | Bakker |
| 2013/0044059 A1 | 2/2013 | Fu |
| 2013/0044074 A1 | 2/2013 | Park et al. |
| 2013/0046397 A1 | 2/2013 | Fadell et al. |
| 2013/0063465 A1 | 3/2013 | Zaman |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076614 A1 | 3/2013 | Ive et al. |
| 2013/0076617 A1 | 3/2013 | Csaszar et al. |
| 2013/0076635 A1 | 3/2013 | Lin |
| 2013/0082824 A1 | 4/2013 | Colley |
| 2013/0083466 A1 | 4/2013 | Becze et al. |
| 2013/0088431 A1 | 4/2013 | Ballagas et al. |
| 2013/0093679 A1 | 4/2013 | Dickinson et al. |
| 2013/0100030 A1 | 4/2013 | Los et al. |
| 2013/0100082 A1 | 4/2013 | Bakin et al. |
| 2013/0106766 A1 | 5/2013 | Yilmaz et al. |
| 2013/0106813 A1 | 5/2013 | Hotelling et al. |
| 2013/0107144 A1 | 5/2013 | Marhefka et al. |
| 2013/0107572 A1 | 5/2013 | Holman et al. |
| 2013/0118878 A1 | 5/2013 | Purcocks |
| 2013/0120466 A1 | 5/2013 | Chen et al. |
| 2013/0120760 A1 | 5/2013 | Raguin et al. |
| 2013/0135214 A1 | 5/2013 | Li et al. |
| 2013/0151944 A1 | 6/2013 | Lin |
| 2013/0154959 A1 | 6/2013 | Lindsay et al. |
| 2013/0159417 A1 | 6/2013 | Meckler et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0201094 A1 | 8/2013 | Travis et al. |
| 2013/0207937 A1 | 8/2013 | Lutian et al. |
| 2013/0212483 A1 | 8/2013 | Brakensiek et al. |
| 2013/0215035 A1 | 8/2013 | Guard |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0222353 A1 | 8/2013 | Large |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228435 A1 | 9/2013 | Whitt, III |
| 2013/0228439 A1 | 9/2013 | Whitt, III |
| 2013/0229100 A1 | 9/2013 | Siddiqui et al. |
| 2013/0229335 A1 | 9/2013 | Whitman |
| 2013/0229347 A1 | 9/2013 | Lutz, III |
| 2013/0229350 A1 | 9/2013 | Shaw et al. |
| 2013/0229351 A1 | 9/2013 | Whitt, III |
| 2013/0229354 A1 | 9/2013 | Whitt, III et al. |
| 2013/0229356 A1 | 9/2013 | Marwah |
| 2013/0229357 A1 | 9/2013 | Powell |
| 2013/0229363 A1 | 9/2013 | Whitman |
| 2013/0229366 A1 | 9/2013 | Dighde |
| 2013/0229380 A1 | 9/2013 | Lutz, III |
| 2013/0229386 A1 | 9/2013 | Bathiche |
| 2013/0229534 A1 | 9/2013 | Panay |
| 2013/0229568 A1 | 9/2013 | Belesiu et al. |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III et al. |
| 2013/0229760 A1 | 9/2013 | Whitt, III |
| 2013/0229761 A1 | 9/2013 | Shaw |
| 2013/0229762 A1 | 9/2013 | Whitt, III |
| 2013/0229773 A1 | 9/2013 | Siddiqui et al. |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0241860 A1 | 9/2013 | Ciesla et al. |
| 2013/0242495 A1 | 9/2013 | Bathiche et al. |
| 2013/0262886 A1 | 10/2013 | Nishimura |
| 2013/0268897 A1 | 10/2013 | Li et al. |
| 2013/0278552 A1 | 10/2013 | Kamin-Lyndgaard |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0304944 A1 | 11/2013 | Young |
| 2013/0321992 A1 | 12/2013 | Liu et al. |
| 2013/0322000 A1 | 12/2013 | Whitt |
| 2013/0322001 A1 | 12/2013 | Whitt |
| 2013/0328761 A1 | 12/2013 | Boulanger |
| 2013/0329301 A1 | 12/2013 | Travis |
| 2013/0329360 A1 | 12/2013 | Aldana |
| 2013/0332628 A1 | 12/2013 | Panay |
| 2013/0335330 A1 | 12/2013 | Lane |
| 2013/0335387 A1 | 12/2013 | Emerton |
| 2013/0335902 A1 | 12/2013 | Campbell |
| 2013/0335903 A1 | 12/2013 | Raken |
| 2013/0339757 A1 | 12/2013 | Reddy |
| 2013/0342464 A1 | 12/2013 | Bathiche et al. |
| 2013/0342465 A1 | 12/2013 | Bathiche |
| 2013/0342976 A1 | 12/2013 | Chung |
| 2013/0346636 A1 | 12/2013 | Bathiche |
| 2013/0346882 A1 | 12/2013 | Shiplacoff et al. |
| 2014/0012401 A1 | 1/2014 | Perek et al. |
| 2014/0022629 A1 | 1/2014 | Powell |
| 2014/0043275 A1 | 2/2014 | Whitman |
| 2014/0048399 A1 | 2/2014 | Whitt, III |
| 2014/0049894 A1 | 2/2014 | Rihn |
| 2014/0055624 A1 | 2/2014 | Gaines |
| 2014/0063198 A1 | 3/2014 | Boulanger |
| 2014/0078063 A1 | 3/2014 | Bathiche |
| 2014/0085814 A1 | 3/2014 | Kielland |
| 2014/0104189 A1 | 4/2014 | Marshall et al. |
| 2014/0118241 A1 | 5/2014 | Chai |
| 2014/0119802 A1 | 5/2014 | Shaw |
| 2014/0131000 A1 | 5/2014 | Bornemann et al. |
| 2014/0132550 A1 | 5/2014 | McCracken et al. |
| 2014/0135060 A1 | 5/2014 | Mercer |
| 2014/0139989 A1 | 5/2014 | Mori et al. |
| 2014/0148938 A1 | 5/2014 | Zhang |
| 2014/0154523 A1 | 6/2014 | Bornemann |
| 2014/0166227 A1 | 6/2014 | Bornemann |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0225821 A1 | 8/2014 | Kim et al. |
| 2014/0233237 A1 | 8/2014 | Lutian |
| 2014/0247546 A1 | 9/2014 | Whitt |
| 2014/0291134 A1 | 10/2014 | Whitt |
| 2014/0293534 A1 | 10/2014 | Siddiqui |
| 2014/0313665 A1 | 10/2014 | Delpier et al. |
| 2014/0362506 A1 | 12/2014 | Whitt, III et al. |
| 2014/0370937 A1 | 12/2014 | Park et al. |

(56) References Cited

U.S. PATENT DOCUMENTS

| | | | |
|---|---|---|---|
| 2014/0372914 A1 | 12/2014 | Byrd et al. |
| 2014/0374230 A1 | 12/2014 | Shaw et al. |
| 2014/0379942 A1 | 12/2014 | Perek et al. |
| 2014/0379991 A1 | 12/2014 | Lomet et al. |
| 2015/0005953 A1 | 1/2015 | Fadell et al. |
| 2015/0022995 A1 | 1/2015 | Peterson et al. |
| 2015/0036274 A1 | 2/2015 | Belesiu et al. |
| 2015/0185950 A1 | 7/2015 | Watanabe et al. |
| 2015/0212553 A1 | 7/2015 | Park et al. |
| 2015/0227212 A1 | 8/2015 | Whitt, III et al. |
| 2015/0234478 A1 | 8/2015 | Belesiu et al. |
| 2015/0253872 A1 | 9/2015 | Reyes |
| 2015/0261262 A1 | 9/2015 | Whitt, III et al. |
| 2015/0286125 A1 | 10/2015 | Powell |
| 2015/0311014 A1 | 10/2015 | Shaw et al. |
| 2016/0034424 A1 | 2/2016 | Won |
| 2016/0034695 A1 | 2/2016 | Won et al. |
| 2016/0037481 A1 | 2/2016 | Won et al. |
| 2016/0124467 A1 | 5/2016 | Whitt et al. |
| 2016/0170935 A1 | 6/2016 | Drasnin |
| 2016/0209884 A1 | 7/2016 | Whitt et al. |
| 2016/0299537 A1 | 10/2016 | Whitt et al. |
| 2016/0306396 A1 | 10/2016 | Bathiche et al. |
| 2017/0131819 A1 | 5/2017 | Shaw et al. |
| 2017/0147084 A1 | 5/2017 | Whitt et al. |
| 2017/0177038 A1 | 6/2017 | Whitt et al. |

FOREIGN PATENT DOCUMENTS

| | | |
|---|---|---|
| CN | 1352767 | 6/2002 |
| CN | 1394119 | 1/2003 |
| CN | 1440513 | 9/2003 |
| CN | 1467615 | 1/2004 |
| CN | 1489031 | 4/2004 |
| CN | 1537223 | 10/2004 |
| CN | 1653411 | 8/2005 |
| CN | 1787605 | 6/2006 |
| CN | 1808362 | 7/2006 |
| CN | 200947406 | 9/2007 |
| CN | 101198925 | 6/2008 |
| CN | 101335147 | 12/2008 |
| CN | 101366001 | 2/2009 |
| CN | 101410781 | 4/2009 |
| CN | 101452334 | 6/2009 |
| CN | 101464750 | 6/2009 |
| CN | 101490642 | 7/2009 |
| CN | 101500388 | 8/2009 |
| CN | 101644979 | 2/2010 |
| CN | 101675406 | 3/2010 |
| CN | 101681189 | 3/2010 |
| CN | 101765825 | 6/2010 |
| CN | 101904661 | 12/2010 |
| CN | 101908428 | 12/2010 |
| CN | 102004559 | 4/2011 |
| CN | 102004577 | 4/2011 |
| CN | 102012772 | 4/2011 |
| CN | 1102012763 | 4/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102156510 | 8/2011 |
| CN | 201936231 | 8/2011 |
| CN | 102214040 | 10/2011 |
| CN | 102292687 | 12/2011 |
| CN | 202119579 | 1/2012 |
| CN | 102339683 | 2/2012 |
| CN | 102356624 | 2/2012 |
| CN | 202441167 | 9/2012 |
| CN | 102778956 | 11/2012 |
| CN | 103455149 | 12/2013 |
| CN | 203480365 | 3/2014 |
| CN | 203606723 | 5/2014 |
| DE | 19924694 | 3/2001 |
| DE | 10116556 | 10/2002 |
| EP | 0271956 | 6/1988 |
| EP | 645726 | 3/1995 |
| EP | 1003188 | 5/2000 |
| EP | 1223722 | 7/2002 |
| EP | 1425763 | 6/2004 |
| EP | 1480029 | 11/2004 |
| EP | 1591891 | 11/2005 |
| EP | 1983411 | 10/2008 |
| EP | 2006869 | 12/2008 |
| EP | 2009660 | 12/2008 |
| EP | 2026178 | 2/2009 |
| EP | 2207076 | 7/2010 |
| EP | 2353978 | 8/2011 |
| EP | 2378607 | 10/2011 |
| EP | 2381290 | 10/2011 |
| EP | 2400365 | 12/2011 |
| EP | 2410408 | 1/2012 |
| EP | 2423787 | 2/2012 |
| GB | 2068643 | 8/1981 |
| GB | 2123213 | 1/1984 |
| GB | 2178570 | 2/1987 |
| GB | 2305780 | 4/1997 |
| GB | 2381584 | 5/2003 |
| GB | 2402460 | 12/2004 |
| GB | 2482931 | 2/2012 |
| GB | 2482932 | 2/2012 |
| JP | 52107722 | 9/1977 |
| JP | 56108127 | 8/1981 |
| JP | S7126617 | 8/1982 |
| JP | S5810335 | 1/1983 |
| JP | S593824 | 1/1984 |
| JP | 6014315 | 1/1985 |
| JP | S6037923 | 8/1985 |
| JP | S60216479 | 10/1985 |
| JP | H0195596 | 4/1989 |
| JP | H0245820 | 2/1990 |
| JP | 04363823 | 12/1992 |
| JP | 4363823 | 12/1992 |
| JP | 06250761 | 9/1994 |
| JP | H06250761 | 9/1994 |
| JP | 08273471 | 10/1996 |
| JP | H104540 | 1/1998 |
| JP | H1078357 | 3/1998 |
| JP | H10234057 | 9/1998 |
| JP | 10301055 | 11/1998 |
| JP | 10326124 | 12/1998 |
| JP | 1173239 | 3/1999 |
| JP | H11248557 | 9/1999 |
| JP | 11338575 | 12/1999 |
| JP | 2000010654 | 1/2000 |
| JP | 2000035849 | 2/2000 |
| JP | 2000106021 | 4/2000 |
| JP | 2001142564 | 5/2001 |
| JP | 2001174746 | 6/2001 |
| JP | 2002162912 | 6/2002 |
| JP | 2002170458 | 6/2002 |
| JP | 2002300438 | 10/2002 |
| JP | 2002358852 | 12/2002 |
| JP | 2002366277 | 12/2002 |
| JP | 2003256106 | 9/2003 |
| JP | 2003257282 | 9/2003 |
| JP | 2003529837 | 10/2003 |
| JP | 2004038950 | 2/2004 |
| JP | 2005031555 | 2/2005 |
| JP | 2005078104 | 3/2005 |
| JP | 2005117161 | 4/2005 |
| JP | 2005302447 | 10/2005 |
| JP | 2005331565 | 12/2005 |
| JP | 2006004063 | 1/2006 |
| JP | 2006093461 | 4/2006 |
| JP | 2006127486 | 5/2006 |
| JP | 2006160155 | 6/2006 |
| JP | 2006163459 | 6/2006 |
| JP | 2006266812 | 10/2006 |
| JP | 2006292375 | 10/2006 |
| JP | 2006294361 | 10/2006 |

(56) References Cited

FOREIGN PATENT DOCUMENTS

| | | |
|---|---|---|
| JP | 2008140182 | 6/2008 |
| JP | 2008152805 | 7/2008 |
| JP | 2008298435 | 12/2008 |
| JP | 2009009854 | 1/2009 |
| JP | 2009122551 | 6/2009 |
| JP | 2010244514 | 10/2010 |
| JP | 2010272384 | 12/2010 |
| JP | 2011221640 | 11/2011 |
| JP | 2003077368 | 3/2014 |
| KR | 20010039013 | 5/2001 |
| KR | 20010107055 | 12/2001 |
| KR | 20040066647 | 7/2004 |
| KR | 20050014299 | 2/2005 |
| KR | 20060003093 | 1/2006 |
| KR | 20080006404 | 1/2008 |
| KR | 20080009490 | 1/2008 |
| KR | 20080055051 | 6/2008 |
| KR | 20090029411 | 3/2009 |
| KR | 20100022059 | 2/2010 |
| KR | 20100067366 | 6/2010 |
| KR | 20100115675 | 10/2010 |
| KR | 20110064265 | 6/2011 |
| KR | 102011008717 | 8/2011 |
| KR | 20110109791 | 10/2011 |
| KR | 20110120002 | 11/2011 |
| KR | 20110122333 | 11/2011 |
| KR | 101113530 | 2/2012 |
| NL | 1038411 | 5/2012 |
| WO | WO-9108915 | 6/1991 |
| WO | WO-9919995 | 4/1999 |
| WO | WO-9964784 | 12/1999 |
| WO | WO-0079327 | 12/2000 |
| WO | WO-0128309 | 4/2001 |
| WO | WO-03106134 | 12/2003 |
| WO | WO-2005027696 | 3/2005 |
| WO | WO-2005059874 | 6/2005 |
| WO | WO-2006044818 | 4/2006 |
| WO | WO-2007103631 | 9/2007 |
| WO | WO-2007112172 | 10/2007 |
| WO | WO-2008055039 | 5/2008 |
| WO | WO-2008117529 | 10/2008 |
| WO | WO-2009034484 | 3/2009 |
| WO | WO-2010011983 | 1/2010 |
| WO | WO-2010074116 | 7/2010 |
| WO | WO-2010105272 | 9/2010 |
| WO | WO-2010147609 | 12/2010 |
| WO | WO-2011016200 | 2/2011 |
| WO | WO-2011049609 | 4/2011 |
| WO | WO-2011071096 | 6/2011 |
| WO | WO-2011138200 | 11/2011 |
| WO | WO-2012036717 | 3/2012 |
| WO | WO-2013012699 | 1/2013 |
| WO | WO-2013033067 | 3/2013 |

OTHER PUBLICATIONS

"Advisory Action", U.S. Appl. No. 14/059,280, Sep. 25, 2015, 7 pages.
"Corrected Notice of Allowance", U.S. Appl. No. 13/564,520, Sep. 17, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Oct. 2, 2015, 2 pages.
"Decision on Reexamination", CN Application No. 201320097079.5, Sep. 7, 2015, 8 Pages.
"Extended European Search Report", EP Application No. 13858620.1, Sep. 18, 2015, 6 pages.
"Extended European Search Report", EP Application No. 13858834.8, Oct. 29, 2015, 8 pages.
"Extended European Search Report", EP Application No. 13859280.3, Sep. 7, 2015, 6 pages.
"Extended European Search Report", EP Application No. 13859406.4, Sep. 8, 2015, 6 pages.
"Final Office Action", U.S. Appl. No. 13/647,479, Sep. 17, 2015, 11 pages.
"Final Office Action", U.S. Appl. No. 13/653,218, Oct. 5, 2015, 16 pages.
"Final Office Action", U.S. Appl. No. 13/689,541, Nov. 2, 2015, 21 pages.
"Final Office Action", U.S. Appl. No. 13/773,496, Oct. 29, 2015, 16 pages.
"Foreign Office Action", CN Application No. 201310065273.X, Oct. 28, 2015, 14 pages.
"Foreign Office Action", CN Application No. 201310067592.4, Oct. 23, 2015, 12 Pages.
"Foreign Office Action", CN Application No. 201310067622.1, Oct. 27, 2015, 14 pages.
"Foreign Office Action", CN Application No. 201310067627.4, Sep. 28, 2015, 14 pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/468,882, Nov. 13, 2015, 9 pages.
"Non-Final Office Action", U.S. Appl. No. 13/470,951, Oct. 1, 2015, 29 pages.
"Non-Final Office Action", U.S. Appl. No. 13/471,393, Sep. 30, 2015, 15 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Notice of Allowance", U.S. Appl. No. 13/471,054, Sep. 25, 2015, 7 pages.
"Notice of Allowance", U.S. Appl. No. 13/471,376, Nov. 23, 2015, 9 pages.
"Notice of Allowance", U.S. Appl. No. 13/471,412, Nov. 20, 2015, 10 pages.
"Notice of Allowance", U.S. Appl. No. 13/852,848, Nov. 19, 2015, 4 pages.
"Notice of Allowance", U.S. Appl. No. 14/059,280, Nov. 23, 2015, 9 pages.
"Notice of Allowance", U.S. Appl. No. 14/727,001, Oct. 2, 2015, 4 pages.
"Restriction Requirement", U.S. Appl. No. 13/891,109, Sep. 22, 2015, 6 pages.
"Supplemental Notice of Allowance", U.S. Appl. No. 13/468,949, Sep. 14, 2015, 2 pages.
"Supplemental Notice of Allowance", U.S. Appl. No. 13/471,054, Nov. 19, 2015, 2 pages.
"Supplementary Euorpean Search Report", EP Application No. 13728568.0, Oct. 30, 2015, 7 pages.
"Corrected Notice of Allowance", U.S. Appl. No. 13/471,054, Jan. 11, 2016, 2 pages.
"Corrected Notice of Allowance", U.S. Appl. No. 13/527,263, Jan. 4, 2016, 2 pages.
"Corrected Notice of Allowance", U.S. Appl. No. 13/527,263, Jan. 11, 2016, 2 pages.
"Corrected Notice of Allowance", U.S. Appl. No. 14/727,001, Dec. 15, 2015, 2 pages.
"Extended European Search Report", EP Application No. 13858283.8, Nov. 23, 2015, 10 pages.
"Extended European Search Report", EP Application No. 13858397.6, Nov. 30, 2015, 7 pages.
"Extended European Search Report", EP Application No. 13858674.8, Nov. 27, 2015, 6 pages.
"Extended European Search Report", EP Application No. 13860272.7, Dec. 14, 2015, 9 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Foreign Office Action", CN Application No. 201310067373.6, Dec. 23, 2015, 15 Pages.

(56) References Cited

OTHER PUBLICATIONS

"Foreign Office Action", CN Application No. 201310067429.8, Nov. 25, 2015, 12 Pages.
"Foreign Office Action", CN Application No. 201310067631.0, Dec. 10, 2015, 11 Pages.
"Foreign Office Action", CN Application No. 201310067641.4, Dec. 30, 2015, 12 Pages.
"Foreign Office Action", CN Application No. 201310067808.7, Jan. 7, 2016, 6 Pages.
"Non-Final Office Action", U.S. Appl. No. 13/492,232, Dec. 17, 2015, 11 pages.
"Non-Final Office Action", U.S. Appl. No. 13/784,746, Oct. 7, 2015, 15 pages.
"Notice of Allowance", U.S. Appl. No. 13/527,263, Dec. 9, 2015, 6 pages.
"Notice of Allowance", U.S. Appl. No. 13/647,479, Jan. 14, 2016, 8 pages.
"Notice of Allowance", U.S. Appl. No. 14/166,596, Dec. 4, 2015, 15 pages.
"Notice of Allowance", U.S. Appl. No. 14/727,001, Dec. 15, 2015, 2 pages.
"Restriction Requirement", U.S. Appl. No. 14/794,182, Dec. 22, 2015, 6 pages.
"Supplementary Euorpean Search Report", EP Application No. 13858403.2, Nov. 25, 2015, 7 pages.
"Corrected Notice of Allowance", U.S. Appl. No. 13/471,412, Feb. 16, 2016, 2 pages.
"Corrected Notice of Allowance", U.S. Appl. No. 13/852,848, Jan. 29, 2016, 2 pages.
"Corrected Notice of Allowance", U.S. Appl. No. 13/852,848, Mar. 2, 2016, 2 pages.
"Corrected Notice of Allowance", U.S. Appl. No. 14/727,001, Jan. 25, 2016, 2 pages.
"Extended European Search Report", EP Application No. 13857958.6, Dec. 18, 2015, 8 pages.
"Extended European Search Report", EP Application No. 13860836.9, Nov. 27, 2015, 9 pages.
"Final Office Action", U.S. Appl. No. 14/225,250, Jan. 29, 2016, 10 pages.
"Foreign Office Action", CN Application No. 201310067356.2, Feb. 4, 2016, 15 Pages.
"Foreign Office Action", CN Application No. 201310067603.9, Feb. 15, 2016, 12 Pages.
"Non-Final Office Action", U.S. Appl. No. 13/891,109, Jan. 29, 2016, 8 pages.
"Notice of Allowance", U.S. Appl. No. 14/517,048, Feb. 24, 2016, 8 pages.
"Corrected Notice of Allowance", U.S. Appl. No. 13/471,412, Mar. 3, 2016, 2 pages.
"Corrected Notice of Allowance", U.S. Appl. No. 13/527,263, Mar. 7, 2016, 2 pages.
"Corrected Notice of Allowance", U.S. Appl. No. 13/527,263, Apr. 12, 2016, 2 pages.
"Corrected Notice of Allowance", U.S. Appl. No. 13/527,263, Apr. 25, 2016, 2 pages.
"Corrected Notice of Allowance", U.S. Appl. No. 14/166,596, Mar. 14, 2016, 2 pages.
"Corrected Notice of Allowance", U.S. Appl. No. 14/517,048, Apr. 13, 2016, 2 pages.
"Extended European Search Report", EP Application No. 13728568.0, Mar. 14, 2016, 16 pages.
"Final Office Action", U.S. Appl. No. 13/471,393, Mar. 9, 2016, 17 pages.
"Foreign Notice of Allowance", CN Application No. 201310065273.X, Mar. 31, 2016, 4 Pages.
"Foreign Notice of Allowance", CN Application No. 201320097079.5, Apr. 1, 2016, 4 Pages.
"Foreign Office Action", CN Application No. 201310225788.1, Feb. 29, 2016, 11 Pages.
"Non-Final Office Action", U.S. Appl. No. 13/653,218, Apr. 20, 2016, 17 pages.
"Non-Final Office Action", U.S. Appl. No. 14/162,529, Apr. 6, 2016, 17 pages.
"Non-Final Office Action", U.S. Appl. No. 14/307,262, Apr. 20, 2016, 10 pages.
"Non-Final Office Action", U.S. Appl. No. 14/794,182, Apr. 13, 2016, 15 pages.
"Non-Final Office Action", U.S. Appl. No. 14/994,737, Apr. 5, 2016, 6 pages.
"Notice of Allowance", U.S. Appl. No. 13/470,951, Mar. 24, 2016, 8 pages.
"Restriction Requirement", U.S. Appl. No. 14/307,262, Mar. 21, 2016, 6 pages.
"Extended European Search Report", EP Application No. 13858403.2, Mar. 16, 2016, 12 pages.
"Extended European Search Report", EP Application No. 13860271.9, May 4, 2016, 8 pages.
"Extended European Search Report", EP Application No. 13861059.7, Apr. 29, 2016, 8 pages.
"Final Office Action", U.S. Appl. No. 13/492,232, May 25, 2016, 12 pages.
"Final Office Action", U.S. Appl. No. 13/769,356, Mar. 23, 2016, 15 pages.
"Foreign Notice of Allowance", CN Application No. 201310067531.8, Jun. 7, 2016, 4 pages.
"Foreign Notice of Allowance", CN Application No. 201310067592.4, May 17, 2016, 4 pages.
"Foreign Notice of Allowance", CN Application No. 201310067808.7, May 4, 2016, 4 pages.
"Foreign Office Action", CN Application No. 201310067385.9, Apr. 14, 2016, 14 Pages.
"Foreign Office Action", CN Application No. 201310067627.4, May 3, 2016, 7 pages.
"Foreign Office Action", CN Application No. 201310096345.7, May 25, 2016, 16 Pages.
"Foreign Office Action", CN Application No. 201310316114.2, Apr. 18, 2016, 11 pages.
"Foreign Office Action", CN Application No. 201380025290.9, May 10, 2016, 15 pages.
"International Preliminary Report on Patentability", Application No. PCT/US2014/068687, Mar. 11, 2016, 7 pages.
"Non-Final Office Action", U.S. Appl. No. 13/689,541, Apr. 14, 2016, 23 pages.
"Notice of Allowance", U.S. Appl. No. 13/468,882, May 24, 2016, 5 pages.
"Notice of Allowance", U.S. Appl. No. 13/891,109, May 6, 2016, 7 pages.
"Notice of Allowance", U.S. Appl. No. 14/698,318, May 6, 2016, 13 pages.
"Final Office Action", U.S. Appl. No. 14/162,529, Sep. 28, 2016, 19 pages.
"Final Office Action", U.S. Appl. No. 14/307,262, Sep. 29, 2016, 7 pages.
"Final Office Action", U.S. Appl. No. 14/794,182, Sep. 15, 2016, 25 pages.
"Final Office Action", U.S. Appl. No. 14/994,737, Aug. 26, 2016, 6 pages.
"Foreign Notice of Allowance", CN Application No. 201310067631.0, Aug. 5, 2016, 4 pages.
"Foreign Notice of Allowance", CN Application No. 201310316114.2, Aug. 2, 2016, 4 pages.
"Foreign Office Action", CN Application No. 201310067373.6, Aug. 18, 2016, 16 pages.
"Foreign Office Action", CN Application No. 201310067429.8, Jul. 20, 2016, 11 pages.
"Foreign Office Action", CN Application No. 201310067641.4, Jul. 27, 2016, 8 pages.
"Foreign Office Action", CN Application No. 201310225788.1, Sep. 1, 2016, 8 pages.
"Non-Final Office Action", U.S. Appl. No. 13/471,336, Aug. 30, 2016, 17 pages.

(56) References Cited

OTHER PUBLICATIONS

"Non-Final Office Action", U.S. Appl. No. 13/471,393, Oct. 5, 2016, 17 pages.
"Non-Final Office Action", U.S. Appl. No. 14/147,252, Oct. 12, 2016, 17 pages.
"Non-Final Office Action", U.S. Appl. No. 14/704,423, Sep. 26, 2016, 11 pages.
"Non-Final Office Action", U.S. Appl. No. 15/050,072, Sep. 23, 2016, 5 pages.
"Supplemental Notice of Allowance", U.S. Appl. No. 14/517,048, Aug. 10, 2016, 2 pages.
"Supplemental Notice of Allowance", U.S. Appl. No. 14/517,048, Aug. 19, 2016, 2 pages.
"Final Office Action", U.S. Appl. No. 13/780,228, Oct. 31, 2016, 18 pages.
"Final Office Action", U.S. Appl. No. 13/926,944, Sep. 23, 2016, 4 pages.
"Foreign Notice of Allowance", CN Application No. 201310067627.4, Oct. 24, 2016, 4 pages.
"Foreign Office Action", CN Application No. 201310067356.2, Oct. 9, 2016, 13 pages.
"Foreign Office Action", CN Application No. 201310067385.9, Oct. 8, 2016, 6 pages.
"Foreign Office Action", CN Application No. 201310067523.3, Nov. 7, 2016, 12 pages.
"Foreign Office Action", CN Application No. 201310067603.9, Oct. 17, 2016, 6 pages.
"Foreign Office Action", CN Application No. 201310096345.7, Oct. 9, 2016, 15 pages.
"Foreign Office Action", CN Application No. 201380025290.9, Oct. 19, 2016, 8 pages.
"Foreign Office Action", CN Application No. 201480006798.9, Sep. 14, 2016, 13 pages.
"Foreign Office Action", EP Application No. 13858283.8, Nov. 2, 2016, 5 pages.
"Foreign Office Action", EP Application No. 13858674.8, Oct. 26, 2016, 5 pages.
"Foreign Office Action", EP Application No. 14745256.9, Oct. 6, 2016, 5 pages.
"Notice of Allowance", U.S. Appl. No. 14/307,262, Nov. 30, 2016, 5 pages.
"Notice of Allowance", U.S. Appl. No. 14/994,737, Nov. 30, 2016, 5 pages.
"Restriction Requirement", U.S. Appl. No. 13/653,218, Oct. 21, 2016, 6 pages.
"Accessing Device Sensors", retrieved from <https://developer.palm.com/content/api/dev-guide/pdk/accessing-device-sensors.html> on May 25, 2012, 2011, 4 pages.
"ACPI Docking for Windows Operating Systems", Retrieved from: <http://www.scritube.com/limba/engleza/software/ACPI-Docking-for-Windows-Opera331824193.php> on Jul. 6, 2012, 2012, 10 pages.
"Advanced Configuration and Power Management Specification", Intel Corporation, Microsoft Corporation, Toshiba Corp. Revision 1, Dec. 22, 1996, 364 pages.
"Advisory Action", U.S. Appl. No. 13/939,032, Feb. 24, 2014, 2 pages.
"Advisory Action", U.S. Appl. No. 14/199,924, May 28, 2014, 2 pages.
"Apple®—45W MagSafe 2 Power Adapter with Magnetic DC Connector—", Retrieved from <http://www.bestbuy.com/site/Apple%26%23174%3B---45W-MagSafe-2-Power-Adapter-with-Magnetic-DC-Connector/5856526.p?id=1218696408860&skuld=5856526#tab=overview> on May 14, 2013, 2013, 4 Pages.
"Basic Cam Motion Curves", Retrieved From: <http://ocw.metu.edu.tr/pluginfile.php/6886/mod_resource/content/1/ch8/8-3.htm> Nov. 22, 2013, Middle East Technical University, 1999, 14 Pages.
"Cholesteric Liquid Crystal", Retrieved from: <http://en.wikipedia.org/wiki/Cholesteric_liquid_crystal> on Aug. 6, 2012, Jun. 10, 2012, 2 pages.
"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, Jan. 2013, 1 page.
"Corrected Notice of Allowance", U.S. Appl. No. 13/470,633, Apr. 9, 2013, 2 pages.
"Corrected Notice of Allowance", U.S. Appl. No. 13/470,633, Jul. 2, 2013, 2 pages.
"Corrected Notice of Allowance", U.S. Appl. No. 13/471,030, Aug. 10, 2015, 2 pages.
"Corrected Notice of Allowance", U.S. Appl. No. 13/471,030, Sep. 30, 2014, 2 pages.
"Corrected Notice of Allowance", U.S. Appl. No. 13/563,435, Jan. 14, 2014, 2 pages.
"Corrected Notice of Allowance", U.S. Appl. No. 13/563,435, Mar. 20, 2014, 2 pages.
"Corrected Notice of Allowance", U.S. Appl. No. 13/563,435, Jan. 22, 2014, 2 pages.
"Corrected Notice of Allowance", U.S. Appl. No. 13/564,520, Aug. 14, 2015, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/651,232, Apr. 24, 2015, 2 pages.
"Corrected Notice of Allowance", U.S. Appl. No. 13/651,232, Jun. 10, 2015, 2 pages.
"Corrected Notice of Allowance", U.S. Appl. No. 13/651,232, Jul. 6, 2015, 2 pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 13/651,327, Sep. 12, 2013, 2 pages.
"Corrected Notice of Allowance", U.S. Appl. No. 13/651,327, Sep. 23, 2013, 2 pages.
"Corrected Notice of Allowance", U.S. Appl. No. 13/651,726, Sep. 17, 2013, 2 pages.
"Corrected Notice of Allowance", U.S. Appl. No. 13/656,055, Apr. 13, 2015, 2 pages.
"Corrected Notice of Allowance", U.S. Appl. No. 13/656,055, Jul. 1, 2015, 2 pages.
"Corrected Notice of Allowance", U.S. Appl. No. 13/656,520, Jan. 16, 2014, 3 pages.
"Corrected Notice of Allowance", U.S. Appl. No. 13/715,133, Apr. 2, 2014, 2 pages.
"Corrected Notice of Allowance", U.S. Appl. No. 13/938,930, May 6, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,002, May 5, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"Corrected Notice of Allowance", U.S. Appl. No. 14/200,595, Jun. 4, 2015, 3 pages.

(56) References Cited

OTHER PUBLICATIONS

"Corrected Notice of Allowance", U.S. Appl. No. 14/225,276, Aug. 27, 2015, 2 pages.
"Corrected Notice of Allowance", U.S. Appl. No. 14/277,240, Jan. 8, 2015, 2 pages.
"Corrected Notice of Allowance", U.S. Appl. No. 14/457,881, Aug. 20, 2015, 2 pages.
"Developing Next-Generation Human Interfaces using Capacitive and Infrared Proximity Sensing", Silicon Laboratories, Inc., Available at <http://www.silabs.com/pages/DownloadDoc.aspx?FILEURL=support%20documents/technicaldocs/capacitive%20and%20proximity%20sensing_wp.pdf&src=SearchResults>, Aug. 30, 2010, pp. 1-10.
"Directional Backlighting for Display Panels", U.S. Appl. No. 13/021,448, filed Feb. 4, 2011, 38 pages.
"DR2PA", retrieved from <http://www.architainment.co.uk/wp-content/uploads/2012/08/DR2PA-AU-US-size-Data-Sheet-Rev-H_LOGO.pdf> on Sep. 17, 2012, Jan. 2012, 4 pages.
"Edwards 1508 Series Surface Wall Mount Electromagnetic Door Holder", Edwards Signaling, retrieved from <http://www.thesignalsource.com/documents/1508.pdf>, 2000, 1 page.
"Final Office Action", U.S. Appl. No. 12/163,614, Nov. 8, 2012, 15 pages.
"Final Office Action", U.S. Appl. No. 12/163,614, Aug. 19, 2011, 15 pages.
"Final Office Action", U.S. Appl. No. 13/021,448, Jan. 16, 2014, 33 Pages.
"Final Office Action", U.S. Appl. No. 13/371,725, Apr. 2, 2014, 22 pages.
"Final Office Action", U.S. Appl. No. 13/468,882, Feb. 12, 2015, 9 pages.
"Final Office Action", U.S. Appl. No. 13/468,949, Oct. 6, 2014, 11 pages.
"Final Office Action", U.S. Appl. No. 13/470,951, Jan. 12, 2015, 20 pages.
"Final Office Action", U.S. Appl. No. 13/471,001, Jul. 25, 2013, 20 pages.
"Final Office Action", U.S. Appl. No. 13/471,054, Oct. 23, 2014, 17 pages.
"Final Office Action", U.S. Appl. No. 13/471,139, Sep. 16, 2013, 13 pages.
"Final Office Action", U.S. Appl. No. 13/471,336, Aug. 28, 2013, 18 pages.
"Final Office Action", U.S. Appl. No. 13/471,336, Oct. 6, 2014, 13 pages.
"Final Office Action", U.S. Appl. No. 13/471,376, Jul. 28, 2015, 35 pages.
"Final Office Action", U.S. Appl. No. 13/471,376, Aug. 18, 2014, 24 pages.
"Final Office Action", U.S. Appl. No. 13/471,412, Dec. 15, 2014, 11 pages.
"Final Office Action", U.S. Appl. No. 13/492,232, Jul. 10, 2015, 11 pages.
"Final Office Action", U.S. Appl. No. 13/492,232, Nov. 17, 2014, 13 pages.
"Final Office Action", U.S. Appl. No. 13/525,070, Apr. 24, 2014, 21 pages.
"Final Office Action", U.S. Appl. No. 13/525,614, Apr. 29, 2015, 20 pages.
"Final Office Action", U.S. Appl. No. 13/527,263, Jan. 27, 2015, 7 pages.
"Final Office Action", U.S. Appl. No. 13/564,520, Jan. 15, 2014, 7 pages.
"Final Office Action", U.S. Appl. No. 13/595,700, Aug. 15, 2014, 6 pages.
"Final Office Action", U.S. Appl. No. 13/595,700, Oct. 9, 2014, 8 pages.
"Final Office Action", U.S. Appl. No. 13/599,635, Jul. 30, 2015, 23 pages.
"Final Office Action", U.S. Appl. No. 13/599,635, Aug. 8, 2014, 16 pages.
"Final Office Action", U.S. Appl. No. 13/603,918, Mar. 21, 2014, 14 pages.
"Final Office Action", U.S. Appl. No. 13/647,479, Dec. 12, 2014, 12 pages.
"Final Office Action", U.S. Appl. No. 13/651,195, Apr. 18, 2013, 13 pages.
"Final Office Action", U.S. Appl. No. 13/651,232, May 21, 2013, 21 pages.
"Final Office Action", U.S. Appl. No. 13/651,287, May 3, 2013, 16 pages.
"Final Office Action", U.S. Appl. No. 13/651,976, Jul. 25, 2013, 21 pages.
"Final Office Action", U.S. Appl. No. 13/653,321, Aug. 2, 2013, 17 pages.
"Final Office Action", U.S. Appl. No. 13/653,682, Jun. 11, 2014, 11 pages.
"Final Office Action", U.S. Appl. No. 13/653,682, Oct. 18, 2013, 16 pages.
"Final Office Action", U.S. Appl. No. 13/655,065, Aug. 8, 2014, 20 pages.
"Final Office Action", U.S. Appl. No. 13/656,055, Sep. 17, 2014, 10 pages.
"Final Office Action", U.S. Appl. No. 13/656,055, Oct. 23, 2013, 14 pages.
"Final Office Action", U.S. Appl. No. 13/773,496, Nov. 4, 2014, 11 pages.
"Final Office Action", U.S. Appl. No. 13/780,228, Apr. 10, 2015, 19 pages.
"Final Office Action", U.S. Appl. No. 13/780,228, Mar. 28, 2014, 13 pages.
"Final Office Action", U.S. Appl. No. 13/852,848, Jul. 20, 2015, 9 pages.
"Final Office Action", U.S. Appl. No. 13/926,944, Aug. 28, 2015, 8 pages.
"Final Office Action", U.S. Appl. No. 13/938,930, Nov. 8, 2013, 10 pages.
"Final Office Action", U.S. Appl. No. 13/939,002, Nov. 8, 2013, 7 pages.
"Final Office Action", U.S. Appl. No. 13/939,032, Dec. 20, 2013, 5 pages.
"Final Office Action", U.S. Appl. No. 14/059,280, Jul. 22, 2015, 25 pages.
"Final Office Action", U.S. Appl. No. 14/063,912, Jan. 12, 2015, 12 pages.
"Final Office Action", U.S. Appl. No. 14/063,912, Apr. 29, 2014, 10 pages.
"Final Office Action", U.S. Appl. No. 14/063,912, Sep. 3, 2015, 13 pages.
"Final Office Action", U.S. Appl. No. 14/147,252, Jun. 25, 2015, 11 pages.
"Final Office Action", U.S. Appl. No. 14/199,924, May 6, 2014, 5 pages.
"Final Office Action", U.S. Appl. No. 14/200,595, Nov. 19, 2014, 5 pages.
"Final Office Action", U.S. Appl. No. 14/225,250, Mar. 13, 2015, 7 pages.
"Final Office Action", U.S. Appl. No. 14/225,276, Dec. 17, 2014, 6 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"First Examination Report", NZ Application No. 628690, Nov. 27, 2014, 2 pages.
"First One Handed Fabric Keyboard with Bluetooth Wireless Technology", Retrieved from: <http://press.xtvworld.com/article3817.html> on May 8, 2012, Jan. 6, 2005, 2 pages.
"For Any Kind of Proceeding 2011 Springtime as Well as Coil Nailers as Well as Hotter Summer Season", Lady Shoe Worlds, retrieved from <http://www.ladyshoesworld.com/2011/09/18/for-

(56) References Cited

OTHER PUBLICATIONS any-kind-of-proceeding-2011-springtime-as-well-as-coil-nailers-as-well-as-hotter-summer-season/> on Nov. 3, 2011, Sep. 8, 2011, 2 pages.
"Force and Position Sensing Resistors: An Emerging Technology", Interlink Electronics, Available at <http://staff.science.uva.nl/~vlaander/docu/FSR/An_Exploring_Technology.pdf>, Feb. 1990, pp. 1-6.
"Foreign Notice of Allowance", CN Application No. 201320096755.7, Jan. 27, 2014, 2 pages.
"Foreign Notice of Allowance", CN Application No. 201320097065.3, Nov. 21, 2013, 2 pages.
"Foreign Notice on Reexamination", CN Application No. 201320097066.8, Apr. 3, 2015, 7 Pages.
"Foreign Office Action", CN Application No. 201110272868.3, Apr. 1, 2013, 10 pages.
"Foreign Office Action", CN Application No. 201310067335.0, Jun. 12, 2015, 15 Pages.
"Foreign Office Action", CN Application No. 201310067385.9, Aug. 6, 2015, 16 pages.
"Foreign Office Action", CN Application No. 201310067808.7, May 28, 2015, 14 Pages.
"Foreign Office Action", CN Application No. 201310225788.1, Jun. 23, 2015, 14 Pages.
"Foreign Office Action", CN Application No. 201320097065.3, Jun. 18, 2013, 2 pages.
"Foreign Office Action", CN Application No. 201320097066.8, Oct. 24, 2013, 5 Pages.
"Foreign Office Action", CN Application No. 201320097079.5, Jul. 28, 2014, 4 pages.
"Foreign Office Action", CN Application No. 201320097079.5, Sep. 26, 2013, 4 pages.
"Foreign Office Action", CN Application No. 201320328022.1, Feb. 17, 2014, 4 Pages.
"Foreign Office Action", CN Application No. 201320328022.1, Oct. 18, 2013, 3 Pages.
"Frogpad Introduces Weareable Fabric Keyboard with Bluetooth Technology", Retrieved from: <http://www.geekzone.co.nz/content.asp?contentid=3898> on May 7, 2012, Jan. 7, 2005, 3 pages.
"How to Use the iPad's Onscreen Keyboard", Retrieved from <http://www.dummies.com/how-to/content/how-to-use-the-ipads-onscreen-keyboard.html> on Aug. 28, 2012, 2012, 3 pages.
"iControlPad 2—The open source controller", Retrieved from <http://www.kickstarter.com/projects/1703567677/icontrolpad-2-the-open-source-controller> on Nov. 20, 2012, 2012, 15 pages.
"i-Interactor electronic pen", Retrieved from: <http://www.alibaba.com/product-gs/331004878/i_Interactor_electronic_pen.html> on Jun. 19, 2012, 2012, 5 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 2012, 4 pages.
"Interlink Electronics FSR (TM) Force Sensing Resistors (TM)", Retrieved at <<http://akizukidenshi.com/download/ds/interlinkelec/94-00004+Rev+B%20FSR%20Integration%20Guide.pdf on Mar. 21, 2013, 36 pages.
"International Preliminary Report on Patentability", Application No. PCT/US2014/031531, Jun. 9, 2015, 7 pages.
"International Preliminary Report on Patentability", Application No. PCT/US2014/043546, 338777.01 IDS (Jul. 7, 2015), Jun. 12, 2015, 7 pages.
"International Search Report and Written Opinion", Application No. PCT/US2013/028479, Jun. 17, 2013, 10 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2014/043546, Oct. 9, 2014, 10 pages.
"International Search Report and Written Opinion", Application No. PCT/US2013/051421, Dec. 6, 2013, 10 pages.
"International Search Report and Written Opinion", Application No. PCT/US2013/065154, Feb. 5, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/043961, Oct. 17, 2013, 11 pages.
"International Search Report and Written Opinion", Application No. PCT/US2013/053683, Nov. 28, 2013, 11 pages.
"International Search Report and Written Opinion", Application No. PCT/US2014/016654, May 16, 2014, 11 pages.
"International Search Report and Written Opinion", Application No. PCT/US2013/028481, Jun. 19, 2014, 11 pages.
"International Search Report and Written Opinion", Application No. PCT/US2013/028948, Jun. 21, 2013, 11 pages.
"International Search Report and Written Opinion", Application No. PCT/US2013/029461, Jun. 21, 2013, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/040968, Sep. 5, 2013, 11 pages.
"International Search Report and Written Opinion", Application No. PCT/US2013/028768, Jun. 24, 2014, 12 pages.
"International Search Report and Written Opinion", Application No. PCT/US2013/044871, Aug. 14, 2013, 12 pages.
"International Search Report and Written Opinion", Application No. PCT/US2014/013928, Oct. 22, 2014, 13 Pages.
"International Search Report and Written Opinion", Application No. PCT/US2013/028482, Jun. 20, 2014, 13 pages.
"International Search Report and Written Opinion", Application No. PCT/US2013/042550, Sep. 24, 2013, 14 pages.
"International Search Report and Written Opinion", Application No. PCT/US2014/013928, May 12, 2014, 17 pages.
"International Search Report and Written Opinion", Application No. PCT/US2013/045283, Mar. 12, 2014, 19 pages.
"International Search Report and Written Opinion", Application No. PCT/US2013/055679, Nov. 18, 2013, 8 pages.
"International Search Report and Written Opinion", Application No. PCT/US2011/050471, Apr. 9, 2012, 8 pages.
"International Search Report and Written Opinion", Application No. PCT/US2013/044873, Nov. 22, 2013, 9 pages.
"International Search Report and Written Opinion", Application No. PCT/US2013/063156, Dec. 5, 2013, 9 pages.
"International Search Report and Written Opinion", Application No. PCT/US2013/067905, Apr. 15, 2014, 9 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"International Search Report and Written Opinion", Application No. PCT/US2013/042790, Aug. 8, 2013, 9 pages.

(56) References Cited

OTHER PUBLICATIONS

"International Search Report and Written Opinion", Application No. PCT/US2013/045049, Sep. 16, 2013, 9 pages.
"International Search Report", Application No. PCT/US2010/045676, Apr. 28, 2011, 2 Pages.
"International Search Report", Application No. PCT/US2010/046129, Mar. 2, 2011, 3 Pages.
"Magnetic Cell Phone Holder", Extreme Computing, retrieved from <http://www.extremecomputing.com/magnetholder.html> on May 7, 2008, 1 page.
"Membrane Keyboards & Membrane Keypads", Retrieved from: <http://www.pannam.com/> on May 9, 2012, Mar. 4, 2009, 2 pages.
"Microsoft Develops Glasses-Free Eye-Tracking 3D Display", Tech-FAQ—retrieved from <http://www.tech-faq.com/microsoft-develops-glasses-free-eye-tracking-3d-display.html> on Nov. 2, 2011, Nov. 2, 2011, 3 pages.
"Microsoft Reveals Futuristic 3D Virtual HoloDesk Patent", Retrieved from <http://www.patentbolt.com/2012/05/microsoft-reveals-futuristic-3d-virtual-holodesk-patent.htmlt> on May 28, 2012, May 23, 2012, 9 pages.
"Microsoft Tablet PC", Retrieved from <http://web.archive.org/web/20120622064335/https://en.wikipedia.org/wiki/Microsoft_Tablet_PC> on Jun. 4, 2014, Jun. 21, 2012, 9 pages.
"Molex:PCI Express Mini Card Connector, Right Angle, Low-Profile, Mid-Mount 0.80mm (.031") Pitch", Retrieved from <http://rhu004.sma-promail.com/SQLImages/kelmscott/Molex/PDF_Images/987650-4441.PDF> on Feb. 6, 2013, 2010, 3 pages.
"Motion Sensors", Android Developers—retrieved from <http://developer.android.com/guide/topics/sensors/sensors_motion.html> on May 25, 2012, 2012, 7 pages.
"MPC Fly Music Production Controller", AKAI Professional, Retrieved from: <http://www.akaipromp.com/mpc-fly> on Jul. 9, 2012, 4 pages.
"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 13/409,967, Dec. 10, 2013, 5 pages.
"Non-Final Office Action", U.S. Appl. No. 13/599,635, Feb. 25, 2014, 13 pages.
"Non-Final Office Action", U.S. Appl. No. 12/163,614, Apr. 27, 2011, 15 pages.
"Non-Final Office Action", U.S. Appl. No. 12/163,614, May 24, 2012, 15 pages.
"Non-Final Office Action", U.S. Appl. No. 12/882,994, Feb. 1, 2013, 17 pages.
"Non-Final Office Action", U.S. Appl. No. 13/021,448, Dec. 13, 2012, 9 pages.
"Non-Final Office Action", U.S. Appl. No. 13/021,448, Aug. 16, 2013, 25 pages.
"Non-Final Office Action", U.S. Appl. No. 13/371,725, Nov. 7, 2013, 19 pages.
"Non-Final Office Action", U.S. Appl. No. 13/408,257, Dec. 5, 2013, 13 pages.
"Non-Final Office Action", U.S. Appl. No. 13/468,882, Jul. 9, 2014, 9 pages.
"Non-Final Office Action", U.S. Appl. No. 13/468,918, Dec. 26, 2013, 18 pages.
"Non-Final Office Action", U.S. Appl. No. 13/468,949, Jun. 20, 2014, 10 pages.
"Non-Final Office Action", U.S. Appl. No. 13/470,951, Jul. 2, 2014, 19 pages.
"Non-Final Office Action", U.S. Appl. No. 13/471,001, Feb. 19, 2013, 15 pages.
"Non-Final Office Action", U.S. Appl. No. 13/471,001, Jun. 17, 2014, 23 pages.
"Non-Final Office Action", U.S. Appl. No. 13/471,030, Jan. 15, 2015, 7 pages.
"Non-Final Office Action", U.S. Appl. No. 13/471,030, May 15, 2014, 10 pages.
"Non-Final Office Action", U.S. Appl. No. 13/471,054, Mar. 13, 2015, 18 pages.
"Non-Final Office Action", U.S. Appl. No. 13/471,054, Jun. 3, 2014, 15 pages.
"Non-Final Office Action", U.S. Appl. No. 13/471,139, Mar. 21, 2013, 12 pages.
"Non-Final Office Action", U.S. Appl. No. 13/471,186, Feb. 27, 2014, 8 pages.
"Non-Final Office Action", U.S. Appl. No. 13/471,202, Feb. 11, 2013, 10 pages.
"Non-Final Office Action", U.S. Appl. No. 13/471,237, Mar. 24, 2014, 7 pages.
"Non-Final Office Action", U.S. Appl. No. 13/471,282, Sep. 3, 2014, 13 pages.
"Non-Final Office Action", U.S. Appl. No. 13/471,336, Jan. 18, 2013, 14 pages.
"Non-Final Office Action", U.S. Appl. No. 13/471,336, May 7, 2014, 17 pages.
"Non-Final Office Action", U.S. Appl. No. 13/471,336, Jun. 24, 2015, 15 pages.
"Non-Final Office Action", U.S. Appl. No. 13/471,376, Mar. 27, 2015, 28 pages.
"Non-Final Office Action", U.S. Appl. No. 13/471,376, Apr. 2, 2014, 17 pages.
"Non-Final Office Action", U.S. Appl. No. 13/471,393, Mar. 26, 2015, 13 pages.
"Non-Final Office Action", U.S. Appl. No. 13/471,393, Oct. 20, 2014, 12 pages.
"Non-Final Office Action", U.S. Appl. No. 13/471,405, Feb. 20, 2014, 37 pages.
"Non-Final Office Action", U.S. Appl. No. 13/471,412, Jun. 1, 2015, 31 pages.
"Non-Final Office Action", U.S. Appl. No. 13/471,412, Jul. 11, 2014, 22 pages.
"Non-Final Office Action", U.S. Appl. No. 13/492,232, Feb. 24, 2015, 12 pages.
"Non-Final Office Action", U.S. Appl. No. 13/492,232, Apr. 30, 2014, 9 pages.
"Non-Final Office Action", U.S. Appl. No. 13/494,651, Feb. 4, 2014, 15 pages.
"Non-Final Office Action", U.S. Appl. No. 13/525,070, Jan. 17, 2014, 19 pages.
"Non-Final Office Action", U.S. Appl. No. 13/525,614, Jul. 31, 2015, 20 pages.
"Non-Final Office Action", U.S. Appl. No. 13/525,614, Nov. 24, 2014, 19 pages.
"Non-Final Office Action", U.S. Appl. No. 13/527,263, Apr. 3, 2014, 6 pages.
"Non-Final Office Action", U.S. Appl. No. 13/527,263, Jul. 19, 2013, 5 pages.
"Non-Final Office Action", U.S. Appl. No. 13/563,435, Jun. 14, 2013, 6 pages.
"Non-Final Office Action", U.S. Appl. No. 13/564,520, Jan. 26, 2015, 6 pages.
"Non-Final Office Action", U.S. Appl. No. 13/564,520, Feb. 14, 2014, 5 pages.
"Non-Final Office Action", U.S. Appl. No. 13/564,520, Jun. 19, 2013, 8 pages.
"Non-Final Office Action", U.S. Appl. No. 13/564,520, Jun. 16, 2014, 5 pages.
"Non-Final Office Action", U.S. Appl. No. 13/565,124, Jun. 17, 2013, 5 pages.
"Non-Final Office Action", U.S. Appl. No. 13/595,700, Jun. 18, 2014, 8 pages.
"Non-Final Office Action", U.S. Appl. No. 13/599,635, Feb. 12, 2015, 16 pages.
"Non-Final Office Action", U.S. Appl. No. 13/599,763, May 28, 2014, 6 pages.
"Non-Final Office Action", U.S. Appl. No. 13/603,918, Sep. 2, 2014, 13 pages.
"Non-Final Office Action", U.S. Appl. No. 13/603,918, Dec. 19, 2013, 12 pages.

(56) References Cited

OTHER PUBLICATIONS

"Non-Final Office Action", U.S. Appl. No. 13/645,405, Jan. 31, 2014, 6 pages.
"Non-Final Office Action", U.S. Appl. No. 13/647,479, Apr. 28, 2015, 11 pages.
"Non-Final Office Action", U.S. Appl. No. 13/647,479, Jul. 3, 2014, 10 pages.
"Non-Final Office Action", U.S. Appl. No. 13/651,195, Jan. 2, 2013, 14 pages.
"Non-Final Office Action", U.S. Appl. No. 13/651,232, Jan. 17, 2013, 15 pages.
"Non-Final Office Action", U.S. Appl. No. 13/651,232, Dec. 5, 2013, 15 pages.
"Non-Final Office Action", U.S. Appl. No. 13/651,272, Feb. 12, 2013, 10 pages.
"Non-Final Office Action", U.S. Appl. No. 13/651,287, Jan. 29, 2013, 13 pages.
"Non-Final Office Action", U.S. Appl. No. 13/651,304, Mar. 22, 2013, 9 pages.
"Non-Final Office Action", U.S. Appl. No. 13/651,327, Mar. 22, 2013, 6 pages.
"Non-Final Office Action", U.S. Appl. No. 13/651,726, Apr. 15, 2013, 6 pages.
"Non-Final Office Action", U.S. Appl. No. 13/651,871, Mar. 18, 2013, 14 pages.
"Non-Final Office Action", U.S. Appl. No. 13/651,871, Jul. 1, 2013, 5 pages.
"Non-Final Office Action", U.S. Appl. No. 13/651,976, Feb. 22, 2013, 16 pages.
"Non-Final Office Action", U.S. Appl. No. 13/651,976, Jun. 16, 2014, 23 pages.
"Non-Final Office Action", U.S. Appl. No. 13/653,184, Dec. 1, 2014, 7 pages.
"Non-Final Office Action", U.S. Appl. No. 13/653,218, Mar. 4, 2015, 16 pages.
"Non-Final Office Action", U.S. Appl. No. 13/653,321, Feb. 1, 2013, 13 pages.
"Non-Final Office Action", U.S. Appl. No. 13/653,682, Feb. 7, 2013, 11 pages.
"Non-Final Office Action", U.S. Appl. No. 13/653,682, Feb. 26, 2014, 10 pages.
"Non-Final Office Action", U.S. Appl. No. 13/653,682, Jun. 3, 2013, 14 pages.
"Non-Final Office Action", U.S. Appl. No. 13/655,065, Apr. 24, 2014, 16 pages.
"Non-Final Office Action", U.S. Appl. No. 13/656,055, Mar. 12, 2014, 17 pages.
"Non-Final Office Action", U.S. Appl. No. 13/656,055, Apr. 23, 2013, 11 pages.
"Non-Final Office Action", U.S. Appl. No. 13/656,520, Feb. 1, 2013, 15 pages.
"Non-Final Office Action", U.S. Appl. No. 13/656,520, Jun. 5, 2013, 8 pages.
"Non-Final Office Action", U.S. Appl. No. 13/715,229, Aug. 19, 2014, 9 pages.
"Non-Final Office Action", U.S. Appl. No. 13/773,496, Jun. 8, 2015, 16 pages.
"Non-Final Office Action", U.S. Appl. No. 13/773,496, Jun. 23, 2014, 10 pages.
"Non-Final Office Action", U.S. Appl. No. 13/780,228, Sep. 15, 2014, 18 pages.
"Non-Final Office Action", U.S. Appl. No. 13/780,228, Oct. 30, 2013, 12 pages.
"Non-Final Office Action", U.S. Appl. No. 13/852,848, Mar. 26, 2015, 7 pages.
"Non-Final Office Action", U.S. Appl. No. 13/926,944, Apr. 23, 2015, 6 pages.
"Non-Final Office Action", U.S. Appl. No. 13/938,930, Aug. 29, 2013, 9 pages.
"Non-Final Office Action", U.S. Appl. No. 13/939,002, Aug. 28, 2013, 6 pages.
"Non-Final Office Action", U.S. Appl. No. 13/939,002, Dec. 20, 2013, 5 pages.
"Non-Final Office Action", U.S. Appl. No. 13/939,032, Aug. 29, 2013, 7 pages.
"Non-Final Office Action", U.S. Appl. No. 13/974,994, Jun. 4, 2014, 24 pages.
"Non-Final Office Action", U.S. Appl. No. 13/975,087, May 8, 2014, 18 pages.
"Non-Final Office Action", U.S. Appl. No. 14/059,280, Mar. 3, 2015, 18 pages.
"Non-Final Office Action", U.S. Appl. No. 14/063,912, Jan. 2, 2014, 10 pages.
"Non-Final Office Action", U.S. Appl. No. 14/063,912, May 7, 2015, 12 pages.
"Non-Final Office Action", U.S. Appl. No. 14/063,912, Sep. 2, 2014, 11 pages.
"Non-Final Office Action", U.S. Appl. No. 14/147,252, Feb. 23, 2015, 11 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Non-Final Office Action", U.S. Appl. No. 14/225,250, Jun. 17, 2014, 5 pages.
"Non-Final Office Action", U.S. Appl. No. 14/225,250, Aug. 19, 2015, 9 pages.
"Non-Final Office Action", U.S. Appl. No. 14/225,276, Apr. 23, 2015, 7 pages.
"Non-Final Office Action", U.S. Appl. No. 14/225,276, Jun. 13, 2014, 6 pages.
"Non-Final Office Action", U.S. Appl. No. 14/225,276, Aug. 19, 2015, 9 pages.
"Non-Final Office Action", U.S. Appl. No. 14/277,240, Jun. 13, 2014, 6 pages.
"Non-Final Office Action", U.S. Appl. No. 14/727,001, Jul. 10, 2015, 7 pages.
"Notice of Allowance", U.S. Appl. No. 13/468,949, Apr. 24, 2015, 9 pages.
"Notice of Allowance", U.S. Appl. No. 12/163,614, Apr. 3, 2013, 9 pages.
"Notice of Allowance", U.S. Appl. No. 12/882,994, Jul. 12, 2013, 9 pages.
"Notice of Allowance", U.S. Appl. No. 13/409,967, Feb. 14, 2014, 4 pages.
"Notice of Allowance", U.S. Appl. No. 13/468,918, Apr. 8, 2015, 7 pages.
"Notice of Allowance", U.S. Appl. No. 13/468,918, Jun. 17, 2014, 5 pages.
"Notice of Allowance", U.S. Appl. No. 13/468,949, Apr. 24, 2015, 8 pages.
"Notice of Allowance", U.S. Appl. No. 13/470,633, Mar. 22, 2013, 7 pages.
"Notice of Allowance", U.S. Appl. No. 13/471,030, Apr. 6, 2015, 6 pages.
"Notice of Allowance", U.S. Appl. No. 13/471,030, Sep. 5, 2014, 6 pages.
"Notice of Allowance", U.S. Appl. No. 13/471,139, Mar. 17, 2014, 4 pages.
"Notice of Allowance", U.S. Appl. No. 13/471,186, Jul. 3, 2014, 7 pages.
"Notice of Allowance", U.S. Appl. No. 13/471,202, May 28, 2013, 7 pages.
"Notice of Allowance", U.S. Appl. No. 13/471,237, May 12, 2014, 8 pages.
"Notice of Allowance", U.S. Appl. No. 13/471,282, Apr. 30, 2015, 8 pages.
"Notice of Allowance", U.S. Appl. No. 13/471,405, Jun. 24, 2014, 9 pages.
"Notice of Allowance", U.S. Appl. No. 13/563,435, Nov. 12, 2013, 5 pages.

(56) References Cited

OTHER PUBLICATIONS

"Notice of Allowance", U.S. Appl. No. 13/564,520, May 8, 2015, 4 pages.
"Notice of Allowance", U.S. Appl. No. 13/565,124, Dec. 24, 2013, 6 pages.
"Notice of Allowance", U.S. Appl. No. 13/595,700, Jan. 21, 2015, 4 pages.
"Notice of Allowance", U.S. Appl. No. 13/651,195, Jul. 8, 2013, 9 pages.
"Notice of Allowance", U.S. Appl. No. 13/651,232, Mar. 30, 2015, 7 pages.
"Notice of Allowance", U.S. Appl. No. 13/651,232, Apr. 25, 2014, 9 pages.
"Notice of Allowance", U.S. Appl. No. 13/651,272, May 2, 2013, 7 pages.
"Notice of Allowance", U.S. Appl. No. 13/651,287, May 2, 2014, 6 pages.
"Notice of Allowance", U.S. Appl. No. 13/651,304, Jul. 1, 2013, 5 pages.
"Notice of Allowance", U.S. Appl. No. 13/651,327, Jun. 11, 2013, 7 pages.
"Notice of Allowance", U.S. Appl. No. 13/651,726, May 31, 2013, 5 pages.
"Notice of Allowance", U.S. Appl. No. 13/651,871, Oct. 2, 2013, 7 pages.
"Notice of Allowance", U.S. Appl. No. 13/651,976, Jan. 21, 2015, 10 pages.
"Notice of Allowance", U.S. Appl. No. 13/653,184, Mar. 10, 2015, 6 pages.
"Notice of Allowance", U.S. Appl. No. 13/653,321, Dec. 18, 2013, 4 pages.
"Notice of Allowance", U.S. Appl. No. 13/653,682, Sep. 24, 2014, 4 pages.
"Notice of Allowance", U.S. Appl. No. 13/656,055, Mar. 4, 2015, 7 pages.
"Notice of Allowance", U.S. Appl. No. 13/656,520, Oct. 2, 2013, 5 pages.
"Notice of Allowance", U.S. Appl. No. 13/715,133, Jan. 6, 2014, 7 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Notice of Allowance", U.S. Appl. No. 13/939,032, Apr. 3, 2014, 4 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
"Notice of Allowance", U.S. Appl. No. 14/225,276, Jun. 22, 2015, 4 pages.
"Notice of Allowance", U.S. Appl. No. 14/277,240, Sep. 16, 2014, 4 pages.
"Notice of Allowance", U.S. Appl. No. 14/457,881, Jul. 22, 2015, 7 pages.
"Notice to Grant", CN Application No. 201320097089.9, Sep. 29, 2013, 2 Pages.
"Notice to Grant", CN Application No. 201320097124.7, Oct. 8, 2013, 2 pages.
"On-Screen Keyboard for Windows 7, Vista, XP with Touchscreen", Retrieved from <www.comfort-software.com/on-screen-keyboard.html> on Aug. 28, 2012, Feb. 2, 2011, 3 pages.
"Optical Sensors in Smart Mobile Devices", on Semiconductor, TND415/D, Available at <http://www.onsemi.jp/pub_link/Collateral/TND415-D.PDF>, Nov. 2010, pp. 1-13.

"Optics for Displays: Waveguide-based Wedge Creates Collimated Display Backlight", OptoIQ, retrieved from <http://www.optoiq.com/index/photonics-technologies-applications/lfw-display/lfw-article-display.articles.laser-focus-world.volume-46.issue-1.world-news.optics-for_displays.html> on Nov. 2, 2010, Jan. 1, 2010, 3 pages.
"PCI Express® SMT Connector | FCI", Retrieved from <http://www.ttiinc.com/object/fp_fci_PCISMT> on Feb. 6, 2013, Feb. 2013, 1 page.
"Position Sensors", Android Developers—retrieved from <http://developer.android.com/guide/topics/sensors/sensors_position.html> on May 25, 2012, 5 pages.
"Real-Time Television Content Platform", retrieved from <http://www.accenture.com/us-en/pages/insight-real-time-television-platform.aspx> on Mar. 10, 2011, May 28, 2002, 3 pages.
"Reflex LCD Writing Tablets", retrieved from <http://www.kentdisplays.com/products/lcdwritingtablets.html> on Jun. 27, 2012, 3 pages.
"Restriction Requirement", U.S. Appl. No. 13/468,918, Nov. 29, 2013, 6 pages.
"Restriction Requirement", U.S. Appl. No. 13/603,918, Nov. 27, 2013, 8 pages.
"Restriction Requirement", U.S. Appl. No. 13/715,133, Oct. 28, 2013, 6 pages.
"Restriction Requirement", U.S. Appl. No. 13/471,139, Jan. 17, 2013, 7 pages.
"Restriction Requirement", U.S. Appl. No. 13/494,722, Dec. 20, 2013, 6 pages.
"Restriction Requirement", U.S. Appl. No. 13/595,700, May 28, 2014, 6 pages.
"Restriction Requirement", U.S. Appl. No. 13/651,304, Jan. 18, 2013, 7 pages.
"Restriction Requirement", U.S. Appl. No. 13/651,726, Feb. 22, 2013, 6 pages.
"Restriction Requirement", U.S. Appl. No. 13/651,871, Feb. 7, 2013, 6 pages.
"Restriction Requirement", U.S. Appl. No. 13/653,184, Sep. 5, 2014, 6 pages.
"Restriction Requirement", U.S. Appl. No. 13/653,218, Nov. 7, 2014, 6 pages.
"Restriction Requirement", U.S. Appl. No. 13/715,133, Dec. 3, 2013, 6 pages.
"Restriction Requirement", U.S. Appl. No. 13/715,229, Aug. 13, 2013, 7 pages.
"Restriction Requirement", U.S. Appl. No. 14/147,252, Dec. 1, 2014, 6 pages.
"RoPD® Connectors", Retrieved from <http://www.rosenberger.de/documents/headquarters_de_en/ba_automotive/AUTO_RoPD_Flyer_2012.pdf> on May 14, 2013, Jun. 2012, 6 pages.
"Smart Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>, 2009, 2 pages.
"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012, 2011, 4 pages.
"Supplemental Notice of Allowance", U.S. Appl. No. 13/468,918, Jun. 4, 2015, 2 pages.
"Supplemental Notice of Allowance", U.S. Appl. No. 13/468,918, Aug. 7, 2015, 4 pages.
"Supplemental Notice of Allowance", U.S. Appl. No. 13/468,949, Jun. 5, 2015, 2 pages.
"Supplemental Notice of Allowance", U.S. Appl. No. 13/471,405, Aug. 29, 2014, 5 pages.
"Supplemental Notice of Allowance", U.S. Appl. No. 13/471,405, Dec. 17, 2014, 5 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.

(56) References Cited

OTHER PUBLICATIONS

"Supplemental Notice of Allowance", U.S. Appl. No. 13/595,700, May 22, 2015, 2 pages.
"Supplemental Notice of Allowance", U.S. Appl. No. 13/653,184, Jun. 24, 2015, 2 pages.
"Supplemental Notice of Allowance", U.S. Appl. No. 13/653,321, Mar. 28, 2014, 4 pages.
"Supplemental Notice of Allowance", U.S. Appl. No. 13/656,055, May 15, 2015, 2 pages.
"Supplemental Notice of Allowance", U.S. Appl. No. 13/656,055, Jun. 10, 2015, 2 pages.
"Supplemental Notice of Allowance", U.S. Appl. No. 14/018,286, Jun. 11, 2014, 5 pages.
"Surface", Retrieved from <http://www.microsoft.com/surface/en-us/support/hardware-and-drivers/type-cover> on Dec. 24, 2013, 6 pages.
"Teach Me Simply", Retrieved From: <http://techmesimply.blogspot.in/2013/05/yugatech_3.html> on Nov. 22, 2013, May 3, 2013, pp. 1-6.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, Jun. 2012, 2 pages.
"Tilt Shift Lenses: Perspective Control", retrieved from http://www.cambridgeincolour.com/tutorials/tilt-shift-lenses1.htm, Mar. 28, 2008, 11 Pages.
"U.S. Application as Filed", U.S. Appl. No. 13/468,882, May 10, 2012, 43 pages.
"U.S. Application as Filed", U.S. Appl. No. 13/471,393, May 14, 2012, 100 pages.
"Virtualization Getting Started Guide", Red Hat Enterprise Linux 6, Edition 0.2—retrieved from <http://docs.redhat.com/docs/en-US/Red_Hat_Enterprise_Linux/6/html-single/Virtualization_Getting_Started_Guide/index.html> on Jun. 13, 2012, 24 pages.
"Welcome to Windows 7", Retrieved from: <http://www.microsoft.com/en-us/download/confirmation.aspx?id=4984> on Aug. 1, 2013, Sep. 16, 2009, 3 pages.
"What is Active Alignment?", http://www.kasalis.com/active_alignment.html, retrieved on Nov. 22, 2012, Nov. 22, 2012, 2 Pages.
"What is the PD-Net Project About?", retrieved from <http://pd-net.org/about/> on Mar. 10, 2011, Mar. 10, 2011, 3 pages.
"Write & Learn Spellboard Advanced", Available at <http://somemanuals.com/VTECH,WRITE%2526LEARN--SPELLBOARD--ADV--71000,JIDFHE.PDF>, 2006, 22 pages.
Bathiche,"Input Device with Interchangeable Surface", U.S. Appl. No. 13/974,749, filed Aug. 23, 2013, 51 pages.
Bert,"Passive Matrix Addressing of Electrophoretic Image Display", Conference on International Display Research Conference, Retrieved from <http://www.cmst.be/publi/eurodisplay2002_s14-1.pdf>, Oct. 1, 2002, 4 pages.
Block,"DeviceOrientation Event Specification", W3C, Editor's Draft, retrieved from <https://developer.palm.com/content/api/dev-guide/pdk/accessing-device-sensors.html> on May 25, 2012, Jul. 12, 2011, 14 pages.
Breath,"ThinkSafe: A Magnetic Power Connector for Thinkpads", Retrieved from <http://www.instructables.com/id/ThinkSafe%3A-A-Magnetic-Power-Connector-for-Thinkpad/> on May 14, 2013, Oct. 26, 2006, 9 pages.
Brown,"Microsoft Shows Off Pressure-Sensitive Keyboard", retrieved from <http://news.cnet.com/8301-17938_105-10304792-1.html> on May 7, 2012, Aug. 6, 2009, 2 pages.
Burge,"Determination of off-axis aberrations of imaging systems using on-axis measurements", SPIE Proceeding, Retrieved from <http://www.loft.optics.arizona.edu/documents/journal_articles/Jim_Burge_Determination_of_off-axis_aberrations_of_imaging_systems_using_on-axis_measurements.pdf>, Sep. 21, 2011, 10 pages.
Butler,"SideSight: Multi-"touch" Interaction around Small Devices", In the proceedings of the 21st annual ACM symposium on User interface software and technology., retrieved from <http://research.microsoft.com/pubs/132534/sidesight_cry3.pdf> on May 29, 2012, Oct. 19, 2008, 4 pages.
Chang,"Optical Design and Analysis of LCD Backlight Units Using ASAP", Optical Engineering, Available at <http://www.opticsvalley.com/resources/kbasePDF/ma_oe_001_optical_design.pdf>, Jun. 2003, 15 pages.
Chavan,"Synthesis, Design and Analysis of a Novel Variable Lift Cam Follower System", In Proceedings: International Journal of Design Engineering, vol. 3, Issue 4, Inderscience Publishers, Jun. 3, 2010, 1 Page.
Crider,"Sony Slate Concept Tablet "Grows" a Kickstand", Retrieved from: <http://androidcommunity.com/sony-slate-concept-tablet-grows-a-kickstand-20120116/> on May 4, 2012, Jan. 16, 2012, 9 pages.
Cunningham,"Software Infrastructure for Natural Language Processing", In Proceedings of the fifth conference on Applied natural language processing, Mar. 31, 1997, pp. 237-244.
Das,"Study of Heat Transfer through Multilayer Clothing Assemblies: A Theoretical Prediction", Retrieved from <http://www.autexrj.com/cms/zalaczone_pliki/5_013_11.pdf>, Jun. 2011, 7 pages.
Dietz,"A Practical Pressure Sensitive Computer Keyboard", In Proceedings of UIST 2009, Oct. 2009, 4 pages.
DiVerdi,"An Immaterial Pseudo-3D Display with 3D Interaction", In the proceedings of Three-Dimensional Television: Capture, Transmission, and Display, Springer, Retrieved from <http://www.cs.ucsb.edu/~holl/pubs/DiVerdi-2007-3DTV.pdf>, Feb. 6, 2007, 26 pages.
Gaver,"A Virtual Window on Media Space", retrieved from <http://www.gold.ac.uk/media/15gaver-smets-overbeeke.MediaSpaceWindow.chi95.pdf> on Jun. 1, 2012, retrieved from <http://www.gold.ac.uk/media/15gaver-smets-overbeeke.MediaSpaceWindow.chi95.pdf> on Jun. 1, 2012, May 7, 1995, 9 pages.
Glatt,"Channel and Key Pressure (Aftertouch).", Retrieved from: <http://home.roadrunner.com/~jgglatt/tutr/touch.htm> on Jun. 11, 2012, 2012, 2 pages.
Grossman,"Multi-Finger Gestural Interaction with 3D Volumetric Displays", In the proceedings of the 17th annual ACM symposium on User interface software and technology, Retrieved from <http://www.dgp.toronto.edu/papers/tgrossman_UIST2004.pdf>, Oct. 24, 2004, pp. 61-70.
Hanlon,"ElekTex Smart Fabric Keyboard Goes Wireless", Retrieved from: <http://www.gizmag.com/go/5048/ > on May 7, 2012, Jan. 15, 2006, 5 pages.
Harada,"VoiceDraw: A Hands-Free Voice-Driven Drawing Application for People With Motor Impairments", In Proceedings of Ninth International ACM SIGACCESS Conference on Computers and Accessibility, retrieved from <http://citeseerx.ist.psu.edu/viewdoc/download?doi=10.1.1.113.7211&rep=rep1&type=pdf> on Jun. 1, 2012, Oct. 15, 2007, 8 pages.
Harrison,"UIST 2009 Student Innovation Contest—Demo Video", Retrieved From: <https://www.youtube.com/watch?v=PDI8eYIASf0> Sep. 16, 2014, Jul. 23, 2009, 1 pages.
Hinckley,"Codex: A Dual Screen Tablet Computer", Conference on Human Factors in Computing Systems, Apr. 9, 2009, 10 pages.
Iwase,"Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> Proceedings: Journal of Microelectromechanical Systems, Dec. 2005, 7 pages.
Izadi,"ThinSight: A Thin Form-Factor Interactive Surface Technology", Communications of the ACM, vol. 52, No. 12, retrieved from <http://research.microsoft.com/pubs/132532/p90-izadi.pdf> on Jan. 5, 2012, Dec. 2009, pp. 90-98.
Jacobs,"2D/3D Switchable Displays", In the proceedings of Sharp Technical Journal (4), Available at <https://cgi.sharp.co.jp/corporate/rd/journal-85/pdf/85-04.pdf>, Apr. 2003, pp. 15-18.
Justin,"Seidio Active with Kickstand for the Galaxy SIII", Retrieved From: <http://www.t3chniq.com/seidio-active-with-kickstand-gs3/> on Nov. 22, 2013, Jan. 3, 2013, 5 Pages.

(56) References Cited

OTHER PUBLICATIONS

Kaufmann,"Hand Posture Recognition Using Real-time Artificial Evolution", EvoApplications'09, retrieved from <http://evelyne.lutton.free.fr/Papers/KaufmannEvolASP2010.pdf> on Jan. 5, 2012, Apr. 3, 2010, 10 pages.
Kaur,"Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012, Jun. 21, 2010, 4 pages.
Khuntontong,"Fabrication of Molded Interconnection Devices by Ultrasonic Hot Embossing on Thin Polymer Films", IEEE Transactions on Electronics Packaging Manufacturing, vol. 32, No. 3, Jul. 2009, pp. 152-156.
Kim,"A Controllable Viewing Angle LCD with an Optically isotropic liquid crystal", Journal of Physics D: Applied Physics, vol. 43, No. 14, Mar. 23, 2010, 7 Pages.
Lahr,"Development of a Novel Cam-based Infinitely Variable Transmission", Proceedings: In Thesis of Master of Science in Mechanical Engineering, Virginia Polytechnic Institute and State University, Nov. 6, 2009, 91 pages.
Lambert,"Cam Design", In Proceedings: Kinematics and dynamics of Machine, University of Waterloo Department of Mechanical Engineering, Jul. 2, 2002, pp. 51-60.
Lane,"Media Processing Input Device", U.S. Appl. No. 13/655,065, filed Oct. 18, 2012, 43 pages.
Lee,"Depth-Fused 3D Imagery on an Immaterial Display", In the proceedings of IEEE Transactions on Visualization and Computer Graphics, vol. 15, No. 1, Retrieved from <http://ieeexplore.ieee.org/stamp/stamp.jsp?arnumber=04540094>, Jan. 2009, 20-33.
Lee,"Flat-Panel Autostereoscopic 3D Display", Optoelectronics, IET, Available at <http://ieeexplore.ieee.org/stamp/stamp.jsp?arnumber=04455550>, Feb. 2008, pp. 24-28.
Lee,"Flat-panel Backlight for View-sequential 3D Display", Optoelectronics, IEE Proceedings—.vol. 151. No. 6 IET, Dec. 2004, 4 pages.
Lee,"LED Light Coupler Design for a Ultra Thin Light Guide", Journal of the Optical Society of Korea, vol. 11, Issue.3, Retrieved from <http://opticslab.kongju.ac.kr/pdf/06.pdf>, Sep. 2007, 5 pages.
Li,"Characteristic Mode Based Tradeoff Analysis of Antenna-Chassis Interactions for Multiple Antenna Terminals", In IEEE Transactions on Antennas and Propagation, Retrieved from <http://ieeexplore.ieee.org/stamp/stamp.jsp?tp=&arnumber=6060882>, Feb. 2012, 13 pages.
Linderholm,"Logitech Shows Cloth Keyboard for PDAs", Retrieved from: <http://www.pcworld.com/article/89084/logitech_shows_cloth_keyboard_for_pdas.html> on May 7, 2012, Mar. 15, 2002, 5 pages.
Liu,"Three-dimensional PC: toward novel forms of human-computer interaction", In the proceedings of Three-Dimensional Video and Display: Devices and Systems vol. CR76, Retrieved from <http://www.google.co.in/url?sa=t&rct=j&q=Three-dimensional+PC:+toward+novel+forms+of+human-computer+interaction&source=web&cd=1&ved=0CFoQFjAA&url=http%3A%2F%2Fciteseerx.ist.psu.edu%2Fviewdoc%2Fdownload%3Fdoi%3D10.1.1.32.9469%26rep%3Drep1%2 6, Nov. 5, 2000, 250-281.
Manresa-Yee,"Experiences Using a Hands-Free Interface", In Proceedings of the 10th International ACM SIGACCESS Conference on Computers and Accessibility, retrieved from <http://dmi.uib.es/~cmanresay/Research%5BMan08%5DAssets08.pdf> on Jun. 1, 2012, Oct. 13, 2008, pp. 261-262.
McLellan,"Eleksen Wireless Fabric Keyboard: a first look", Retrieved from: <http://www.zdnetasia.com/eleksen-wireless-fabric-keyboard-a-first-look-40278954.htm> on May 7, 2012, Jul. 17, 2006, 9 pages.
McLellan,"Microsoft Surface Review", Retrieved from <http://www.zdnet.com/microsoft-surface-review-7000006968/> on May 13, 2013, Nov. 6, 2012, 17 pages.

Miller,"MOGA gaming controller enhances the Android gaming experience", Retrieved from <http://www.zdnet.com/moga-gaming-controller-enhances-the-android-gaming-experience-7000007550/> on Nov. 20, 2012, Nov. 18, 2012, 9 pages.
Morookian,"Ambient-Light-Canceling Camera Using Subtraction of Frames", NASA Tech Briefs, Retrieved from <http://ntrs.nasa.gov/archive/nasa/casi.ntrs.nasa.gov/20110016693_2011017808.pdf>, May 2004, 2 pages.
Nakanishi,"Movable Cameras Enhance Social Telepresence in Media Spaces", In Proceedings of the 27th International Conference on Human Factors in Computing Systems, retrieved from <http://smg.ams.eng.osaka-u.ac.jp/~nakanishi/hnp_2009_chi.pdf> on Jun. 1, 2012, Apr. 6, 2009, 10 pages.
Peli,"Visual and Optometric Issues with Head-Mounted Displays", IS & T/OSA Optics & Imaging in the Information Age, The Society for Imaging Science and Technology, available at <http://www.u.arizona.edu/~zrui3/zhang_pHMPD_spie07.pdf>, 1996, pp. 364-369.
Piltch,"ASUS Eee Pad Slider SL 101 Review", Retrieved from <http://www.laptopmag.com/review/tablets/asus-eee-pad-slider-s1101.aspx>, Sep. 22, 2011, 5 pages.
Post,"E-Broidery: Design and Fabrication of Textile-Based Computing", IBM Systems Journal, vol. 39, Issue 3 & 4, Jul. 2000, pp. 840-860.
Prospero,"Samsung Outs Series 5 Hybrid PC Tablet", Retrieved from: <http://blog.laptopmag.com/samsung-outs-series-5-hybrid-pc-tablet-running-windows-8> on Oct. 31, 2013, Jun. 4, 2012, 7 pages.
Purcher,"Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012, Retrieved from: <http://www.patentlyapple.com/patently-apple/2012/01/apple-is-paving-the-way-for-a-new-3d-gui-for-ios-devices.html> on Jun. 4, 2012, Jan. 12, 2012, 15 pages.
Qin,"pPen: Enabling Authenticated Pen and Touch Interaction on Tabletop Surfaces", In Proceedings of ITS 2010, Available at <http://www.dfki.de/its2010/papers/pdf/po172.pdf>, Nov. 2010, pp. 283-284.
Ramirez,"Applying Solventless Elastomeric Polyurethanes on Concrete in Wastewater Service", In Proceedings: Journal of Protective Coatings and Linings, May 1995, 13 pages.
Reilink,"Endoscopic Camera Control by Head Movements for Thoracic Surgery", In Proceedings of 3rd IEEE RAS & EMBS International Conference of Biomedical Robotics and Biomechatronics, retrieved from <http://doc.utwente.nl/74929/1/biorob_online.pdf> on Jun. 1, 2012, Sep. 26, 2010, pp. 510-515.
Reisman,"A Screen-Space Formulation for 2D and 3D Direct Manipulation", In the proceedings of the 22nd annual ACM symposium on User interface, Retrieved from <http://innovis.cpsc.ucalgary.ca/innovis/uploads/Courses/TableTopDetails2009/Reisman2009.pdf>, Oct. 4, 2009, pp. 69-78.
Sanap,"Design and Analysis of Globoidal Cam Index Drive", Proceedings: In International Journal of Scientific Research Engineering & Technology, Jun. 2013, 6 Pages.
Schafer,"Using Interactive Maps for Navigation and Collaboration", CHI '01 Extended Abstracts on Human Factors in Computing Systems, Mar. 31, 2001, 2 pages.
Schoning,"Building Interactive Multi-Touch Surfaces", Journal of Graphics, GPU, and Game Tools, vol. 14, No. 3, available at <http://www.libavg.com/raw-attachment/wiki/Multitouch/Multitouchguide_draft.pdf>, Nov. 2009, pp. 35-55.
Siddiqui,"Hinge Mechanism for Rotatable Component Attachment", U.S. Appl. No. 13/852,848, filed Mar. 28, 2013, 51 pages.
Staff,"Gametel Android controller turns tablets, phones into portable gaming devices", Retrieved from <http://www.mobiletor.com/2011/11/18/gametel-android-controller-turns-tablets-phones-into-portable-gaming-devices/#> on Nov. 20, 2012, Nov. 18, 2011, 5 pages.
Sumimoto,"Touch & Write: Surface Computing With Touch and Pen Input", Retrieved from: <http://www.gottabemobile.com/2009/08/07/touch-write-surface-computing-with-touch-and-pen-input/> on Jun. 19, 2012, Aug. 7, 2009, 4 pages.

(56) References Cited

OTHER PUBLICATIONS

Sundstedt,"Gazing at Games: Using Eye Tracking to Control Virtual Characters", In ACM SIGGRAPH 2010 Courses, retrieved from <http://www.tobii.com/Global/Analysis/Training/EyeTrackAwards/veronica_sundstedtpdf> on Jun. 1, 2012, Jul. 28, 2010, 85 pages.
Takamatsu,"Flexible Fabric Keyboard with Conductive Polymer-Coated Fibers", In Proceedings of Sensors 2011, Oct. 28, 2011, 4 pages.
Travis,"Collimated Light from a Waveguide for a Display Backlight", Optics Express, 19714, vol. 17, No. 22, retrieved from <http://download.microsoft.com/download/D/2/E/D2E425F8-CF3C-4C71-A4A2-70F9D4081007/OpticsExpressbacklightpaper.pdf> on Oct. 15, 2009, Oct. 15, 2009, 6 pages.
Travis,"Flat Projection for 3-D", In Proceedings of the IEEE, vol. 94 Issue: 3, Available at <http://ieeexplore.ieee.org/stamp/stamp.jsp?tp=&arnumber=1605201>, Mar. 13, 2006, pp. 539-549.
Travis,"P-127: Linearity in Flat Panel Wedge Projection", SID 03 Digest, retrieved from <http://www2.eng.cam.ac.uk/~arlt1/Linearity%20in%20flat%20panel%20wedge%projection.pdf>, May 12, 2005, pp. 716-719.
Travis,"The Design of Backlights for View-Sequential 3D", retrieved from <http://download.microsoft.com/download/D/2/E/D2E425F8-CF3C-4C71-A4A2-70F9D4081007/Backlightforviewsequentialautostereo.docx> on Nov. 1, 2010, 4 pages.
Valli,"Notes on Natural Interaction", retrieved from <http://www.idemployee.id.tue.nl/g.w.m.rauterberg/lecturenotes/valli-2004.pdf> on Jan. 5, 2012, Sep. 2005, 80 pages.
Valliath,"Design of Hologram for Brightness Enhancement in Color LCDs", Retrieved from <http://www.loreti.it/Download/PDF/LCD/44_05.pdf> on Sep. 17, 2012, May 1998, 5 pages.
Vaucelle,"Scopemate, A Robotic Microscope!", Architectradure, retrieved from <http://architectradure.blogspot.com/2011/10/at-uist-this-monday-scopemate-robotic.html> on Jun. 6, 2012, Oct. 17, 2011, 2 pages.
Williams,"A Fourth Generation of LCD Backlight Technology", Retrieved from <http://cds.linear.com/docs/Application%20Note/an65f.pdf>, Nov. 1995, 124 pages.
Xu,"Hand Gesture Recognition and Virtual Game Control Based on 3D Accelerometer and EMG Sensors", IUI'09, Feb. 8-11, 2009, retrieved from <http://sclab.yonsei.ac.kr/courses/10TPR/10TPR.files/Hane/%20Gesture%20Recognition%20and%20Virtual%20Game%20Control%20based%20on%203d%20accelerometer%20and%20EMG%20sensors.pdf> on Jan. 5, 2012, Feb. 8, 2009, 5 pages.
Xu,"Vision-based Detection of Dynamic Gesture", ICTM'09, Dec. 5-6, 2009, retrieved from <http://ieeexplore.ieee.org/stamp/stamp.jsp?tp=&arnumber=5412956> on Jan. 5, 2012, Dec. 5, 2009, pp. 223-226.
Yagi,"The Concept of "AdapTV"", Series: The Challenge of "AdapTV", Broadcast Technology, No. 28, 2006, pp. 16-17.
Yan,"Edge-Lighting Light Guide Plate Based on Micro-Prism for Liquid Crystal Display", Journal of Display Technology, vol. 5, No. 9, Available at <http://ieeexplore.ieee.org/ielx5/9425/5196834/05196835.pdf?tp=&arnumber=5196835&is number=5196834>, Sep. 2009, pp. 355-357.
Yu,"A New Driving Scheme for Reflective Bistable Cholesteric Liquid Crystal Displays", Society for Information Display International Symposium Digest of Technical Papers, Retrieved from <http://www.ee.ust.hk/~eekwok/publications/1997/bcd_sid.pdf >, May 1997, 4 pages.
Zhang,"Design of Head Mounted Displays", Retrieved at <<http://www.optics.arizona.edu/optomech/student%20reports/2007/Design%20of%20mounteddisplays%20Zhang.pdf>>, Dec. 12, 2007, 6 pages.
Zhang,"Model-Based Development of Dynamically Adaptive Software", In Proceedings of ICSE 2006, Available at <http://www.irisa.fr/lande/lande/icse-proceedings/icse/p371.pdf>, May 20, 2006, pp. 371-380.

Zhu,"Keyboard before Head Tracking Depresses User Success in Remote Camera Control", In Proceedings of 12th IFIP TC 13 International Conference on Human-Computer Interaction, Part II, retrieved from <http://csiro.academia.edu/Departments/CSIRO_ICT_Centre/Papers?page=5> on Jun. 1, 2012, Aug. 24, 2009, 14 pages.
"Corrected Notice of Allowance", U.S. Appl. No. 13/371,725, Mar. 29, 2016, 2 pages.
"Corrected Notice of Allowance", U.S. Appl. No. 13/371,725, May 5, 2016, 2 pages.
"Corrected Notice of Allowance", U.S. Appl. No. 13/470,951, Jul. 8, 2016, 2 pages.
"Corrected Notice of Allowance", U.S. Appl. No. 13/891,109, Jun. 21, 2016, 2 pages.
"Final Office Action", U.S. Appl. No. 14/447,109, Jul. 11, 2016, 9 pages.
"Foreign Office Action", CL Application No. 14-211.785, Apr. 26, 2016, 12 pages.
"Foreign Office Action", CN Application No. 201310067622.1, Jun. 21, 2016, 13 Pages.
"Foreign Office Action", EP Application No. 14703759.2, Jun. 16, 2016, 9 pages.
"Non-Final Office Action", U.S. Appl. No. 13/773,496, Jun. 29, 2016, 17 pages.
"Non-Final Office Action", U.S. Appl. No. 13/780,228, Jun. 17, 2016, 18 pages.
"Non-Final Office Action", U.S. Appl. No. 13/926,944, May 2, 2016, 10 pages.
"Non-Final Office Action", U.S. Appl. No. 14/225,250, Jul. 1, 2016, 9 pages.
"Non-Final Office Action", U.S. Appl. No. 14/447,262, Jun. 3, 2016, 13 pages.
"Non-Final Office Action", U.S. Appl. No. 14/543,746, Jun. 1, 2016, 9 pages.
"Notice of Allowance", U.S. Appl. No. 14/517,048, Jul. 7, 2016, 7 pages.
"Corrected Notice of Allowance", U.S. Appl. No. 14/482,983, Mar. 13, 2017, 5 pages.
"Corrected Notice of Allowance", U.S. Appl. No. 14/482,983, Feb. 22, 2017, 6 pages.
"Corrected Notice of Allowance", U.S. Appl. No. 14/944,737, Jan. 18, 2017, 2 pages.
"Corrected Notice of Allowance", U.S. Appl. No. 14/994,737, Mar. 2, 2017, 2 pages.
"Corrected Notice of Allowance", U.S. Appl. No. 14/994,737, Mar. 20, 2017, 2 pages.
"Corrected Notice of Allowance", U.S. Appl. No. 14/994,737, Mar. 30, 2017, 2 pages.
"Examiner's Answer to Appeal Brief", U.S. Appl. No. 13/492,232, Feb. 9, 2017, 5 pages.
"Final Office Action", U.S. Appl. No. 13/773,496, Dec. 27, 2016, 18 pages.
"Final Office Action", U.S. Appl. No. 14/225,250, Dec. 27, 2016, 10 pages.
"Foreign Notice of Allowance", CN Application No. 201310067385.9, Feb. 20, 2017, 4 pages.
"Foreign Notice of Allowance", CN Application No. 201310067429.8, Dec. 13, 2016, 4 pages.
"Foreign Notice of Allowance", CN Application No. 201310096345.7, Feb. 4, 2017, 4 pages.
"Foreign Office Action", CN Application No. 201310067373.6, Dec. 27, 2016, 12 pages.
"Foreign Office Action", CN Application No. 201310067622.1, Nov. 23, 2016, 16 pages.
"Foreign Office Action", CN Application No. 201310067641.4, Jan. 23, 2017, 7 pages.
"Foreign Office Action", CN Application No. 201380025290.9, Mar. 27, 2017, 13 pages.
"Foreign Office Action", CN Application No. 201480036444.9, Nov. 11, 2016, 12 pages.
"Foreign Office Action", EP Application No. 13859661.4, Dec. 23, 2016, 4 pages.

(56) References Cited

OTHER PUBLICATIONS

"Foreign Office Action", EP Application No. 13861292.4, Jan. 3, 2017, 4 pages.
"Foreign Office Action", EP Application No. 14720018.2, Mar. 7, 2017, 7 pages.
"Foreign Office Action", JP Application No. 2014-560073, Jan. 4, 2017, 7 pages.
"Foreign Office Action", JP Application No. 2014-560119, Jan. 4, 2017, 6 pages.
"Foreign Office Action", JP Application No. 2014-560120, Jan. 10, 2017, 5 pages.
"Foreign Office Action", JP Application No. 2014-560121, Dec. 20, 2016, 8 pages.
"Foreign Office Action", JP Application No. 2014-560122, Dec. 6, 2016, 10 pages.
"Foreign Office Action", JP Application No. 2015-512767, Jan. 24, 2017, 8 pages.
"Non-Final Office Action", U.S. Appl. No. 14/162,529, Jan. 12, 2017, 24 pages.
"Non-Final Office Action", U.S. Appl. No. 14/225,250, Mar. 20, 2017, 7 pages.
"Non-Final Office Action", U.S. Appl. No. 14/692,497, Feb. 22, 2017, 8 pages.
"Non-Final Office Action", U.S. Appl. No. 15/083,008, Mar. 24, 2017, 13 pages.
"Non-Final Office Action", U.S. Appl. No. 15/184,566, Mar. 30, 2017, 9 pages.
"Notice of Allowance", U.S. Appl. No. 13/653,218, Mar. 10, 2017, 13 pages.
"Notice of Allowance", U.S. Appl. No. 14/147,252, Apr. 14, 2017, 7 pages.
"Notice of Allowance", U.S. Appl. No. 14/482,983, Jan. 4, 2017, 10 pages.
"Supplemental Notice of Allowance", U.S. Appl. No. 13/653,218, Apr. 7, 2017, 3 pages.
"Corrected Notice of Allowance", U.S. Appl. No. 13/780,228, dated Apr. 17, 2017, 3 pages.
"Corrected Notice of Allowance", U.S. Appl. No. 14/994,737, dated May 10, 2017, 2 pages.
"Final Office Action", U.S. Appl. No. 13/471,336, dated Jun. 8, 2017, 8 pages.
"Foreign Notice of Allowance", JP Application No. 2014-560119, dated Apr. 18, 2017, 4 pages.
"Foreign Office Action", CN Application No. 201310067356.2, dated Mar. 20, 2017, 9 pages.
"Foreign Office Action", CN Application No. 201310067603.9, dated Apr. 19, 2017, 12 pages.
"Foreign Office Action", CN Application No. 201480006798.9, dated Apr. 13, 2017, 12 pages.
"Foreign Office Action", EP Application No. 13730686.6, dated Mar. 27, 2017, 6 pages.
"Foreign Office Action", TW Application No. 103103802, dated May 11, 2017, 9 pages.
"Non-Final Office Action", U.S. Appl. No. 15/050,072, dated May 12, 2017, 9 pages.
"Non-Final Office Action", U.S. Appl. No. 15/425,799, dated Jun. 2, 2017, 12 pages.
"Notice of Allowance", U.S. Appl. No. 13/780,228, dated Mar. 13, 2017, 7 pages.
"Supplemental Notice of Allowance", U.S. Appl. No. 13/653,218, dated May 16, 2017, 2 pages.
"Supplemental Notice of Allowance", U.S. Appl. No. 14/147,252, dated May 3, 2017, 2 pages.
"Supplemental Notice of Allowance", U.S. Appl. No. 14/147,252, dated May 15, 2017, 2 pages.
"Final Office Action", U.S. Appl. No. 13/471,393, dated Jul. 12, 2017, 20 pages.
"Final Office Action", U.S. Appl. No. 14/162,529, dated Jun. 26, 2017, 28 pages.
"Foreign Office Action", CN Application No. 201310067523.3, dated May 17, 2017, 8 pages.
"Foreign Office Action", CN Application No. 201380025290.9, dated Jul. 18, 2017, 9 pages.
"Foreign Office Action", CN Application No. 201480006798.9, dated Jul. 14, 2017, 6 pages.
"Foreign Office Action", CN Application No. 201480036444.9, dated May 4, 2017, 8 pages.
"Foreign Office Action", EP Application No. 13858403.2, dated Aug. 1, 2017, 5 pages.
"Foreign Office Action", JP Application No. 2014-560072, dated Jun. 27, 2017, 4 pages.
"Foreign Office Action", JP Application No. 2014-560073, dated Jul. 25, 2017, 12 pages.
"Foreign Office Action", JP Application No. 2014-560120, dated Jun. 13, 2017, 5 pages.
"Notice of Allowance", U.S. Appl. No. 14/794,182, dated Jul. 13, 2017, 7 pages.
"Supplemental Notice of Allowance", U.S. Appl. No. 13/653,218, dated Jun. 19, 2017, 2 pages.
"Supplemental Notice of Allowance", U.S. Appl. No. 14/147,252, dated Jun. 21, 2017, 2 pages.

* cited by examiner

HINGE FOR COMPONENT ATTACHMENT

RELATED APPLICATIONS

This application is a continuation of U.S. patent application Ser. No. 13/471,030, filed May 14, 2012 which claims priority under 35 U.S.C. §119(e) to the following U.S. Provisional Patent Applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on.

Because mobile computing devices are configured to be mobile, however, the devices are typically designed to be used in a handheld manner. Typical ways of adapting mobile devices for other uses (e.g., on a table or other surface) tend to be awkward and detract from the mobile aesthetic associated with mobile devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A hinge for component attachment is described. In at least some implementations, a kickstand is rotatably attached to a mobile computing device. The kickstand can be rotated to various positions to provide support for different orientations of the computing device. For example, the kickstand can be positioned to support the computing device in a typing orientation such that input can be provided via an associated input device. As another example, the kickstand can be positioned to enable viewing and/or interaction with the computing device, such as in a portrait viewing orientation.

In at least some implementations, hinges are employed to attach a kickstand to a mobile computing device. One example hinge utilizes preset hinge stops that enable the kickstand to be placed at different preset positions. Further, the example hinge includes a center of rotation that coincides with a seam between abutting edges of the kickstand and the computing device. Thus, the kickstand can conform to a contour of the computing device when in a closed position, and the seam can be maintained when the kickstand is open. Another example hinge exerts pressure on an edge of the kickstand, providing stability and vibration dampening to the kickstand. While example hinges are presented in detail herein, a variety of different techniques can be employed for attaching a kickstand to a computing device in accordance with the claimed embodiments.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

A variety of different devices may be physically attached to a mobile computing device to provide a variety of functionality. For example, a device may be configured to provide a cover for at least a display device of the computing device to protect it against harm. Other devices may also be physically attached to the mobile computing device, such as an input device (e.g., keyboard having a track pad) to provide inputs to the computing device. Further, functionality of these devices may be combined, such as to provide a combination cover and input device.

A hinge for component attachment is described. In at least some implementations, a kickstand is rotatably attached to a mobile computing device. The kickstand can be rotated to various positions to provide support for different orientations of the computing device. For example, the kickstand can be positioned to support the computing device in a typing orientation such that input can be provided via an associated input device. As another example, the kickstand can be positioned to enable viewing and/or interaction with the computing device, such as in a portrait viewing orientation.

In at least some implementations, hinges are employed to attach a kickstand to a mobile computing device. One example hinge utilizes preset hinge stops that enable the kickstand to be placed at different preset positions. Further, the example hinge includes a center of rotation that coincides with a seam between abutting edges of the kickstand and the computing device. Thus, the kickstand can conform to a contour of the computing device when in a closed position, and the seam can be maintained when the kickstand is open. Another example hinge exerts pressure on an edge of the kickstand, providing stability and vibration dampening to the kickstand. While example hinges are presented in detail herein, a variety of different techniques can be employed for attaching a kickstand to a computing device in accordance with the claimed embodiments.

In the following discussion, an example environment is first described that may employ the techniques described herein. Embodiments discussed herein are not limited to the example environment, and the example environment is not limited to embodiments discussed herein. Next, example device orientations are discussed in accordance with one or more embodiments. Following this, an example kickstand is described in accordance with one or more embodiments. Next, example hinges for kickstand attachment are discussed in accordance with one or more embodiments. Finally, an example system and device are discussed that may implement various techniques described herein. Further, although an input device is described herein, other devices are also contemplated that do not include input functionality, such as covers.

Example Environment

Figure 1:
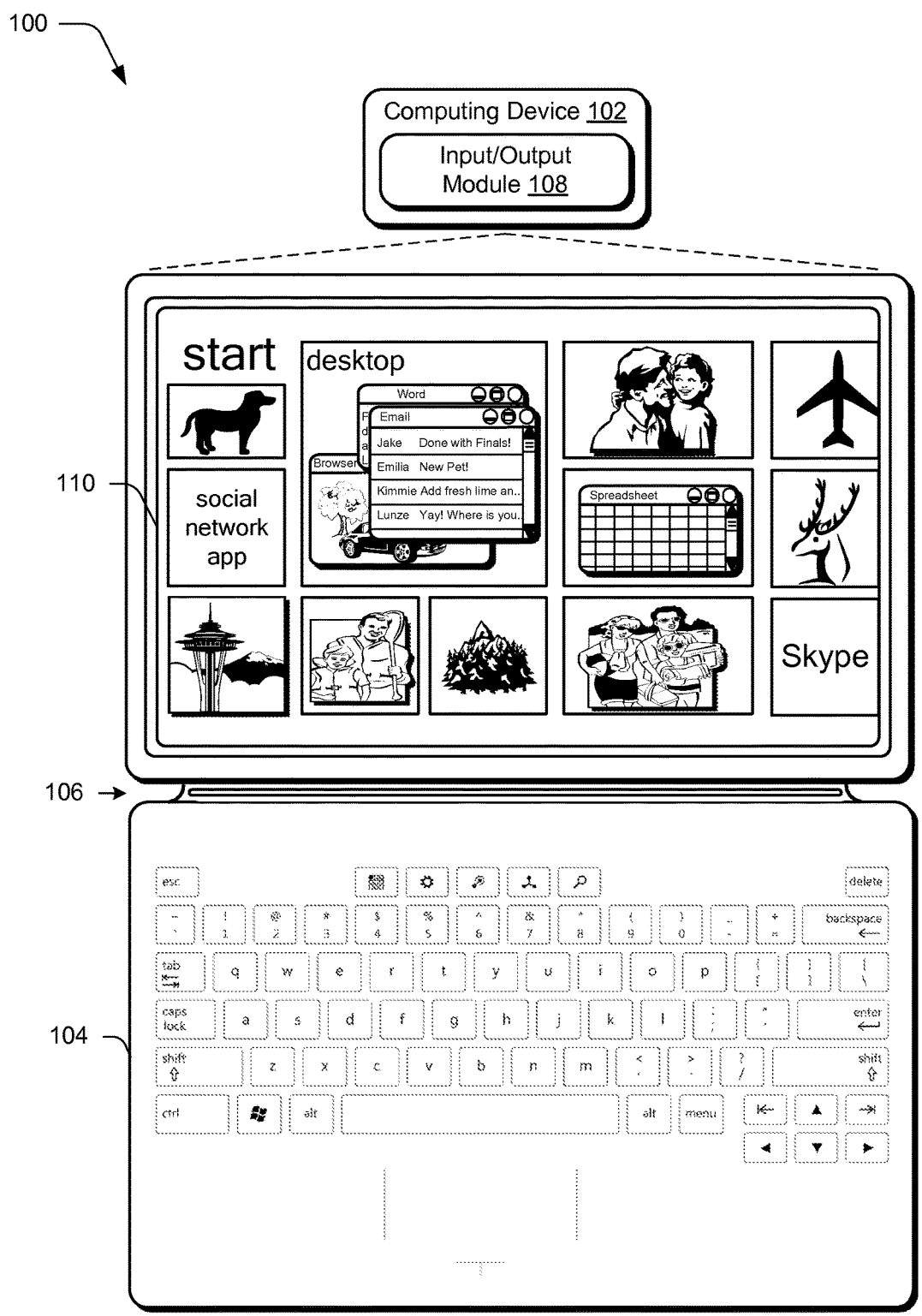
FIG. 1 is an illustration of an environment in an example implementation that is operable to employ the techniques described herein in accordance with one or more embodiments.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one or more directions (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
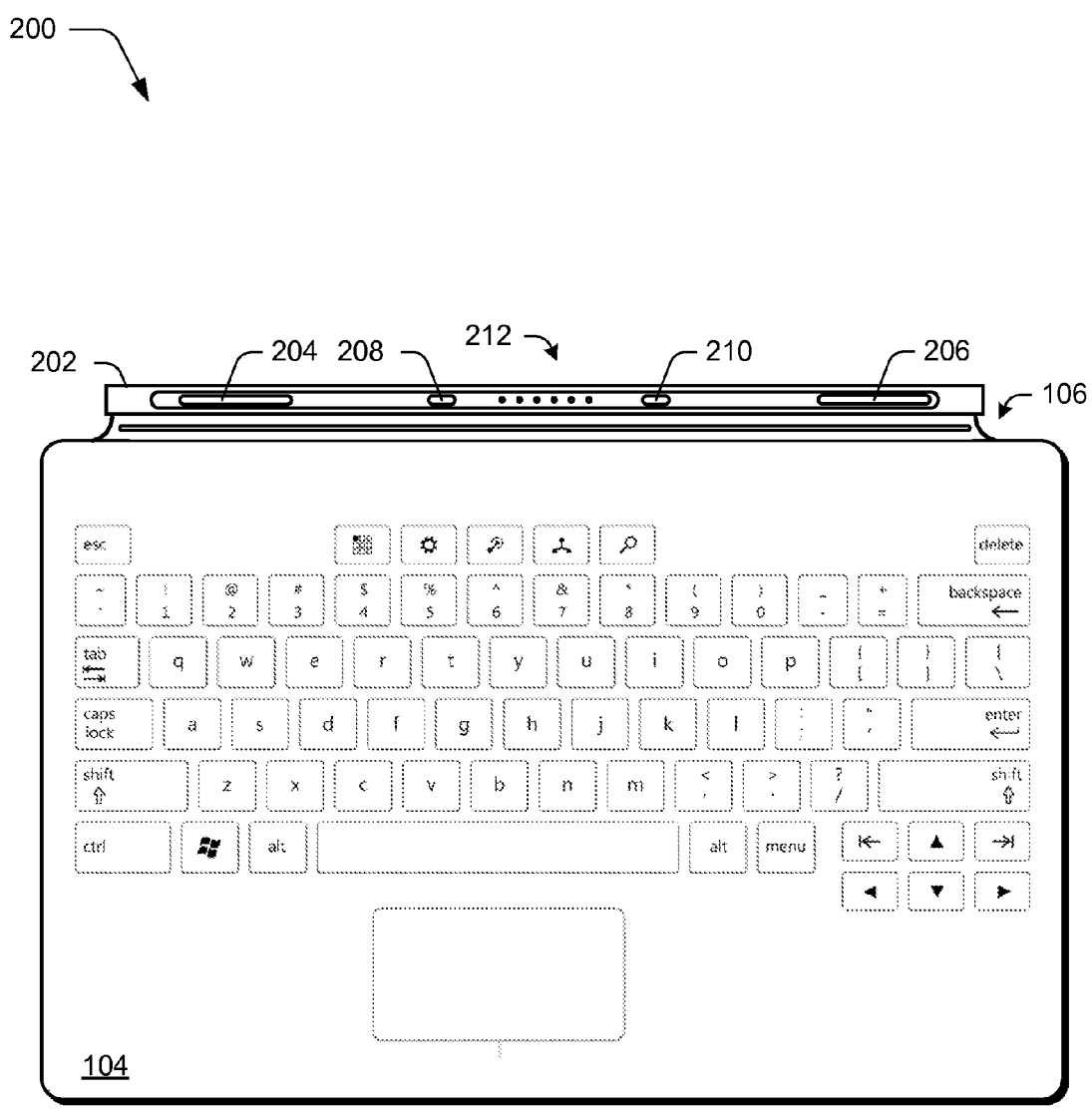
FIG. 2 depicts an example implementation of an input device of FIG. 1 as showing a flexible hinge in greater detail in accordance with one or more embodiments.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. The connection portion 202 as illustrated has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

The connection portion 202 is illustrated in this example as including magnetic coupling devices 204, 206, mechanical coupling protrusions 208, 210, and communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connection portion 202 also includes mechanical coupling protrusions 208, 210 to form a mechanical physical connection between the input device 104 and the computing device 102. The communication contacts 212 are configured to contact corresponding communication contacts of the computing device 102 to form a communicative coupling between the devices as shown.

Example Device Orientations

Figure 3:
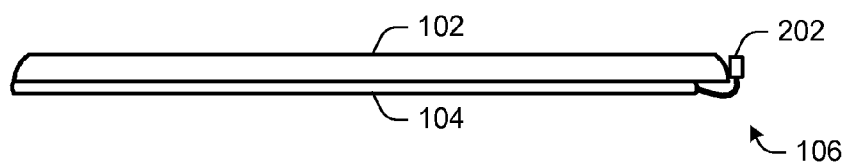
FIG. 3 depicts an example orientation of the input device in relation to the computing device as covering a display device of the computing device in accordance with one or more embodiments.

Through rotational movement of the flexible hinge 106, a variety of different orientations of the input device 104 in relation to the computing device 102 may be supported. For example, rotational movement may be supported by the flexible hinge 106 such that the input device 104 may be placed against the display device 110 of the computing device 102 and thereby act as a cover as shown in the example orientation 300 of FIG. 3. Thus, the input device 104 may act to protect the display device 110 of the computing device 102 from harm.

Figure 4:
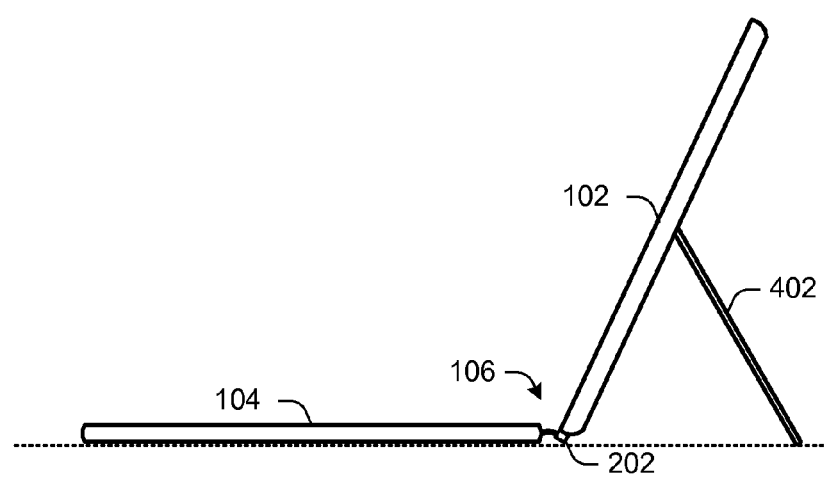
FIG. 4 depicts an example orientation of the input device in relation to the computing device as assuming a typing orientation in accordance with one or more embodiments.

As shown in the example orientation 400 of FIG. 4, a typing arrangement may be supported. In this orientation, the input device 104 is laid flat against a surface and the computing device 102 is disposed at an angle to permit viewing of the display device 110, e.g., such as through use of a kickstand 402 disposed on a rear surface of the computing device 102.

Figure 5:
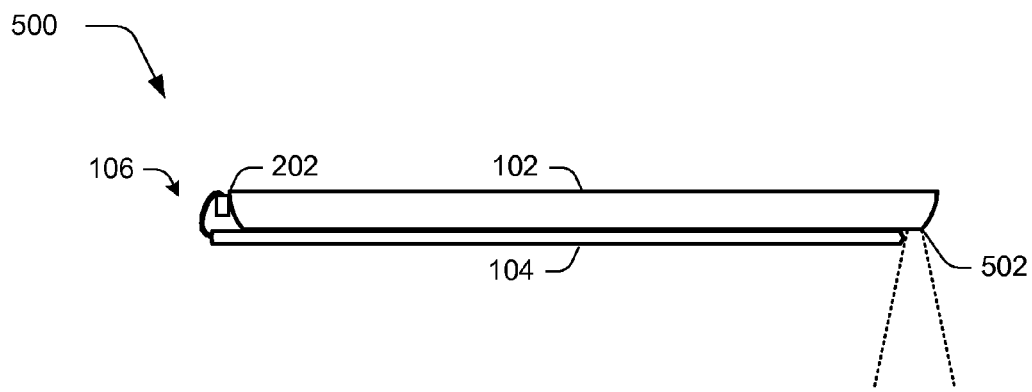
FIG. 5 depicts an example orientation of the input device in relation to the computing device as covering a rear housing of the computing device 102 and exposing a display device of the computing device in accordance with one or more embodiments.

In the example orientation 500 of FIG. 5, the input device 104 may also be rotated so as to be disposed against a back of the computing device 102, e.g., against a rear housing of the computing device 102 that is disposed opposite the display device 110 on the computing device 102. In this example, through orientation of the connection portion 202 to the computing device 102, the flexible hinge 106 is caused to "wrap around" the connection portion 202 to position the input device 104 at the rear of the computing device 102.

This wrapping causes a portion of a rear of the computing device 102 to remain exposed. This may be leveraged for a variety of functionality, such as to permit a camera 502 positioned on the rear of the computing device 102 to be used even though a significant portion of the rear of the computing device 102 is covered by the input device 104 in this example orientation 500. Although configuration of the input device 104 to cover a single side of the computing device 102 at any one time was described above, other configurations are also contemplated.

Figure 6:
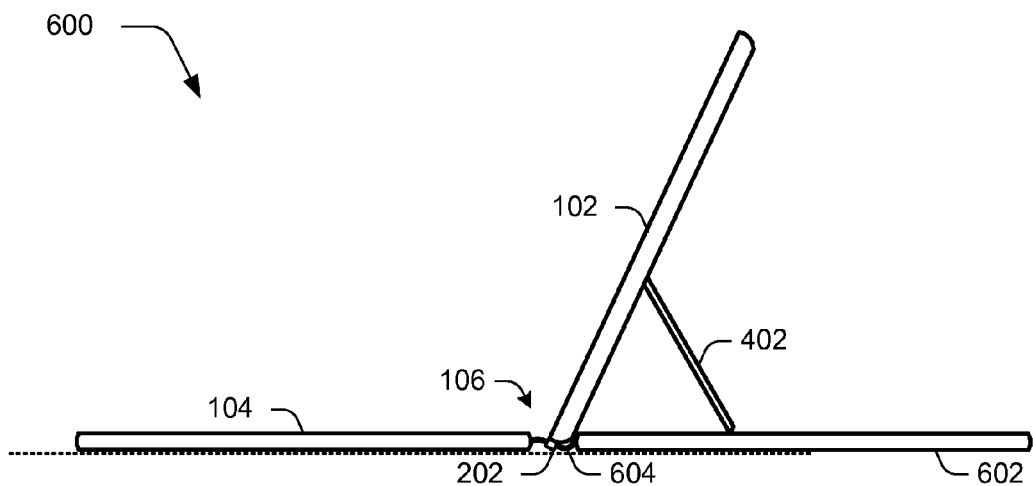
FIG. 6 depicts an example orientation of the input device as including a portion configured to cover a rear of the computing device, which in this instance is used to support a kickstand of the computing device in accordance with one or more embodiments.

In the example orientation 600 of FIG. 6, the input device 104 is illustrated as including a portion 602 configured to cover a rear of the computing device. This portion 602 is also connected to the connection portion 202 using a flexible hinge 604.

The example orientation 600 of FIG. 6 also illustrates a typing arrangement in which the input device 104 is laid flat against a surface and the computing device 102 is disposed at an angle to permit viewing of the display device 110. This is supported through use of the kickstand 402 disposed on a rear surface of the computing device 102 to contact the portion 602 in this example.

Figure 7:
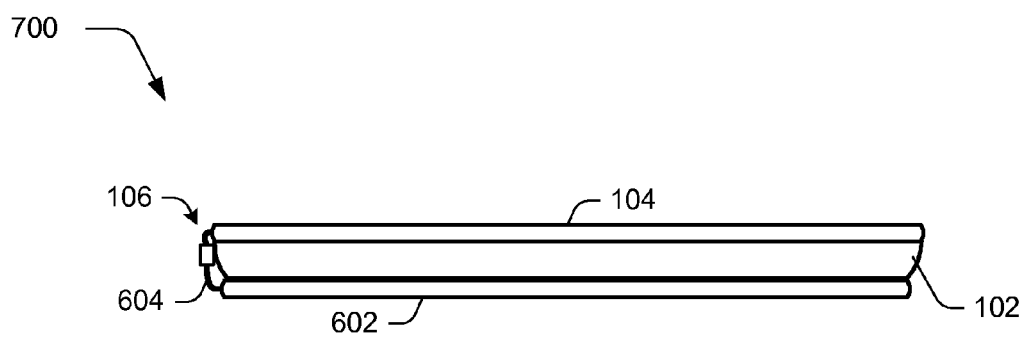
FIG. 7 depicts an example orientation in which the input device including the portion of FIG. 6 are used to cover both the front and back of the computing device in accordance with one or more embodiments.

FIG. 7 depicts an example orientation 700 in which the input device 104 including the portion 602 are used to cover both the front (e.g., display device 110) and back (e.g., opposing side of the housing from the display device) of the computing device 102. In one or more implementations, electrical and other connectors may also be disposed along the sides of the computing device 102 and/or the input device 104, e.g., to provide auxiliary power when closed.

Naturally, a variety of other orientations are also supported. For instance, the computing device 102 and input device 104 may assume an arrangement such that both are laid flat against a surface as shown in FIG. 1. Other instances are also contemplated, such as a tripod arrangement, meeting arrangement, presentation arrangement, and so forth.

Kickstand

The described kickstand can be employed to enable a variety of different orientations for the computing device 102. For instance, consider the following implementations of a kickstand in accordance with various embodiments.

Figure 8:
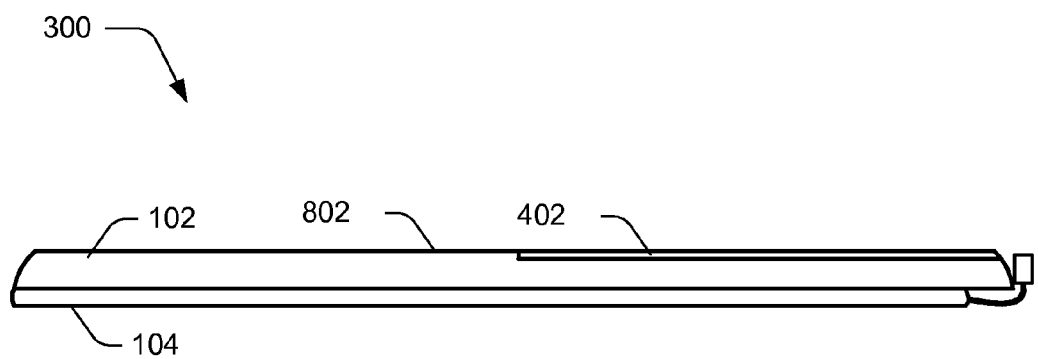
FIG. 8 depicts an example orientation of a computing device with a kickstand in accordance with one or more embodiments.

FIG. 8 illustrates the orientation 300, and includes the kickstand 402 in a closed position. In the closed position, the kickstand 402 forms a portion of a rear surface 802 of the computing device 102 such that the kickstand 402 conforms to a surface contour of the computing device 102. For instance, when the kickstand 402 is in the closed position, the kickstand 402 integrates into the computing device 102 and does not protrude from a plane formed by the rear surface 802.

Figure 9:
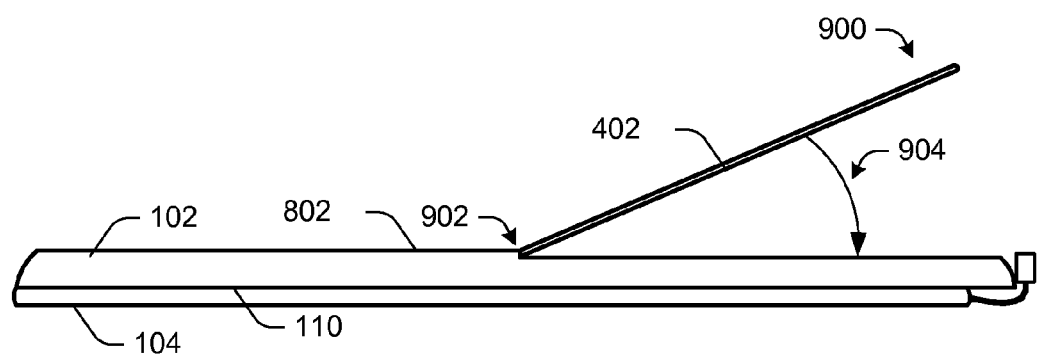
FIG. 9 depicts an example orientation of a computing device with a kickstand in accordance with one or more embodiments.

FIG. 9 illustrates that the kickstand 402 can be rotated away from the rear surface 802 of the computing device 102 to a position 900. For instance, the kickstand 402 can be rotatably attached to the computing device 102 along a seam 902 via a hinge assembly. Examples of such a hinge assembly are detailed below.

In at least some implementations, the position 900 corresponds to a preset position for the hinge 402. For instance, when a user applies pressure to the kickstand 402 away from the rear surface 802, the kickstand 402 can snap into the position 900. As detailed below, a hinge assembly employed to attach the kickstand 402 to the computing device 102 can utilize spring pressure and detent settings to provide preset open positions for the kickstand 402. In this example, the position 900 is associated with an angle 904 between the rear surface of the computing device 102, and the kickstand 402. For instance, the angle 904 can range from 20 degrees (20°) to 30 degrees (30°). Any suitable range of angles may be employed, however.

With the kickstand 402 in the position 900, the computing device 102 can be rotated away from the input device 104 and supported by the kickstand 402, such as illustrated in the orientation 400 of FIG. 4. Thus, the position 900 can enable the display device 110 to be viewed, and input to be provided to the computing device 102 via the input device 104.

Figure 10:
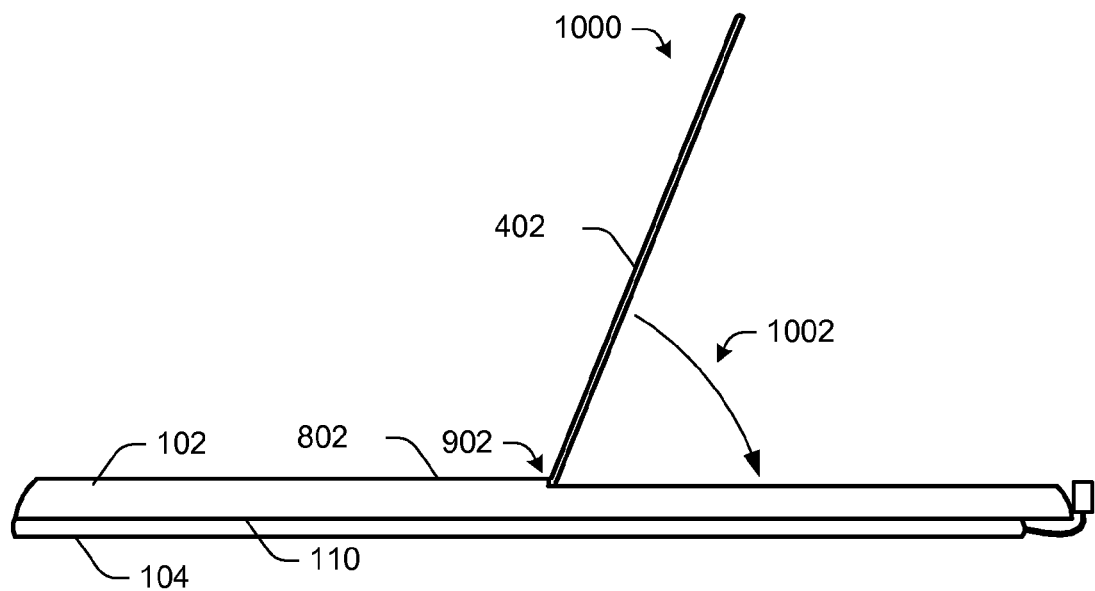
FIG. 10 depicts an example orientation of a computing device with a kickstand in accordance with one or more embodiments.

FIG. 10 illustrates that the kickstand 402 can be rotated away from the rear surface 802 of the computing device 102 to a position 1000. For instance, the kickstand 402 can be rotated further past the position 900 to the position 1000.

In at least some implementations, the position 1000 corresponds to a preset position for the hinge 402. For example, when a user applies pressure to the kickstand 402 away from the rear surface 802, the kickstand 402 can snap into the position 1000. In this example, the position 1000 is associated with an angle 1002 between the rear surface of the computing device 102, and the kickstand 402. For instance, the angle 1002 can range from 65 degrees (65°) to 75 degrees (75°). Any suitable range of angles may be employed, however. Further, the seam 902 can be maintained (e.g., the width of the seam) during rotation to the position 1000.

With the kickstand 402 in the position 1000, the computing device 102 can be rotated sideways (e.g., to a portrait viewing position) and supported via the kickstand 402. For instance, consider an orientation 1100 illustrated in FIG. 11.

Figure 11:
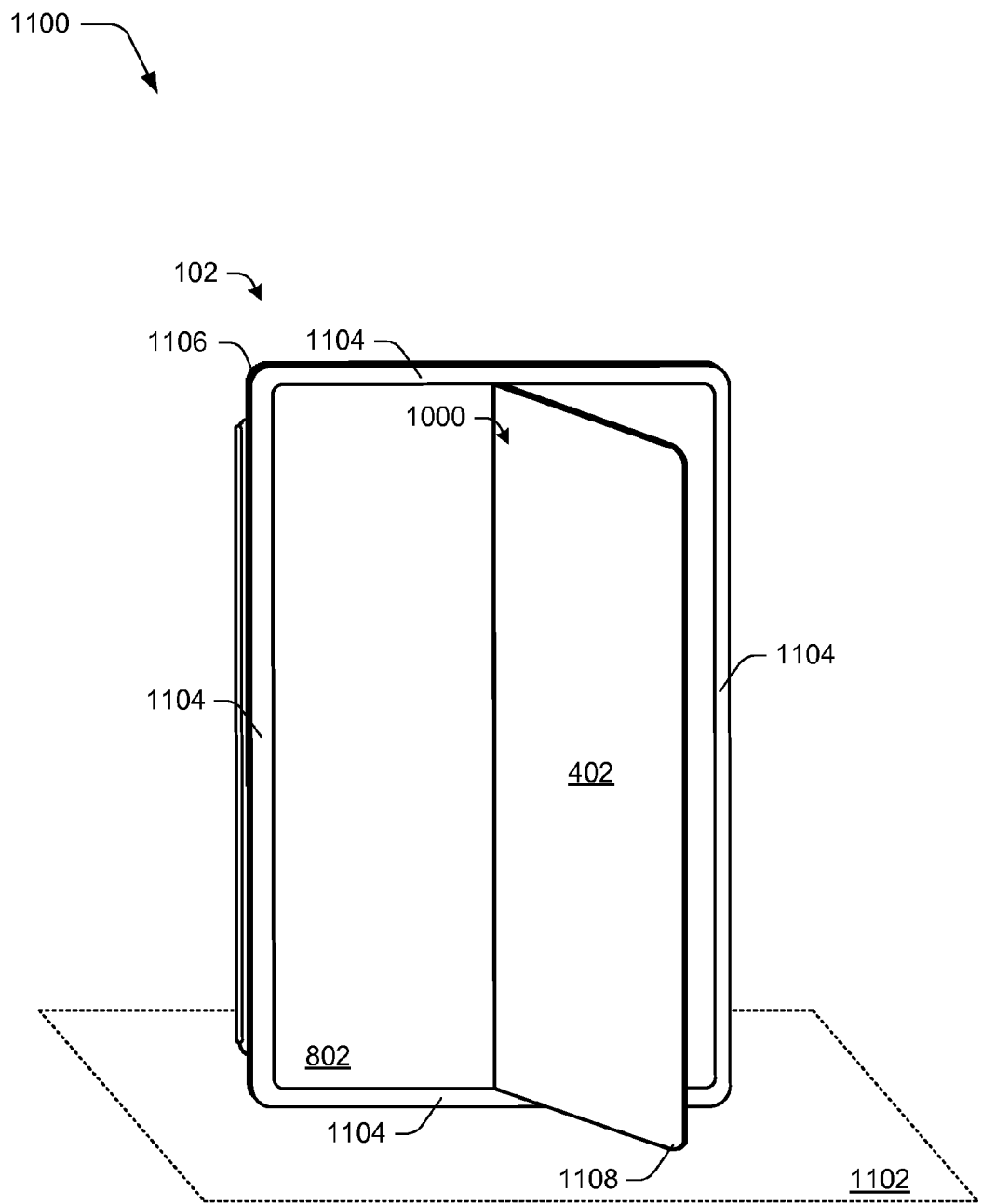
FIG. 11 depicts a rear view of an example orientation of a computing device with a kickstand in accordance with one or more embodiments.

FIG. 11 illustrates a rear view of the computing device 102 in the orientation 1100, showing that the computing device 102 is rotated to a portrait viewing position, such as 90 degrees (90°) to the orientation illustrated in FIG. 1. Further, the kickstand 402 is positioned in the position 1000 such that the computing device 102 reclines back and is supported by the kickstand 402 on a surface 1102. Although not illustrated here, placing the computing device 102 in the orientation 1100 can cause a view orientation of the display device 110 to be rotated to a portrait view.

In FIG. 11, the computing device 102 is illustrated without the input device 104. Thus, in at least some embodiments the input device 104 can be separated from the computing device 102 such that the computing device 102 has functionality independent of the input device 104. For example, the flexible hinge 106 can employ a magnetic attachment mechanism that holds the input device 104 to the computing device 102 via magnetic force. Thus, a user can grasp the computing device 102 and the input device 104, and can pull the two apart by overcoming the magnetic attraction between them.

When separate from the input device 104, the computing device 102 can provide various functionality. For example, a user can view content via the computing device 102, such as movies and/or streaming content. Further, a user can interact with touch screen functionality of the display device 110. Thus, placing the kickstand 402 in the position 1000 can enable a user to place the computing device in a portrait orientation, and to view and/or interact with the computing device in such an orientation.

As further illustrated in FIG. 11, the computing device 102 includes a beveled edge 1104 between the rear surface 802 and a front surface 1106. The beveled edge 1104 is angled such that the width of the rear surface 802 is narrower than the width of a front surface 1106. The kickstand 402 is integrated into the rear surface 802, and has substantially the same width as the rear surface 802. Thus, the kickstand 402 has a narrower width than the front surface 1106.

Accordingly, when the computing device is positioned in the orientation 1100, and the kickstand is placed in the position 1000, the computing device 102 leans back away from the front surface 1106 and rests on a corner 1108 of the kickstand 402. The corner 1108 can employ some form of cushioning material to reduce sliding of the corner 1108 on the surface 1102, and to reduce the transmission of vibrations between the surface 1102 and the computing device 102.

Figure 12:
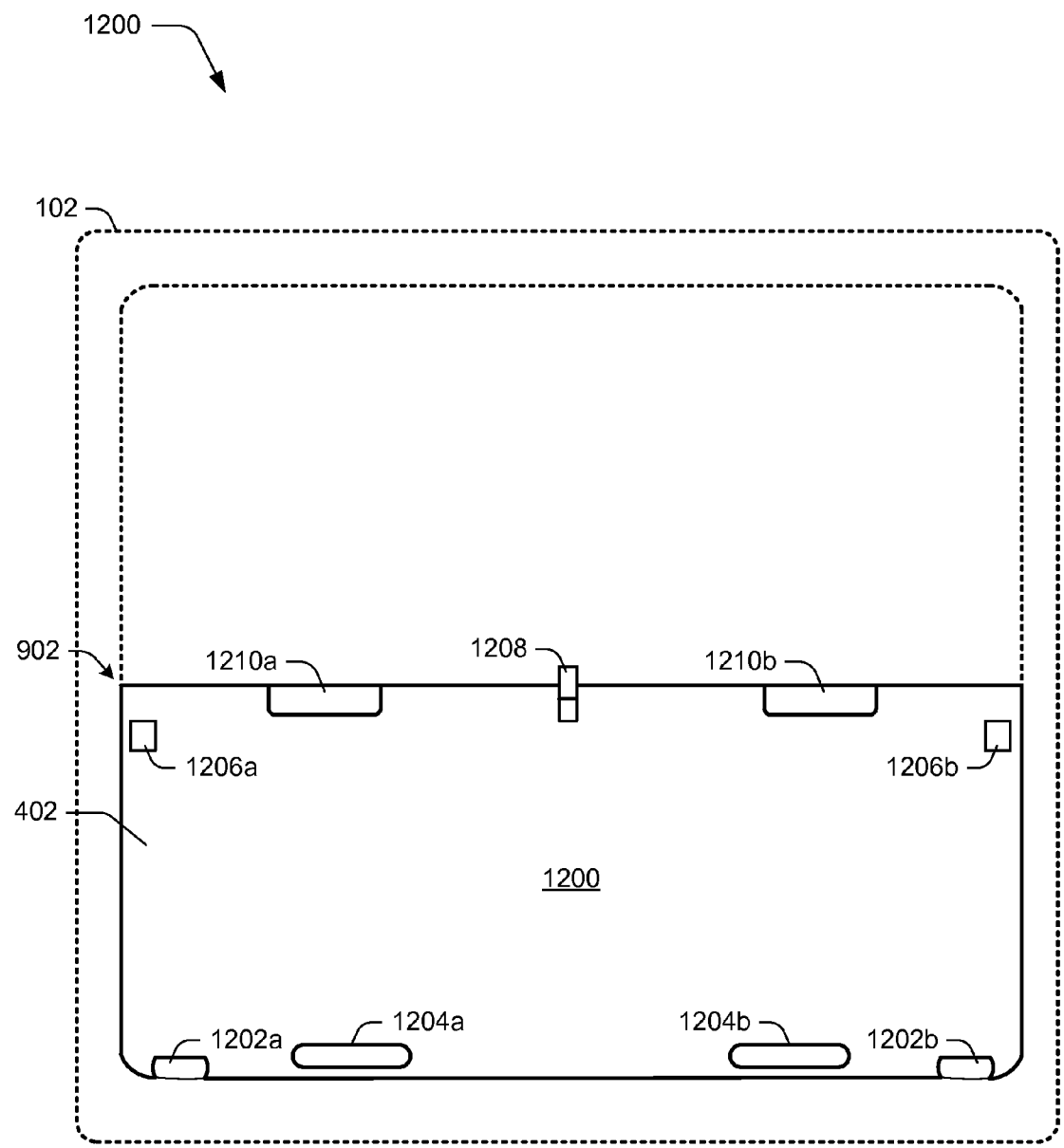
FIG. 12 depicts an example inner surface of a kickstand in accordance with one or more embodiments.

FIG. 12 illustrates a view of an inner surface 1200 of the kickstand 402 in accordance with one or more embodiments. In this example, the kickstand 402 is illustrated in the context of an outline of the computing device 102.

The inner surface 1200 includes surface contacts 1202a and 1202b, which function as surface contact points when the kickstand 402 is in an open position. The surface contacts 1202a, 1202b can be formed using a variety of types of skid-resistant materials, and can be positioned within a notch in the inner surface 1200. For example, the surface contacts 1202a, 1202b can be formed from an elastic material and can be substantially dovetail shaped such that the surface contacts can be held within a notch in the rear surface 1200 via elastic pressure. Additionally or alternatively, the surface contacts 1202a, 1022b can be affixed to the inner surface 1200 via a suitable adhesive.

The surface contacts 1202a, 1202b are positioned on a bottom edge of the kickstand 402 such that when the kickstand 402 is open and resting on a surface, the surface contacts 1202a, 1202b serve as insulators between the kickstand 402 and the surface. For example, the surface contacts 1202a, 1202b can reduce the transmission of vibrations between the kickstand 402 and an adjacent surface. Further, the surface contacts 1202a, 1202b can reduce slippage of the kickstand 402 on a surface. For instance, the surface contacts 1202a, 1202b can be formed from a rubberized material that resists slippage on a variety of different surfaces. Thus, when the computing device 102 is supported by the kickstand 402 (e.g., in the orientation 400 discussed above), the surface contacts 1202a, 1202b can assist in stabilizing the computing device 102 and reduce noise that can be caused by vibration of the kickstand 402 on a surface.

Further included on the inner surface 1200 are a stabilizer plate 1204a and a stabilizer plate 1204b, which are placed along a lower edge of the inner surface 1200 and formed from a material (e.g., ferromagnetic) that is attracted to a magnetic field. When the kickstand 402 is in a closed position, the stabilizer plates 1204a, 1204b are attracted to magnets placed along an adjacent edge of the computing device 102. Thus, in the closed position the magnetic force exerted by the magnets on the stabilizer plates 1204a, 1204b can assist in holding the lower edge of the kickstand 402 against the computing device 102.

The inner surface 1200 further includes peripheral hinge mounts 1206a, 1206b, which function as mounting points for peripheral hinges that are employed to attach the kickstand 402 to the computing device 102. Examples of peripheral hinges are discussed below. A center hinge key 1208 is also included, which functions as slidable attachment to a center hinge employed between the kickstand 402 and the computing device 102. An example of a center hinge is discussed below.

A damper 1210a and a damper 1210b are fastened (e.g., using a suitable adhesive) to the inner surface 1200, and function to suppress vibration of the kickstand 402. For example, the dampers 1210a, 1210b can be formed from a material that absorbs and/or dissipates vibrations of the kickstand 402. Examples of such materials include urethane foam, rubber, neoprene, silicone, and so on. Thus, the dampers 1210a, 1210b can reduce noise caused by vibration of the kickstand 402, such as when the kickstand 402 is being opened and closed.

Hinges for Kickstand Attachment

A variety of different hinge assemblies can be employed to attach a kickstand to a computing device in accordance with various embodiments. Discussed below are some example hinges and hinge arrangements.

Figure 13:
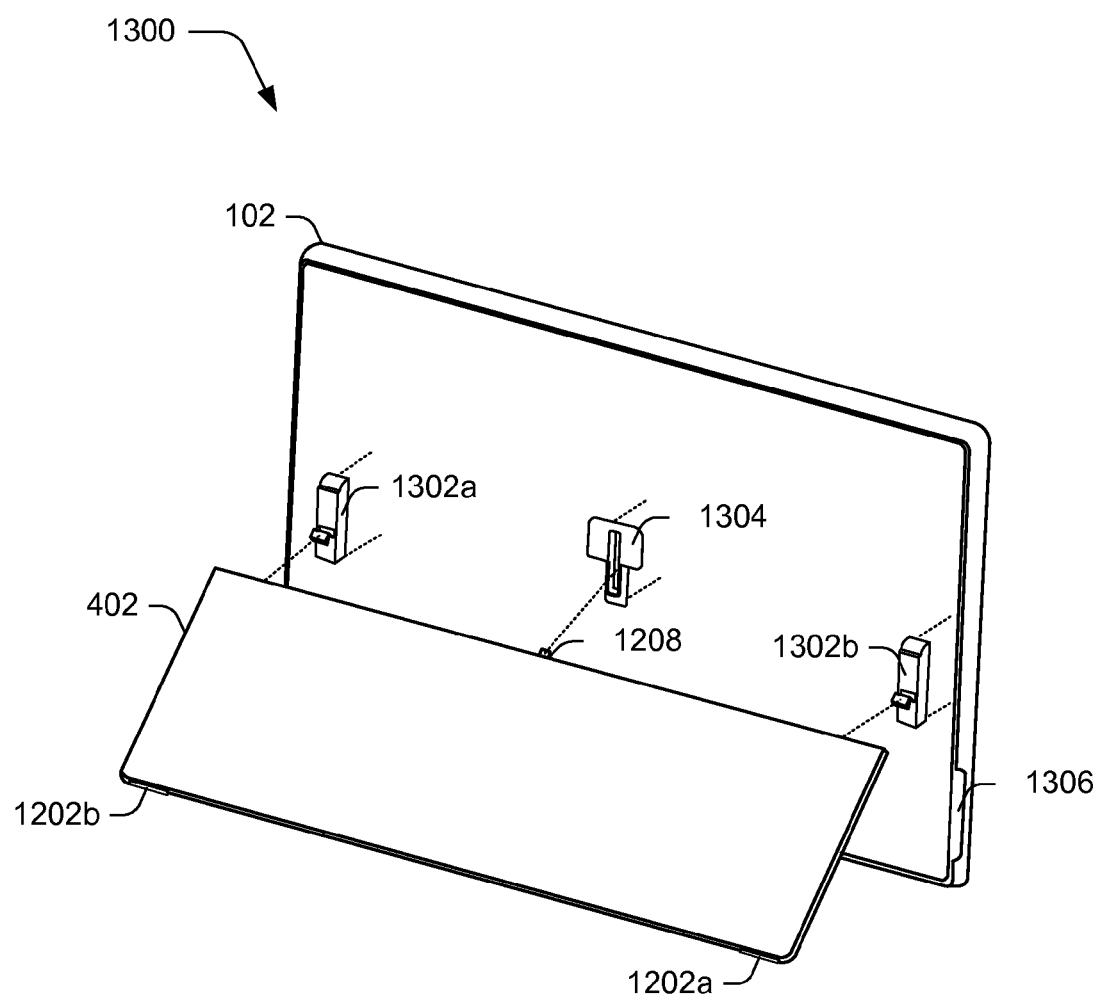
FIG. 13 depicts an example exploded view of a computing device with a kickstand in accordance with one or more embodiments.

FIG. 13 illustrates an exploded rear view 1300 of the computing device 102 and the kickstand 402. Included in the rear view 1300 are peripheral hinges 1302a and 1302b, which can be employed to attach the kickstand 402 to the computing device 102. The peripheral hinges 1302a, 1302b are configured to be installed internally in the computing device 102, such as via a suitable attachment method and/or device.

The kickstand 402 can be attached to a pivoting portion of the peripheral hinges 1302a, 1302b via the peripheral hinge mounts 1206a, 1206b, discussed above with reference to FIG. 12. Thus, attachment to the peripheral hinges 1302a, 1302b enables the kickstand 402 to pivot between various positions with reference to the computing device 102.

Further illustrated is a center hinge 1304, which is also configured to be installed internally in the computing device 102, such as via a suitable attachment method and/or device. The center hinge key 1208 of the kickstand 402 can be engaged in the center hinge 1304. As detailed below, the center hinge 1304 can assist in stabilizing movement of the kickstand 402 between various positions.

The peripheral hinges 1302a, 1302b and the center hinge 1304 are installed in the computing device 102 such that when the kickstand 402 is rotated on the hinges to a closed position, the hinges are not visible and the kickstand 402 forms a smooth contour with the chassis of the computing device 102. For example, see the closed position illustrated and discussed with reference to FIG. 8.

Also illustrated in the rear view 1300 are the surface contacts 1202a, 1202b. As discussed above, the surface contacts 1202a, 1202b can stabilize the kickstand 402 and the computing device 102 when the kickstand 402 is in an open position and resting on a surface. In at least some embodiments, the surface contacts 1202a, 1202b are positioned in a groove in an inner surface of the kickstand 402 such that the surface contacts 1202a, 1202b are not externally visible when the kickstand 402 is in a closed position.

To assist a user in opening the kickstand 402 from a closed position, a notch 1306 is formed in an edge of the computing device 102. For instance, the notch 1306 can enable a user to insert a small portion of a finger behind the closed kickstand 402, and apply pressure to rotate the kickstand 402 to an open position. Additionally or alternatively, a notch can be formed in an edge of the kickstand 402 to assist in opening the kickstand 402.

Figure 14:
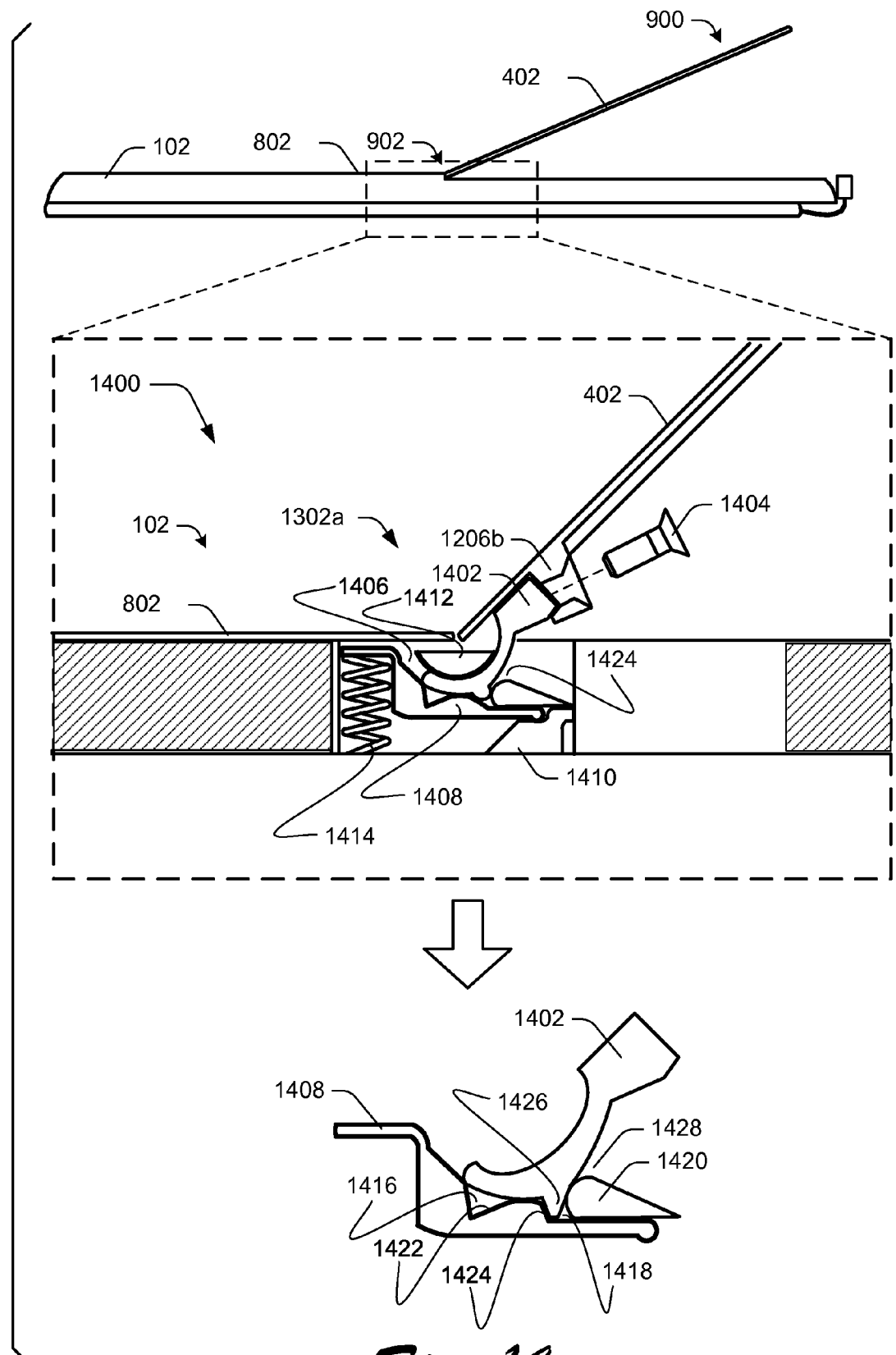
FIG. 14 depicts a partial cross-sectional view of a computing device in accordance with one or more embodiments.

FIG. 14 illustrates a partial cross-sectional view of the computing device 102, generally at 1400. In the view 1400, the kickstand 402 is in an open position, such as the position 900 illustrated with reference to FIG. 9. The view 1400 includes a cross section of the peripheral hinge 1302a. In at least some implementations, the peripheral hinge 1302b is identical to the peripheral hinge 1302a in terms of configuration, dimensions, and/or operation. Thus, the example aspects of the peripheral hinge 1302a discussed below may equally apply to the peripheral hinge 1302b.

Included as part of the peripheral hinge 1302a is a pivot 1402, to which the kickstand 402 is attached via the peripheral hinge mount 1206b. As illustrated, the peripheral hinge mount 1206b can be attached to the pivot 1402 using a screw 1404. However, a wide variety of attachment techniques may be employed in accordance with the claimed embodiments.

For instance, in at least some embodiments magnetic force may be employed to hold the peripheral hinge mount 1206b to the pivot 1402. The peripheral hinge mount 1206b and the pivot 1402, for example, can include magnetic material, e.g., magnets, ferromagnetic materials, and so forth. Thus, in such embodiments, when the peripheral hinge mount 1206b is aligned with the pivot 1402, magnetic force can removably bind the peripheral hinge mount 1206b to the pivot 1402. Magnets can thus be employed in some embodiments to attach the kickstand 402 to hinge assemblies (e.g., the peripheral hinges and the center hinge) such that kickstand 402 can be detached from the computing device 102. This can enable the computing device 102 to be customized in various ways, such as by replacing the kickstand 402 with a different kickstand of a different color, different graphics, different materials, and so forth.

The pivot 1402 is moveable via sliding within a channel 1406 such that the kickstand 402 can be rotated to various positions. Forming a lower portion of the channel 1406 is a hinge sled 1408, which is pivotably positioned on a sled pivot 1410. The hinge sled 1408 exerts upward pressure on the pivot 1402 against an upper portion 1412 of the channel 1406 to hold the pivot 1402 in place. Pressure from the hinge sled 1408 is provided via a spring 1414, which exerts upward pressure on a lip of the hinge sled 1408.

To assist in understanding, the pivot 1402 and the hinge sled 1408 are also illustrated in the lower portion of FIG. 14, separate from other portions of the peripheral hinge 1302a. The hinge sled 1408 is formed such that a notch 1416 is included on the surface of the hinge sled 1408. Also, a notch 1418 is formed via positioning of a damper 1420 on the hinge sled 1408. The damper 1420 is formed from a material that displays elastic properties, such as rubber, synthetic rubber, silicone, soft plastic, and so forth. Between the notches 1416, 1418 are a contact portion 1422 and a contact portion 1424 on the surface of the hinge sled 1408, which correspond to portions of the hinge sled 1408 on which the pivot 1404 can slide when transitioning between different positions for the kickstand 402.

In at least some implementations, the notches 1416, 1418 correspond to preset positions for the pivot 1402. For instance, when the pivot 1402 slides within the channel 1406, a protrusion 1424 on the pivot 1402 can catch in the notches 1416, 1418 to cause the pivot 1402, and thus the kickstand 402, to rest in specific positions. The notches 1416, 1418, for example, can correspond to preset positions for the kickstand 402.

In operation, the kickstand 402 can be manipulated from an open position to a closed position such that the pivot 1402 slides in the channel 1406 and the protrusion 1426 slides over the contact portion 1424 until the protrusion 1426 catches in the notch 1416. Thus, the notch 1416 can correspond to a closed position for the kickstand 402. A user can open the kickstand 402 from a closed position such that the pivot 1402 slides in the channel 1406 and the protrusion 1426 slides over the contact portion 1422 until the protrusion 1426 catches in the notch 1418. The notch 1418 can correspond to an open position, such as illustrated with reference to the position 900 of FIG. 9.

In this example, notice that the contact portion 1422 has a shallower contact angle with the protrusion 1426 than does the contact portion 1424. Thus, resistance from the hinge sled 1408 against the protrusion 1426 when transitioning from a closed position to an open position (e.g., from the notch 1416 to the notch 1418) can be less than when transitioning from an open position to a closed position, e.g., from the notch 1418 to the notch 1416. In at least some embodiments, this can enable a user to use less force when opening the kickstand 402, than when closing the kickstand 402. This can be particularly useful in preventing the kickstand 402 from inadvertently being closed when in an open position, such as when supporting the computing device 102 on a surface.

The kickstand 402 can also be manipulated such that the pivot 1402 slides in the channel 1406 until the protrusion 1422 reaches a position 1428. The position 1428 can correspond to another open position, such as the position 1000 discussed with reference to FIG. 10.

Thus, various instrumentalities of the peripheral hinges can provide a detent mechanism that enables the kickstand 402 to be rotated to stop at various preset positions.

Figure 15:
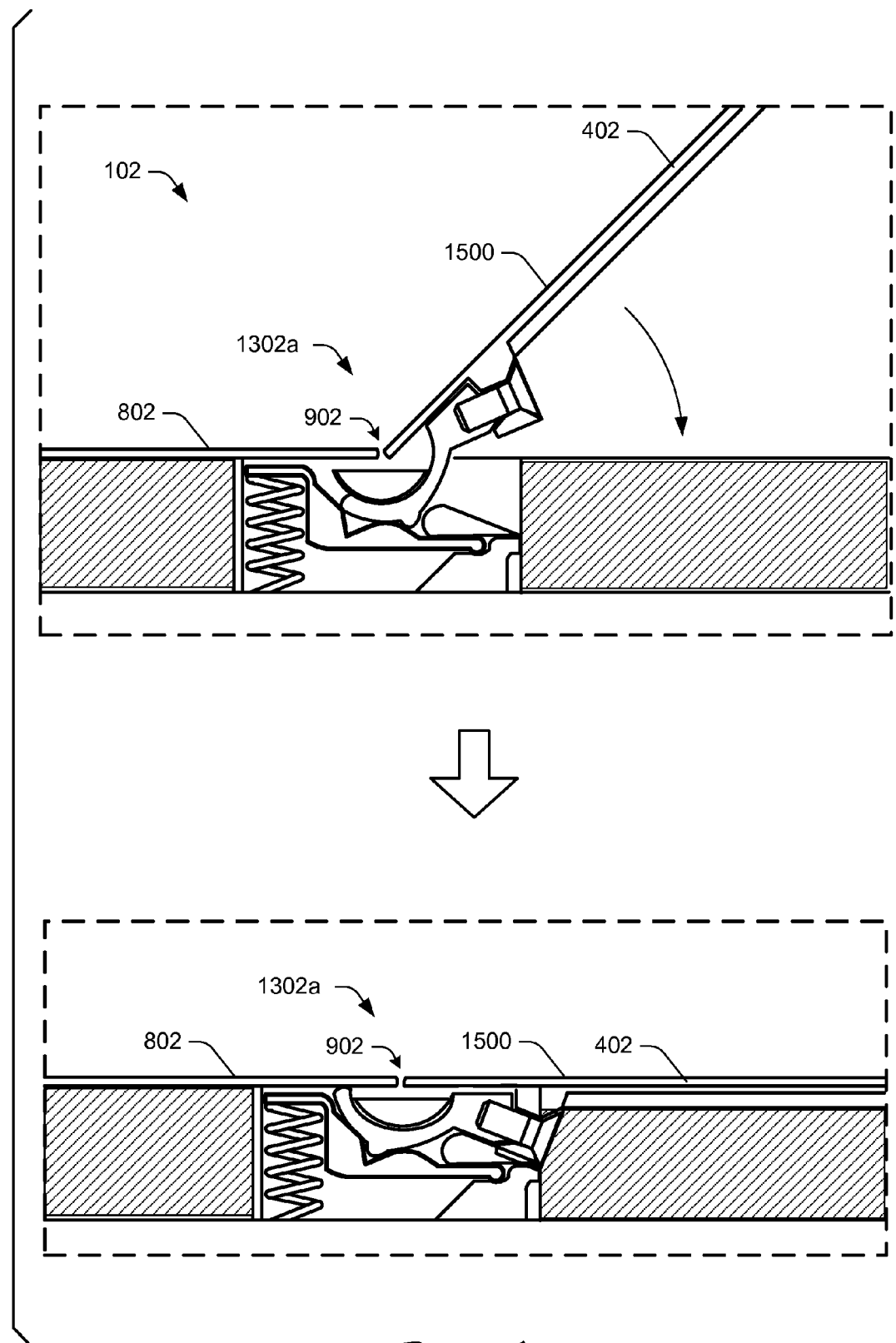
FIG. 15 depicts a partial cross-sectional view of a computing device illustrating movement of a kickstand in accordance with one or more embodiments.

FIG. 15 illustrates that the dimensions and configuration of the peripheral hinges enable the kickstand 402 to rotate on the peripheral hinges to different open positions, while blending with an external contour of the computing device 102 when in a closed position. For instance, the peripheral hinge 1302a includes a center of rotation that substantially coincides with the seam 902, introduced above with reference to FIG. 9. The center of rotation, for example, can be within ten millimeters (10 mm) of a center axis of the seam 902. The seam 902 corresponds to a space between abutting edges of a top surface 1500 and of the kickstand 402, and the rear surface 802 of the computing device 102. The seam 902, and thus the center of rotation for the peripheral hinge 1302a, is external to the peripheral hinge 1302a itself. Thus, when the kickstand 402 is in a closed position, the top surface 1500 and the rear surface 802 form a flat planar surface. Further, when the kickstand 402 is rotated to various open positions, the abutting edges of the top surface 1500 and the kickstand 402 remain adjacent such that the seam 902 is substantially constant between different positions of the kickstand 402. For example, a width of the seam can be maintained within a variation of five millimeters (5 mm) during movement of the kickstand to various positions.

Figure 16:
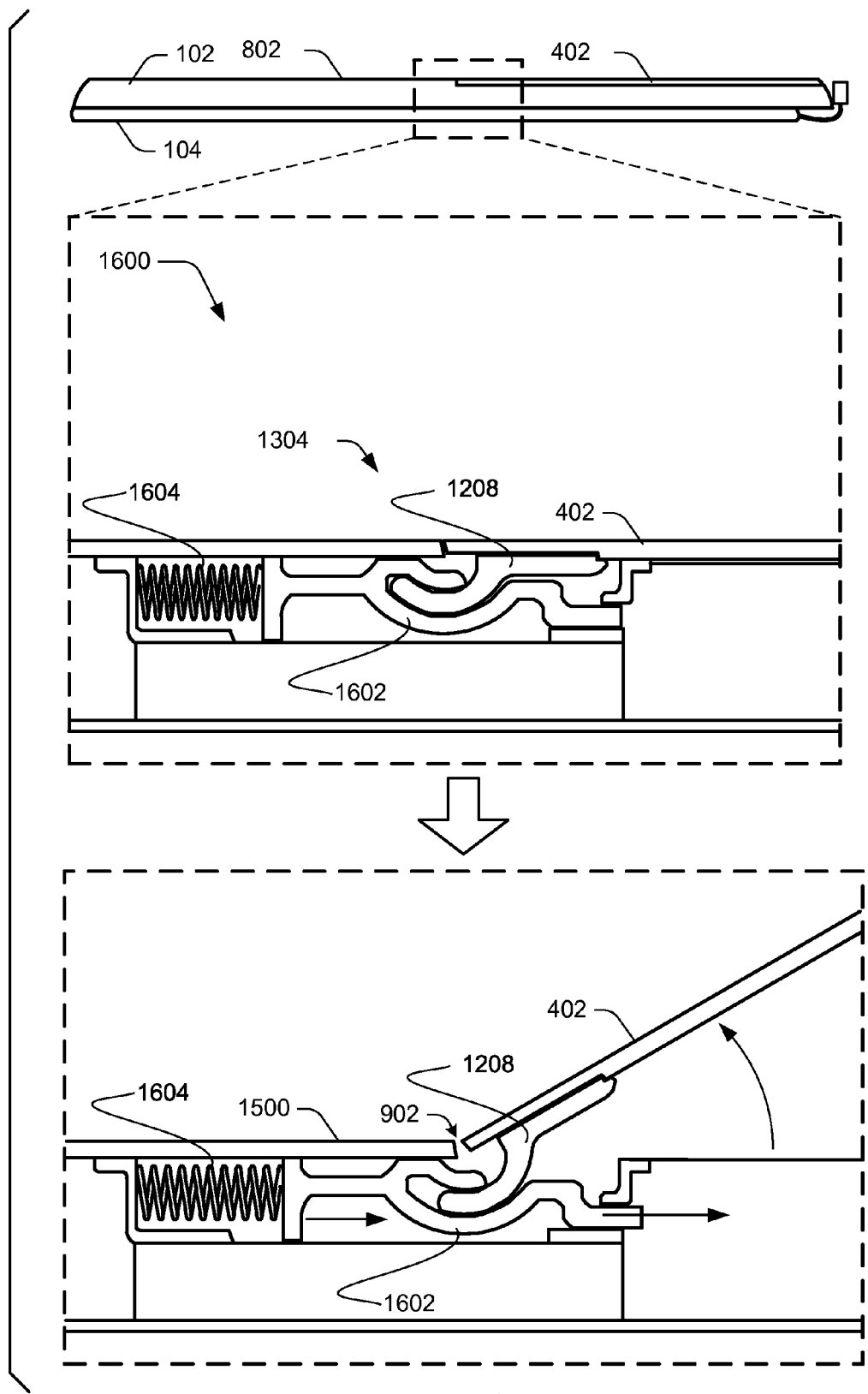
FIG. 16 depicts a partial cross-sectional view of a computing device illustrating a center hinge in accordance with one or more embodiments.

FIG. 16 illustrates a partial cross-sectional view of the computing device 102, generally at 1600. The view 1600 includes a cross section of the center hinge 1304 with the kickstand 402 is in a closed position. The center hinge 1304 includes slider 1602 and a spring 1604 that exerts pressure on a rear surface of the slider 1602. Further illustrated is the center hinge key 1208, which is positioned within a channel in the slider 1602.

In operation, the slider 1602 can slide within the center hinge 1304 when the kickstand 402 is moved between different positions. For instance, consider the scenario illustrated in the lower portion of FIG. 16, where the kickstand 402 is opened from the closed position. As the kickstand 402 opens, the center hinge key 1208 rotates upward away from the slider 1602. With the rotation of the center hinge key 1208, pressure from the spring 1604 causes the slider 1602 to slide forward with the movement of the center hinge key 1208. Thus, the slider 1602 continues to exert pressure on the center hinge key 1208 when the kickstand is opened. In at least some implementations, pressure from the slider 1602 on the center hinge key 1208 stabilizes the kickstand 402 at the center edge and assists in preventing the kickstand 402 from warping during movement to different positions. For example, the pressure from the slider 1602 on the center hinge key 1208 can assist in keeping abutting edges of the top surface 1500 and the kickstand 402 adjacent such that the seam 902 is substantially constant during movement of the kickstand 402. The pressure also reduces vibration and vibration-related noise for the kickstand 402, such as during movement of the kickstand 402.

It is to be appreciated that the example device orientations, kickstand positions, hinge positions, hinge stop positions, and so forth discussed above are presented for purposes of example. Thus, a wide variety of different device orientations, kickstand positions, hinge positions, and hinge stop positions not specifically mentioned herein may be implemented within the spirit and scope of the claimed embodiments. For instance, an attachment mechanism used to attach a kickstand to a computing device (e.g., the peripheral hinges discussed above) can include any number and/or configuration of suitable stop positions to enable the kickstand to be opened to a variety of different positions to support various orientations of a computing device. Further, example hinges can be attached at any suitable position and/or portion of a kickstand and/or computing device in accordance with the claimed embodiments.

Example System and Device

Figure 17:
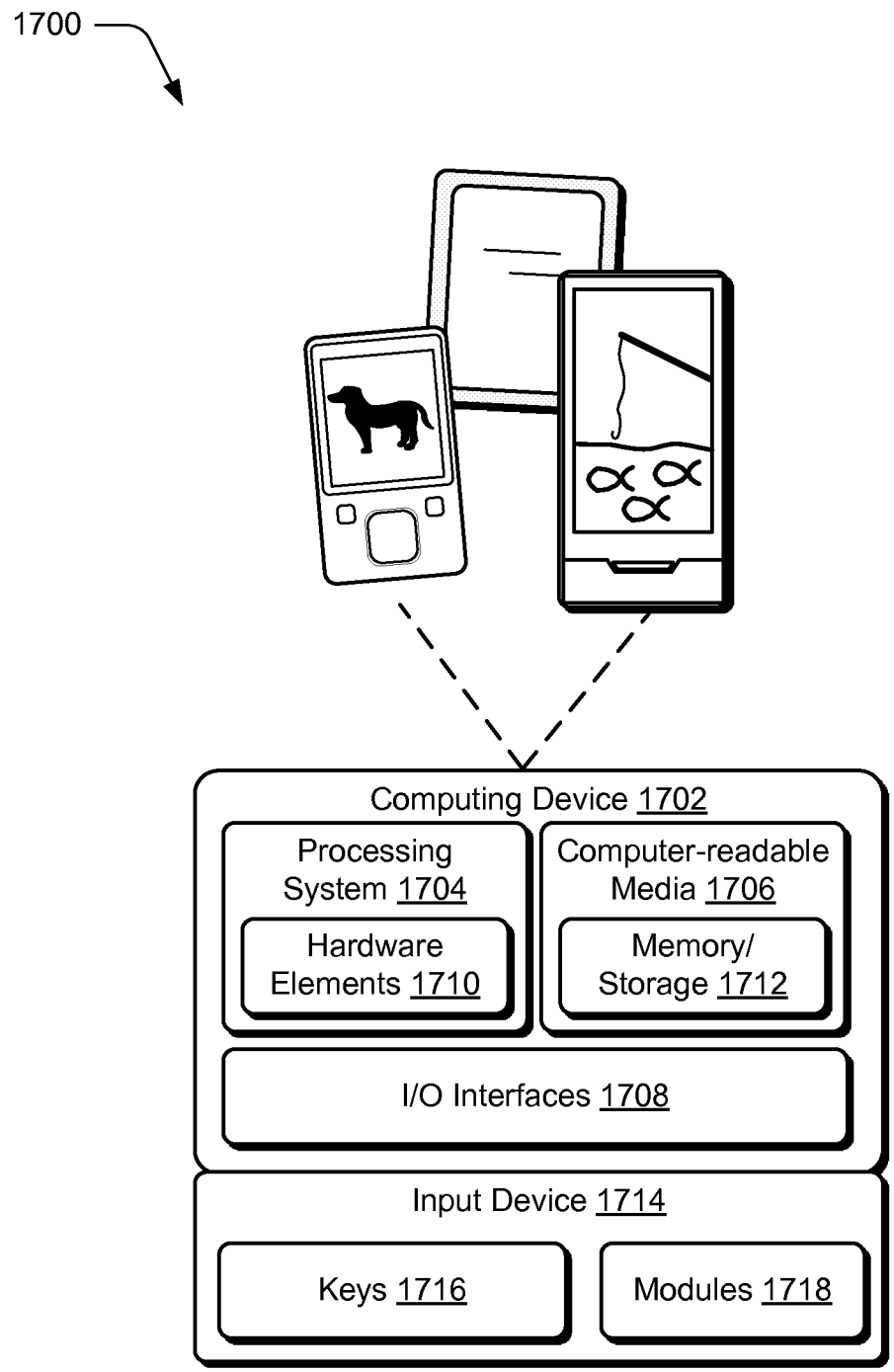
FIG. 17 illustrates an example system including various components of an example device that can be implemented as any type of computing device as described with reference to FIGS. 1-16 to implement embodiments of the techniques described herein.

FIG. 17 illustrates an example system generally at 1700 that includes an example computing device 1702 that is representative of one or more computing systems and/or devices that may implement the various techniques described herein. The computing device 1702 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 1702 as illustrated includes a processing system 1704, one or more computer-readable media 1706, and one or more I/O interface 1708 that are communicatively coupled, one to another. Although not shown, the computing device 1702 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 1704 is representative of functionality to perform one or more operations using hardware. Accordingly, the processing system 1704 is illustrated as including hardware element 1710 that may be configured as processors, functional blocks, and so forth. This may include implementation in hardware as an application specific integrated circuit or other logic device formed using one or more semiconductors. The hardware elements 1710 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 1706 is illustrated as including memory/storage 1712. The memory/storage 1712 represents memory/storage capacity associated with one or more computer-readable media. The memory/storage component 1712 may include volatile media (such as random access memory (RAM)) and/or nonvolatile media (such as read only memory (ROM), Flash memory, optical disks, magnetic disks, and so forth). The memory/storage component 1712 may include fixed media (e.g., RAM, ROM, a fixed hard drive, and so on) as well as removable media (e.g., Flash memory, a removable hard drive, an optical disc, and so forth). The computer-readable media 1706 may be configured in a variety of other ways as further described below.

Input/output interface(s) 1708 are representative of functionality to allow a user to enter commands and information to computing device 1702, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 1702 may be configured in a variety of ways to support user interaction.

The computing device 1702 is further illustrated as being communicatively and physically coupled to an input device 1714 that is physically and communicatively removable from the computing device 1702. In this way, a variety of different input devices may be coupled to the computing device 1702 having a wide variety of configurations to support a wide variety of functionality. In this example, the input device 1714 includes one or more keys 1716, which may be configured as pressure sensitive keys, mechanically switched keys, and so forth.

The input device 1714 is further illustrated as include one or more modules 1718 that may be configured to support a variety of functionality. The one or more modules 1718, for instance, may be configured to process analog and/or digital signals received from the keys 1716 to determine whether a keystroke was intended, determine whether an input is indicative of resting pressure, support authentication of the input device 1714 for operation with the computing device 1702, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 1702. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 1702, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1710 and computer-readable media 1706 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1710. The computing device 1702 may be configured to implement particular instructions and/or functions corresponding to the software and/or hardware modules. Accordingly, implementation of a module that is executable by the computing device 1702 as software may be achieved at least partially in hardware, e.g., through use of computer-readable storage media and/or hardware elements 1710 of the processing system 1704. The instructions and/or functions may be executable/operable by one or more articles of manufacture (for example, one or more computing devices 1702 and/or processing systems 1704) to implement techniques, modules, and examples described herein.

Conclusion

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An apparatus comprising:
   a housing;
   a kickstand rotatably attached to a portion of the housing and configured to support the housing in one or more positions relative to an adjacent surface; and
   a hinge attached to the housing and that attaches a portion of the kickstand to the housing, the hinge including:
   a hinge body including an upper portion;
   a hinge sled positioned at least partially within the hinge body such that a channel is formed between the upper portion and the hinge sled;
   a spring positioned within the hinge body to exert pressure against the hinge sled; and
   a pivot portion attached to the kickstand and slidably engaged in the channel such that the hinge sled exerts pressure from the spring against the pivot portion, the pivot portion being slidable within the channel to enable opening of the kickstand to one or more open positions relative to the housing, the hinge sled including a first notch and a second notch positioned on different respective portions of the hinge sled, and a first contact portion and a second contact portion between the first notch and the second notch,
   and the pivot portion including a protrusion positioned such that when the pivot portion slides within the channel, the protrusion contacts one or more of the first contact portion or the second contact portion and catches within one or more of the first notch or the second notch to cause the kickstand to assume one or more of a first preset position or a second preset position.

2. The apparatus as described in claim 1, wherein the hinge includes one or more stop positions that enable the kickstand to be opened to one or more preset positions to support the housing relative to the adjacent surface.

3. The apparatus as described in claim 1, wherein the hinge further includes a sled pivot positioned within the hinge body, the hinge sled being pivotably positioned on the sled pivot such that movement of the pivot portion between two or more positions causes the hinge sled to pivot relative to the sled pivot.

4. The apparatus as described in claim 1, wherein the protrusion is positioned to catch within the first notch to cause the kickstand to assume a closed position and to catch within the second notch to cause the kickstand to assume a preset open position.

5. The apparatus as described in claim 1, wherein the first contact portion has a shallower contact angle with the protrusion than the second contact portion such that resistance of the pivot portion to transitioning from the first preset position to the second preset position is less than resistance of the pivot portion to transitioning from the second preset position to the first preset position.

6. The apparatus as described in claim 1, wherein the kickstand is removably attached to the pivot portion such that the kickstand can be detached from the apparatus.

7. The apparatus as described in claim 1, wherein the hinge has a center of rotation that substantially coincides with a seam between abutting edges of the kickstand and the housing.

8. An apparatus as described in claim 1, further comprising an additional hinge attached to the kickstand and the housing, and configured to apply spring pressure to an edge of the kickstand to stabilize the edge of the kickstand during movement.

9. A hinge comprising:
   a hinge body including an upper portion;
   a hinge sled positioned at least partially within the hinge body such that a channel is formed between the upper portion and the hinge sled;
   a spring positioned within the hinge body to exert pressure against the hinge sled; and
   a pivot portion slidably engaged in the channel such that the hinge sled exerts pressure from the spring against the pivot portion, the pivot portion being attachable to a component and slidable within the channel to enable movement of the component relative to the hinge body, the hinge sled including a first notch and a second notch positioned on different respective portions of the hinge sled, and a first contact portion and a second contact portion between the first notch and the second notch,
   and the pivot portion including a protrusion positioned such that when the pivot portion slides within the channel, the protrusion contacts one or more of the first contact portion or the second contact portion and catches within one or more of the first notch or the second notch to cause the kickstand to assume one or more of a first preset position or a second preset position.

10. The hinge as described in claim 9, further comprising a sled pivot positioned within the hinge body, the hinge sled being pivotably positioned on the sled pivot such that movement of the pivot portion between two or more positions causes the hinge sled to pivot relative to the sled pivot.

11. The hinge as described in claim 9, wherein, the protrusion is positioned to catch within the first notch to cause the hinge to assume a closed position and to catch within the second notch to cause the hinge to assume a preset open position.

12. The hinge as described in claim 9, wherein the first contact portion has a shallower contact angle with the protrusion than the second contact portion such that resistance of the pivot portion to transitioning from the first preset position to the second preset position is less than resistance of the pivot portion to transitioning from the second preset position to the first preset position.

13. The hinge as described in claim 9, further comprising a damper formed from an elastic material and positioned on the hinge sled to form a notch relative to the hinge sled, and wherein the protrusion of the pivot portion is positioned to catch within the notch to cause the hinge to assume a preset open position.

14. A computing device comprising:
   a housing with a display;
   a kickstand rotatably attached to a rear portion of the housing opposite the display and configured to support the housing in one or more positions relative to an adjacent surface; and
   a hinge attached to the housing and that attaches a portion of the kickstand to the rear portion of the housing, the hinge including:
   a hinge body including an upper portion;
   a hinge sled positioned at least partially within the hinge body such that a channel is formed between the upper portion and the hinge sled;
   a spring positioned within the hinge body to exert pressure against the hinge sled; and
   a pivot portion attached to the kickstand and slidably engaged in the channel such that the hinge sled exerts pressure from the spring against the pivot portion, the pivot portion being slidable within the channel to enable opening of the kickstand to one or more open positions relative to the rear portion of the housing, the hinge sled including a first notch and a second notch positioned on different respective portions of the hinge sled, and a first contact portion and a second contact portion between the first notch and the second notch, and the pivot portion including a protrusion positioned such that when the pivot portion slides within the channel, the protrusion contacts one or more of the first contact portion or the second contact portion and catches within one or more of the first notch or the second notch to cause the kickstand to assume one or more of a first preset position or a second preset position.

15. The computing device as described in claim 14, wherein the hinge includes one or more stop positions that enable the kickstand to be opened to one or more preset open positions relative to the housing to support the housing on an adjacent surface.

16. The computing device as described in claim 15, wherein the kickstand is removably attached to the pivot portion such that the kickstand can be detached from the rear portion of the housing.

17. The computing device as described in claim 14, wherein the hinge has a center of rotation that substantially coincides with a seam between abutting edges of the kickstand and the rear portion of the housing.

18. The computing device as described in claim 14, wherein the first contact portion has a different contact angle with the protrusion than the second contact portion.

19. The apparatus as described in claim 1, wherein the spring is positioned against a lip of the hinge sled and exerts upward pressure against the lip.

20. The hinge as described in claim 9, wherein the first contact portion has a shallower contact angle with the protrusion than the second contact portion.

* * * * *